US012615851B2

(12) United States Patent
Rehder

(10) Patent No.: US 12,615,851 B2
(45) Date of Patent: Apr. 28, 2026

(54) PREFABRICATED CONDUCTORS ON A SUBSTRATE TO FACILITATE CORNER CONNECTIONS FOR A SOLAR CELL ARRAY

(71) Applicant: The Boeing Company, Chicago, IL (US)

(72) Inventor: Eric Rehder, Los Angeles, CA (US)

(73) Assignee: THE BOEING COMPANY, Arlington, VA (US)

(*) Notice: Subject to any disclaimer, the term of this patent is extended or adjusted under 35 U.S.C. 154(b) by 0 days.

(21) Appl. No.: 15/643,277

(22) Filed: Jul. 6, 2017

(65) Prior Publication Data

US 2018/0076339 A1     Mar. 15, 2018

Related U.S. Application Data

(63) Continuation-in-part of application No. 15/643,274, filed on Jul. 6, 2017, and a continuation-in-part of
(Continued)

(51) Int. Cl.
*H10F 19/00*          (2025.01)
*H01L 21/02*          (2006.01)
(Continued)

(52) U.S. Cl.
CPC ....... *H10F 19/00* (2025.01); *H01L 21/02439* (2013.01); *H02S 40/34* (2014.12);
(Continued)

(58) Field of Classification Search
CPC ....... H01L 31/02008; H01L 31/035281; H01L 31/0443; H01L 31/0516; H01L 31/035227;
(Continued)

(56) References Cited

U.S. PATENT DOCUMENTS 3,376,164 A     4/1968  Bachwansky
3,833,426 A     9/1974  Mesch
(Continued)

FOREIGN PATENT DOCUMENTS

CN        103155158 A      6/2013
CN        203277428 U     11/2013
(Continued)

OTHER PUBLICATIONS

Non-Final Office Action dated Mar. 31, 2020 for U.S. Appl. No. 15/643,274.
(Continued)

*Primary Examiner* — Uyen M Tran
(74) *Attorney, Agent, or Firm* — MH2 Technology Law Group LLP

(57) ABSTRACT

A substrate for solar cells is fabricated such that an area of the substrate remains exposed when at least one solar cell having at least one cropped corner that defines a corner region is attached to the substrate; the area of the substrate that remains exposed includes one or more conductors printed on the substrate; and electrical connections between the solar cell and the conductors are made in the corner region resulting from the cropped corner of the solar cell. The substrate may also include buried conductors for making series connections that determine a flow of power through a plurality of solar cells, including corner-to-corner and column-to-column connections for the plurality of solar cells that are attached to the substrate in a two-dimensional (2-D) grid of an array. The substrate may also be covered by a polyimide overlay for preventing electrostatic discharge (ESD).

20 Claims, 51 Drawing Sheets

Related U.S. Application Data application No. 15/643,279, filed on Jul. 6, 2017, and a continuation-in-part of application No. 15/643,282, filed on Jul. 6, 2017, and a continuation-in-part of application No. 15/643,285, filed on Jul. 6, 2017, and a continuation-in-part of application No. 15/643,287, filed on Jul. 6, 2017, now Pat. No. 10,763,383, and a continuation-in-part of application No. 15/643,289, filed on Jul. 6, 2017, now Pat. No. 11,437,533.

(60) Provisional application No. 62/394,623, filed on Sep. 14, 2016, provisional application No. 62/394,636, filed on Sep. 14, 2016, provisional application No. 62/394,616, filed on Sep. 14, 2016, provisional application No. 62/394,627, filed on Sep. 14, 2016, provisional application No. 62/394,629, filed on Sep. 14, 2016, provisional application No. 62/394,632, filed on Sep. 14, 2016, provisional application No. 62/394,649, filed on Sep. 14, 2016, provisional application No. 62/394,666, filed on Sep. 14, 2016, provisional application No. 62/394,667, filed on Sep. 14, 2016, provisional application No. 62/394,671, filed on Sep. 14, 2016, provisional application No. 62/394,641, filed on Sep. 14, 2016, provisional application No. 62/394,672, filed on Sep. 14, 2016.

(51) Int. Cl.

| | |
|---|---|
| *H02S 40/34* | (2014.01) |
| *H10F 10/142* | (2025.01) |
| *H10F 19/50* | (2025.01) |
| *H10F 19/70* | (2025.01) |
| *H10F 19/75* | (2025.01) |
| *H10F 19/80* | (2025.01) |
| *H10F 19/90* | (2025.01) |
| *H10F 77/00* | (2025.01) |
| *H10F 77/14* | (2025.01) |
| *H10F 77/169* | (2025.01) |
| *H10F 77/20* | (2025.01) |

(52) U.S. Cl.
CPC ........... *H10F 10/142* (2025.01); *H10F 19/50* (2025.01); *H10F 19/70* (2025.01); *H10F 19/75* (2025.01); *H10F 19/80* (2025.01); *H10F 19/90* (2025.01); *H10F 19/902* (2025.01); *H10F 19/904* (2025.01); *H10F 19/908* (2025.01); *H10F 77/00* (2025.01); *H10F 77/147* (2025.01); *H10F 77/148* (2025.01); *H10F 77/169* (2025.01); *H10F 77/211* (2025.01); *H10F 77/935* (2025.01); *H10F 77/955* (2025.01); *Y02E 10/544* (2013.01)

(58) Field of Classification Search
CPC ............. H01L 31/0508; H01L 31/0392; H01L 31/0687; H01L 31/02; H01L 31/042; H01L 31/02021; H01L 31/022425; H01L 31/044; H01L 31/05; H01L 31/048; H10F 77/00; H10F 77/169; H10F 77/148; H10F 77/147; H10F 77/955; H10F 77/935; H10F 77/21; H10F 19/90; H10F 19/902; H10F 19/50; H10F 19/908; H10F 19/70; H10F 19/80; H10F 19/75; H10F 10/142; H10L 21/02439; Y02E 10/544
See application file for complete search history.

(56) References Cited

U.S. PATENT DOCUMENTS

| | | | |
|---|---|---|---|
| 4,057,439 A | 11/1977 | Lindmayer | |
| 4,257,821 A | 3/1981 | Kelly et al. | |
| 4,481,378 A * | 11/1984 | Lesk | H01L 31/02021 |
| | | | 257/443 |
| 4,755,231 A | 7/1988 | Kurland et al. | |
| 5,330,583 A | 7/1994 | Asai et al. | |
| 5,391,235 A | 2/1995 | Inoue | |
| 5,567,248 A | 10/1996 | Chung | |
| 5,701,067 A | 12/1997 | Kaji et al. | |
| 5,855,692 A | 1/1999 | Kaji et al. | |
| 6,008,448 A | 12/1999 | Peck | |
| 6,034,322 A | 3/2000 | Pollard | |
| 6,156,967 A | 12/2000 | Ralph et al. | |
| 6,313,396 B1 * | 11/2001 | Glenn | H01L 31/042 |
| | | | 136/244 |
| 6,350,944 B1 | 2/2002 | Sherif et al. | |
| 6,441,297 B1 | 8/2002 | Keller et al. | |
| 6,543,725 B1 | 4/2003 | Meurer et al. | |
| 6,555,739 B2 | 4/2003 | Kawam | |
| 6,563,289 B1 | 5/2003 | Cross | |
| 6,637,702 B1 | 10/2003 | McCandless | |
| 8,604,330 B1 | 12/2013 | Hennessy et al. | |
| 8,814,099 B1 | 8/2014 | Harvey et al. | |
| 9,120,583 B1 | 9/2015 | Spence et al. | |
| 9,758,261 B1 * | 9/2017 | Steinfeldt | H01L 31/06875 |
| 2003/0057533 A1 * | 3/2003 | Lemmi | B41J 2/45 |
| | | | 257/E31.062 |
| 2004/0118446 A1 | 6/2004 | Toyomura | |
| 2005/0133079 A1 * | 6/2005 | Boulanger | H01L 31/0201 |
| | | | 136/244 |
| 2006/0170435 A1 | 8/2006 | Granicher et al. | |
| 2007/0005843 A1 | 1/2007 | Sim et al. | |
| 2007/0152194 A1 | 7/2007 | Natekar et al. | |
| 2008/0142071 A1 | 6/2008 | Dorn et al. | |
| 2008/0245405 A1 | 10/2008 | Garvison et al. | |
| 2008/0295889 A1 | 12/2008 | Schindler et al. | |
| 2009/0038671 A1 * | 2/2009 | Yamaguchi | H10F 19/902 |
| | | | 136/244 |
| 2009/0183760 A1 | 7/2009 | Meyer | |
| 2009/0255571 A1 | 10/2009 | Xia et al. | |
| 2009/0272436 A1 | 11/2009 | Cheung | |
| 2009/0288702 A1 | 11/2009 | Kim et al. | |
| 2010/0012172 A1 | 1/2010 | Meakin et al. | |
| 2010/0089435 A1 | 4/2010 | Lockenhoff | |
| 2010/0126560 A1 | 5/2010 | Lauvray et al. | |
| 2010/0186795 A1 | 7/2010 | Gaul | |
| 2010/0212741 A1 | 8/2010 | Lin | |
| 2010/0295383 A1 | 11/2010 | Cummings | |
| 2010/0313954 A1 | 12/2010 | Seel | |
| 2011/0041890 A1 | 2/2011 | Sheats | |
| 2011/0073163 A1 | 3/2011 | Cheung | |
| 2011/0079263 A1 | 4/2011 | Avrutsky | |
| 2011/0120752 A1 | 5/2011 | Imai et al. | |
| 2011/0138609 A1 | 6/2011 | Chereukupalli | |
| 2011/0168238 A1 | 7/2011 | Metin et al. | |
| 2011/0198444 A1 | 8/2011 | Dong | |
| 2012/0103388 A1 | 5/2012 | Meakin et al. | |
| 2012/0125391 A1 | 5/2012 | Pinarbasi et al. | |
| 2012/0161801 A1 | 6/2012 | Hasegawa | |
| 2012/0167954 A1 | 7/2012 | Meakin et al. | |
| 2012/0199176 A1 | 8/2012 | Hong et al. | |
| 2012/0313455 A1 | 12/2012 | Latham | |
| 2013/0014802 A1 | 1/2013 | Zimmerman | |
| 2013/0056047 A1 | 3/2013 | Beck et al. | |
| 2013/0263915 A1 | 10/2013 | Snidow | |
| 2014/0000682 A1 * | 1/2014 | Zhao | H01L 31/0481 |
| | | | 136/251 |
| 2014/0033625 A1 | 2/2014 | Jenkins et al. | |
| 2014/0083497 A1 | 3/2014 | Ehrenpfordt et al. | |
| 2014/0166067 A1 * | 6/2014 | McGlynn | H01L 31/06875 |
| | | | 136/244 |
| 2014/0255780 A1 | 9/2014 | Mikhaylik et al. | |
| 2014/0366927 A1 | 12/2014 | Lavrova et al. | |
| 2015/0083191 A1 | 3/2015 | Gmundner | |

(56) References Cited

U.S. PATENT DOCUMENTS

| | | | |
|---|---|---|---|
| 2015/0096607 A1 | 4/2015 | Yong | |
| 2015/0144173 A1 | 5/2015 | Hoang et al. | |
| 2015/0287862 A1 | 10/2015 | Pardell Vilella | |
| 2015/0318420 A1 | 11/2015 | Sewell et al. | |
| 2015/0349703 A1 | 12/2015 | Morad et al. | |
| 2016/0112004 A1 | 4/2016 | Thiel et al. | |
| 2016/0126380 A1 | 5/2016 | Chang | |
| 2016/0197207 A1 | 7/2016 | Morioka et al. | |
| 2016/0218665 A1 | 7/2016 | Crist | |
| 2016/0380221 A1 | 12/2016 | Gotanda et al. | |
| 2017/0018670 A1 | 1/2017 | Bende et al. | |
| 2017/0040933 A1 | 2/2017 | Vogel | |
| 2017/0054406 A1 | 2/2017 | Narla et al. | |
| 2017/0098736 A1 | 4/2017 | Lee et al. | |
| 2017/0163212 A1 | 6/2017 | France et al. | |
| 2017/0229692 A1 | 8/2017 | Thiel et al. | |
| 2017/0374737 A1 | 12/2017 | Jeong et al. | |
| 2019/0127089 A1 | 5/2019 | Tomoda et al. | |
| 2019/0140584 A1 | 5/2019 | Hayashi et al. | |

FOREIGN PATENT DOCUMENTS

| | | | | |
|---|---|---|---|---|
| CN | 104241406 A | 12/2014 | | |
| CN | 104443439 | 3/2015 | | |
| CN | 104443439 A | 3/2015 | | |
| DE | 10136442 * | 2/2003 | ............. | H01L 31/00 |
| DE | 10136442 A1 | 2/2003 | | |
| EP | 1160876 | 12/2001 | | |
| EP | 1548847 | 6/2005 | | |
| EP | 2833416 | 2/2015 | | |
| EP | 2981156 | 2/2016 | | |
| EP | 3297042 | 3/2018 | | |
| IT | MI20011653 | 1/2003 | | |
| JP | 2001-332753 | 11/2001 | | |
| JP | 2002-50782 | 2/2002 | | |
| JP | 2002190612 | 7/2002 | | |
| JP | 2002190612 A | 7/2002 | | |
| JP | 2011071214 | 4/2011 | | |
| JP | 2011071214 A | 4/2011 | | |
| KR | 10-0965541 | 6/2010 | | |
| WO | 2009/012567 | 1/2009 | | |
| WO | 2015/150514 | 10/2015 | | |
| WO | 2015150514 A1 | 10/2015 | | |

OTHER PUBLICATIONS

European Communication dated Feb. 19, 2020 for EP Application No. 18176224.6.

Final Office Action dated Apr. 10, 2020 for U.S. Appl. No. 15/643,282.

Non-Final Office Action dated Jan. 8, 2020 for U.S. Appl. No. 15/787,304.

Final Office Action dated Jul. 10, 2020 for U.S. Appl. No. 15/938,787.

Final Office Action dated Oct. 1, 2020 for U.S. Appl. No. 15/643,289.

Non-Final Office Action dated Jan. 17, 2020 for U.S. Appl. No. 15/643,285.

Non-Final Office Action dated Nov. 22, 2019 for U.S. Appl. No. 15/938,791.

Non-Final Office Action dated Dec. 7, 20 for U.S. Appl. No. 15/787,304.

Non-Final Office Action dated Feb. 18, 2021 for U.S. Appl. No. 15/938,791.

Non-Final Office Action dated Nov. 9, 2020 for U.S. Appl. No. 15/643,282.

Non-Final Office Action dated Mar. 19, 2020 for U.S. Appl. No. 15/643,289.

Non-Final Office Action dated Jan. 7, 2021 for U.S. Appl. No. 15/787,291.

Final Office Action dated Feb. 6, 2020 for U.S. Appl. No. 15/643,279.

Notice of Allowance dated Apr. 23, 2020 for U.S. Appl. No. 15/643,287.

Final Office Action dated Aug. 22, 2019 for U.S. Appl. No. 15/643,274.

Final Office Action dated Apr. 15, 2020 for U.S. Appl. No. 15/938,791.

Final Office Action dated May 19, 2020 for U.S. Appl. No. 15/787,304.

Non-Final Office Action dated Jul. 28, 2020 for U.S. Appl. No. 15/643,279.

Non-Final Office Action dated Feb. 4, 2020 for U.S. Appl. No. 15/787,291.

Non-Final Office Action dated Dec. 9, 2019 for U.S. Appl. No. 15/643,282.

EPO Communication dated Dec. 2, 2020 for EP application No. 17191134.0.

Final Office Action dated Feb. 6, 2020 for U.S. Appl. No. 15/643,287.

Non-Final Office Action dated Jan. 3, 2020 for U.S. Appl. No. 15/938,787.

Final Office Action dated Jun. 15, 2020 for U.S. Appl. No. 15/787,291.

Final Office Action dated Sep. 2, 2020 for U.S. Appl. No. 15/643,274.

Final Office Action dated Jun. 8, 2020 for U.S. Appl. No. 15/643,285.

European Examination Communication dated Dec. 1, 2020 for EP Application No. 17191162.1.

Non-Final Office Action dated Dec. 22, 2020 for U.S. Appl. No. 15/643,285.

Non-Final Office Action dated Sep. 27, 2019 for U.S. Appl. No. 15/643,287.

Extended European Search Report dated Dec. 8, 2017for EP application No. 17191159.7.

Non-Final Office Action dated Apr. 23, 2018 for U.S. Appl. No. 15/623,489.

Final Office Action dated Jul. 12, 2019 for U.S. Appl. No. 15/643,285.

European Search Report dated Dec. 19, 2017 for EP application No. 17191162.1.

European Search Report dated Dec. 4, 2017 for EP application No. 17191134.

Final Office Action dated Jul. 23, 2019 for U.S. Appl. No. 115/643,289.

Final Office Action dated Aug. 28, 2018 for U.S. Appl. No. 15/643,289.

European Search Report dated Dec. 21, 2017 for EP application No. 17191166.2.

Baumli et al., "Solder Materials With Micro and Nanoparticles: a Review", Materials Science and Engineering, Jan. 1, 2015, pp. 42-49.

Non-Final Office Action dated Mar. 14, 2019 for U.S. Appl. No. 15/787,304.

Extended European Search Report dated Nov. 12, 2018 for EP Application No. 18176222.0.

Final Office Action dated Jul. 9, 2019 for U.S. Appl. No. 15/787,304.

Final Office Action dated Mar. 12, 2021 for U.S. Appl. No. 15/643,282.

Extended European Search Report dated Jul. 8, 2019 for European Patent Application No. 19162438.6.

Non-Final Office Action dated Mar. 14, 2019 for U.S. Appl. No. 15/787,291.

Final Office Action dated Mar. 5, 2021 for U.S. Appl. No. 15/643,279.

Non-Final Office Action dated Jul. 23, 2019 for U.S. Appl. No. 15/643,279.

Final Office Action dated Apr. 22, 2021 for U.S. Appl. No. 15/643,285.

Final Office Action dated Jun. 6, 2019 for U.S. Appl. No. 15/643,282.

Non-Final Office Action dated Jan. 28, 2019 for U.S. Appl. No. 15/643,289.

Non-Final Office Action dated Feb. 8, 2019 for Utility U.S. Appl. No. 15/643,274.

Extended European Search Report dated Nov. 8, 2018 for EP Application No. 18176224.6.

Stern, T., et al., "Modular Solar Panels Using Components Engineered for Producibility", Photovoltaic Specialists Conference (PVSC), 2011 37th IEEE, Jun. 19-24, 2011, pp. 001626-001629.

Walmsley, N., et al., "Increasing the TRL Level of New PV Technologies Using Modular Solar Panels", Photovoltaic Specialists Conference (PVSC), 2012 38th IEEE, Jun. 3-8, 2012, pp. 002835-002839.

Extended European Search Report dated Dec. 7, 2017 for EP application No. 17191154.8.

Final Office Action dated Apr. 10, 2019 for U.S. Appl. No. 15/643,279.

(56)        References Cited

OTHER PUBLICATIONS

Non-Final Office Action dated Oct. 5, 2018 for U.S. Appl. No. 15/643,279.
Final Office Action dated Jul. 17, 2019 for U.S. Appl. No. 15/6787,291.
Non-Final Office Action dated Feb. 5, 2019 for Utility U.S. Appl. No. 15/643,282.
Non-Final Office Action dated Feb. 21, 2019 for U.S. Appl. No. 15/643,285.
Extended European Search Report dated Dec. 19, 2017 for EP application No. 17191168.8.
Non-Final Office Action dated Apr. 27, 2021 for U.S. Appl. No. 15/938,787.
Non-Final Office Action dated May 12, 2021 for U.S. Appl. No. 15/643,274.
Non-Final Office Action dated Aug. 18, 2021 for U.S. Appl. No. 15/643,285.
Non-Final Office Action dated Aug. 18, 2021 for U.S. Appl. No. 15/787,291.
Non-Final Office Action dated Aug. 18, 2021 for U.S. Appl. No. 15/787,304.
Non-Final Office Action dated Aug. 2, 2021 for U.S. Appl. No. 15/643,282.
Final Office Action dated Aug. 13, 2021 for U.S. Appl. No. 15/938,791.
Japanese Notice of Reasons for Rejection (with English translation) dated Jun. 29, 2021 for Japanese Patent Application No. 2017-176667.
Non-Final Office Action dated Sep. 29, 2021 for U.S. Appl. No. 15/643,289.
Final Office Action dated Dec. 17, 2021 for U.S. Appl. No. 15/787,291.
Final Office Action dated Dec. 28, 2021 for U.S. Appl. No. 15/643,282.
Non-Final Office Action dated Mar. 14, 2022 for U.S. Appl. No. 15/643,282.
Final Office Action dated Dec. 9, 2021 for U.S. Appl. No. 15/938,787.
Final Office Action dated Feb. 14, 2022 for U.S. Appl. No. 16/847,359.
Final Office Action dated Feb. 11, 2022 for U.S. Appl. No. 16/847,032.
Non-Final Office Action dated Dec. 6, 2021 for U.S. Appl. No. 15/643,279.
Final Office Action dated Dec. 15, 2021 for U.S. Appl. No. 15/787,304.
Final Office Action dated Jan. 20, 2022 for U.S. Appl. No. 15/643,285.
Non-Final Office Action dated Nov. 14, 2022 for U.S. Appl. No. 15/643,285.
Non-Final Office Action dated Sep. 21, 2022 for U.S. Appl. No. 17/100,823.
Japanese Appeal Preliminary Examination Report dated Jun. 21, 2022 for JP Application No. 2017-176667.
Non-Final Office Action dated Sep. 23, 2022 for U.S. Appl. No. 16/991,589.
Non-Final Office Action dated Sep. 15, 2022 for U.S. Appl. No. 16/543,279.
Notice of Allowance dated Jun. 23, 2022 for U.S. Appl. No. 16/847,359.
Final Office Action dated Aug. 25, 2022 for U.S. Appl. No. 15/643,282.
Non-Final Office Action dated Dec. 20, 2022 for U.S. Appl. No. 15/643,282.
Final Office Action dated Feb. 6, 2023 for U.S. Appl. No. 17/100,823.
Notice of Allowance dated Apr. 20, 2022 for U.S. Appl. No. 15/643,289.
Non-Final Office Action dated Dec. 23, 2022 for U.S. Appl. No. 17/878,348.
Final Office Action dated Jun. 3, 2022 for U.S. Appl. No. 15/643,279.
Non-Final Office Action dated Dec. 22, 2022 for U.S. Appl. No. 15/938,787.
Non-Final Office Action dated Sep. 20, 2023 for U.S. Appl. No. 16/991,589.
Final office Action dated Jul. 7, 2023 for U.S. Appl. No. 17/878,348.
Non-Final Office Action dated Oct. 25, 2023 for U.S. Appl. No. 15/643,274.
Non-Final Office Action dated Oct. 26, 2023 for U.S. Appl. No. 17/878,348.
Non-Final Office Action dated Aug. 4, 2023 for U.S. Appl. No. 17/100,823.
Notice of Allowance dated Jan. 24, 2024 for U.S. Appl. No. 16/847,032.
Non-Final Office Action dated Sep. 13, 2023 for U.S. Appl. No. 15/643,279.
Non-Final Office Action dated Sep. 25, 2023 for U.S. Appl. No. 16/847,032.
Final Office Action dated Jun. 22, 2023 for U.S. Appl. No. 15/938,787.
Final Office Action dated Mar. 31, 2023 for U.S. Appl. No. 15/643,279.
Non-Final Office Action dated Feb. 8, 2024 for U.S. Appl. No. 15/938,791.
Non-Final Office Action dated Nov. 9, 2023 for U.S. Appl. No. 15/643,282.
Final Office Action dated Jun. 27, 2023 for U.S. Appl. No. 15/643,282.
Final Office Action dated Jan. 9, 2024 for U.S. Appl. No. 17/100,823.
Final Office Action dated Apr. 18, 2023 for U.S. Appl. No. 16/991,589.
Final Office Action dated Jun. 15, 2023 for U.S. Appl. No. 15/643,285.
Non-Final Office Action dated Apr. 19, 2023 for U.S. Appl. No. 15/787,304.
Non-Final Office Action dated Dec. 27, 2023 for U.S. Appl. No. 15/787,291.
Non-Final Office Action dated May 5, 2023 for U.S. Appl. No. 15/797,291.
Non-Final Office Action dated Jan. 26, 2024 for U.S. Appl. No. 15/787,304.
Final Office Action dated Sep. 11, 2023 for U.S. Appl. No. 15/787,291.
Final Office Action dated Oct. 10, 2023 for U.S. Appl. No. 15/938,791.
Extended European Search Report dated Feb. 13, 2024 for European Patent Application No. 23169034.8.
Final Office Action dated Mar. 4, 2024 for U.S. Appl. No. 15/643,279.
Final Office Action dated Apr. 24, 2024 for U.S. Appl. No. 15/643,274.
Non-Final Office Action dated Jun. 18, 2024 for U.S. Appl. No. 15/643,279.
Final Office Action dated Mar. 14, 2024 for U.S. Appl. No. 16/991,589.
Non-Final Office Action dated May 7, 2024 for U.S. Appl. No. 17/100,823.
Final Office Action dated May 10, 2024 for U.S. Appl. No. 15/787,304.
Final Office Action dated May 23, 2024 for U.S. Appl. No. 15/643,282.
Final Office Action dated May 24, 2024 for U.S. Appl. No. 15/787,291.

* cited by examiner

72b

72b

Stayout Area 74

PREFABRICATED CONDUCTORS ON A SUBSTRATE TO FACILITATE CORNER CONNECTIONS FOR A SOLAR CELL ARRAY

CROSS REFERENCE TO RELATED APPLICATIONS

This application claims the benefit under 35 U.S.C. Section 119(e) of the following co-pending and commonly-assigned applications:

U.S. Provisional Application Ser. No. 62/394,636, filed on Sep. 14, 2016, by Eric Rehder, entitled "SOLAR CELL ARRAY CONNECTIONS,";

U.S. Provisional Application Ser. No. 62/394,616, filed on Sep. 14, 2016, by Eric Rehder, entitled "CORNER CONNECTORS FOR A SOLAR CELL ARRAY,";

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY,";

U.S. Provisional Application Ser. No. 62/394,627, filed on Sep. 14, 2016, by Eric Rehder, entitled "SELECT CURRENT PATHWAYS IN A SOLAR ARRAY,";

U.S. Provisional Application Ser. No. 62/394,629, filed on Sep. 14, 2016, by Eric Rehder, entitled "MULTILAYER CONDUCTORS IN A SOLAR ARRAY,";

U.S. Provisional Application Ser. No. 62/394,632, filed on Sep. 14, 2016, by Eric Rehder, entitled "REWORK AND REPAIR OF COMPONENTS IN A SOLAR ARRAY,";

U.S. Provisional Application Ser. No. 62/394,649, filed on Sep. 14, 2016, by Eric Rehder, entitled "POWER ROUTING MODULE FOR A SOLAR ARRAY,";

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,";

U.S. Provisional Application Ser. No. 62/394,667, filed on Sep. 14, 2016, by Eric Rehder, entitled "NANO-METAL CONNECTIONS FOR A SOLAR CELL ARRAY,";

U.S. Provisional Application Ser. No. 62/394,671, filed on Sep. 14, 2016, by Eric Rehder, entitled "BACK CONTACTS FOR A SOLAR CELL ARRAY,";

U.S. Provisional Application Ser. No. 62/394,641, filed on Sep. 14, 2016, by Eric Rehder, entitled "PRINTED CONDUCTORS IN A SOLAR CELL ARRAY,"; and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY,";

all of which applications are incorporated by reference herein.

This application claims the benefit under 35 U.S.C. Section 120 of the following co-pending and commonly-assigned applications:

U.S. Utility Application Ser. No. 15/643,274, filed on Jul. 6, 2017, by Eric Rehder, entitled "SOLAR CELL ARRAY CONNECTIONS USING CORNER CONDUCTORS,";

U.S. Utility Application Ser. No. 15/643,279, filed Jul. 6, 2017, by Eric Rehder, entitled "REWORK AND REPAIR OF COMPONENTS IN A SOLAR ARRAY,";

U.S. Utility Application Ser. No. 15/643,282, filed on Jul. 6, 2017, by Eric Rehder, entitled "POWER ROUTING MODULE FOR A SOLAR ARRAY,";

U.S. Utility Application Ser. No. 15/643,285, filed on Jul. 6, 2017, by Eric Rehder, entitled "POWER ROUTING MODULE WITH A SWITCHING MATRIX FOR A SOLAR CELL ARRAY,";

U.S. Utility Application Ser. No. 15/643,287, filed on Jul. 6, 2017, by Eric Rehder, entitled "NANO-METAL CONNECTIONS FOR A SOLAR CELL ARRAY,"; and U.S. Utility Application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY,";

all of which applications claim the benefit under 35 U.S.C. Section 119 (e) of the co-pending and commonly-assigned provisional applications listed above: 62/394,636; 62/394,616; 62/394,623; 62/394,627; 62/394,629; 62/394,632; 62/394,649; 62/394,666; 62/394,667; 62/394,671; 62/394,641; and 62/394,672; and all of which applications are incorporated by reference herein.

STATEMENT REGARDING FEDERALLY SPONSORED RESEARCH OR DEVELOPMENT

This invention was made with government support under Contract No. FA9453-09C-0373 awarded by the Air Force Research Laboratory (AFRL). The government has certain rights in this invention.

BACKGROUND INFORMATION

1. Field

The disclosure is related generally to solar cell panels and more specifically to prefabricated conductors on a substrate to facilitate corner connections for a solar cell array.

2. Background

Typical spaceflight-capable solar cell panel assembly involves building long strings of solar cells. These strings are variable in length and can be very long, for example, up to and greater than 20 cells. Assembling such long, variable, and fragile materials is difficult, which has prevented automation of the assembly.

Existing solutions use solar cells assembled into CIC (cell, interconnect and coverglass) units. The CIC has metal foil interconnects connected to the front of the cell that extend in parallel from one side of the CIC. The CICs are located close to each other and the interconnects make connection to the bottom of an adjacent cell. Using these interconnects, the CICs are assembled into linear strings. These linear strings are built-up manually and then laid out to form a large solar cell array comprised of many strings of variable length.

Additionally, a bypass diode is used to protect the cells from reverse bias when the cells become partially shadowed. The bypass diode generally connects the back contacts of two adjacent cells within the solar cell array.

When used in a satellite, the solar cell array is typically packaged as a panel. The dimensions of the panel are dictated by the needs of the satellite, including such constraints as needed power, as well as the size and shape necessary to pack and store the satellite in a launch vehicle. Furthermore, the deployment of the panel often requires that some portions of the panel are used for the mechanical fixtures and the solar cell array must avoid these locations. In practice, the panel is generally rectangular, but its dimensions and aspect ratio vary greatly. The layout of the CICs and strings to fill this space must be highly customized for maximum power generation, which results in a fabrication process that is highly manual.

What is needed, then, is a means for promoting automated manufacturing of solar arrays, while preserving the ability for customization of solar cell arrays.

SUMMARY

To overcome the limitations in the prior art described above, and to overcome other limitations that will become apparent upon reading and understanding the present specification, the present disclosure describes devices, structures, and methods for solar cells, solar cell arrays and solar cell panels.

In one aspect, there is a substrate for solar cells, wherein the substrate is configured such that: an area of the substrate remains exposed when at least one solar cell having at least one cropped corner that defines a corner region is attached to the substrate; the area of the substrate that remains exposed includes one or more conductors; and electrical connections between the solar cell and the conductors are made in the corner region. The solar cell includes a front contact on a front side of the solar cell, wherein the front contact extends into the corner region, and the solar cell includes a back contact on a back side of the solar cell, wherein the back contact extends into the corner region. The conductors are patterned on the substrate; the conductors are covered with an insulating layer; the solar cell is placed on top of the conductors; the conductors pass under the solar cell; the conductors are outside a perimeter of the solar cell; and the conductors pass from one cropped corner to another cropped corner of the solar cell. The at least one solar cell comprises a plurality of solar cells that are attached to the substrate in a two-dimensional (2-D) grid of an array, wherein: the electrical connections are series connections that determine a flow of current through the plurality of solar cells; the electrical connections terminate a string of the plurality of solar cells; and the conductors pass from a cropped corner of one of the solar cells to a cropped corner of another one of the solar cells. The conductors enable the electrical connections to leave the substrate. One or more bypass diodes are added to the area of the substrate that remains exposed for use in one or more of the electrical connections.

In another aspect, there is a substrate for solar cells, wherein the substrate is configured such that: an area of the substrate remains exposed when at least one solar cell having at least one cropped corner that defines a corner region is attached to the substrate; the area of the substrate that remains exposed includes one or more corner conductors; one or more electrical connections between the solar cell and the corner conductors are made in the corner region resulting from the cropped corner of the solar cell; and one or more conductive elements are added to or removed from the corner region to select current pathways for the solar cells. At least one of the conductive elements comprises a jumper, and the jumper connects the electrical connections on the substrate. The jumper is located in the corner region; and the jumper has a shape that provides multiple connections points to the electrical connections on the substrate. At least one of the electrical connections comprises: a series connection of the solar cells; and a circuit termination of the solar cells.

In yet another aspect, there is a substrate for solar cells, wherein the substrate is configured such that: an area of the substrate remains exposed when at least one solar cell having at least one cropped corner that defines a corner region is attached to the substrate; the area of the substrate that remains exposed includes one or more corner conductors; one or more electrical connections between the solar cell and the corner conductors are made in the corner region resulting from the cropped corner of the solar cell; and one or more multilayer conductors are embedded within the substrate for electrically connecting to the corner conductors and the solar cells. The multilayer conductors pass beneath the corner conductors and the solar cells, wherein: at least one of the multilayer conductors runs under the at least one of the solar cells to electrically connect a front contact on one corner of the at least one of the solar cells to a front contact on another corner of the at least one of the solar cells; at least one of the multilayer conductors runs under the at least one of the solar cells to electrically connect a front contact on one corner of the at least one of the solar cells to a back contact on another corner of the at least one of the solar cells; at least one of the multilayer conductors runs under the at least one of the solar cells to electrically connect a back contact on one corner of the at least one of the solar cells to a back contact on another corner of the at least one of the solar cells; and at least one of the multilayer conductors electrically connects the at least one of the solar cells to a bypass diode. At least one of the multilayer conductors is connected to at least another one of the multilayer conductors; and at least one of the multilayer conductors extends to a plurality of corner regions. An insulating layer separates at least one of the multilayer conductors from at least another one of the multilayer conductors; and an insulating overlay is applied to at least one of the multilayer conductors. At least one of the multilayer conductors enables a series connection of the solar cells; and at least one of the multilayer conductors enables a circuit termination of the solar cells.

In yet another aspect, there is a substrate for solar cells, wherein the substrate is configured such that: an area of the substrate remains exposed when at least one solar cell having at least one cropped corner that defines a corner region is attached to the substrate; the area of the substrate that remains exposed includes one or more corner conductors, wherein the corner conductors are printed on the substrate before or after the solar cell is attached to the substrate; and one or more electrical connections between the solar cell and the corner conductors are made in the corner region resulting from the cropped corner of the solar cell. The corner conductors are added to conducting paths already in place on the substrate; the corner conductors are printed with metal particles; and the substrate is cured after the corner conductors are printed on the substrate. The corner conductors are encapsulated by an insulator; the insulator is printed on the corner conductors; and a conductive layer is deposited on the insulator. The corner conductors include one or more pads printed on the substrate. One or more conductive elements are printed in the corner region to select current pathways for the solar cells.

DRAWINGS

Referring now to the drawings in which like reference numbers represent corresponding parts throughout:

Figure 18:
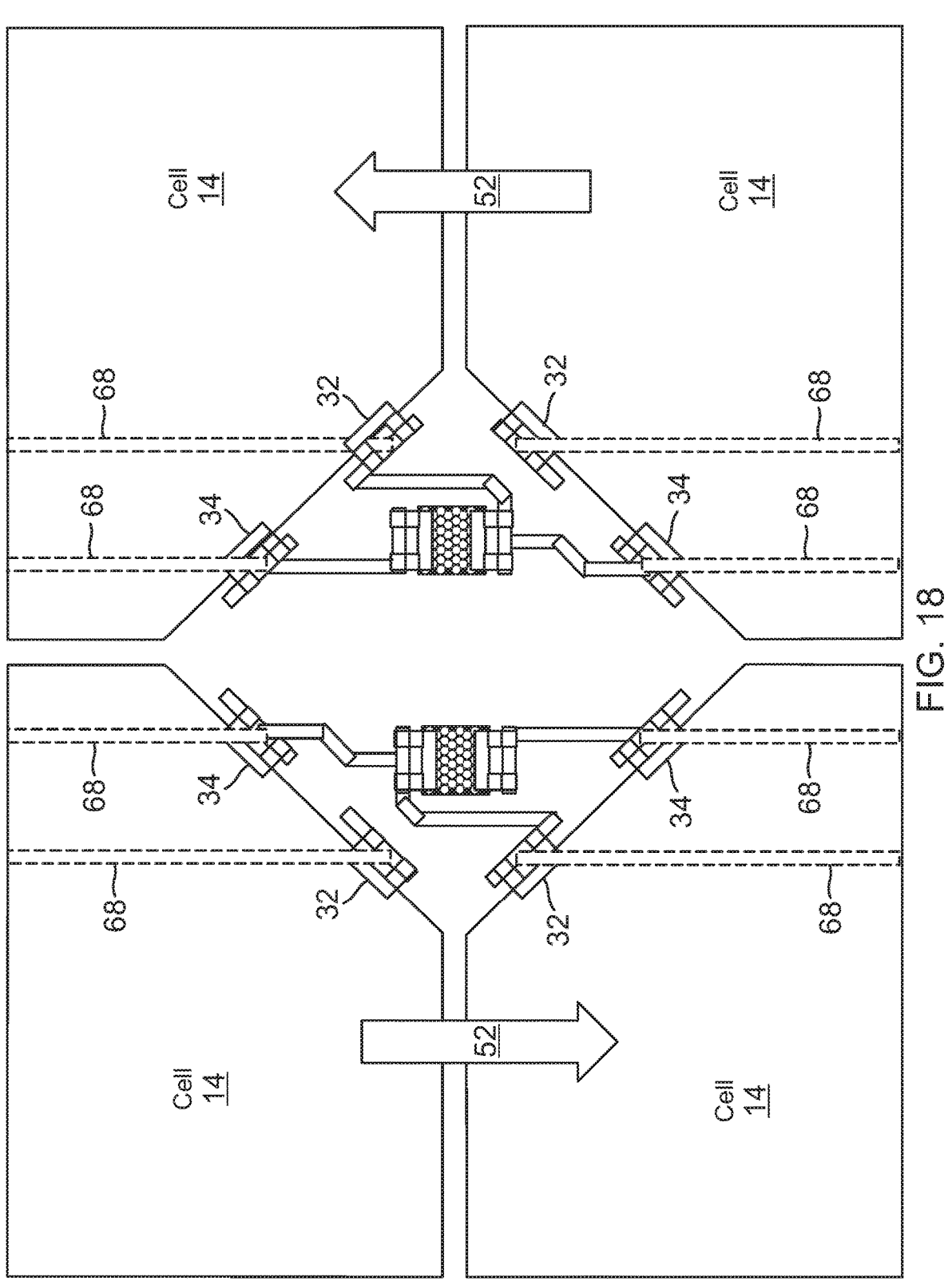

FIG. 18 provides greater detail of the buried conductors, according to one example.

Figure 19:
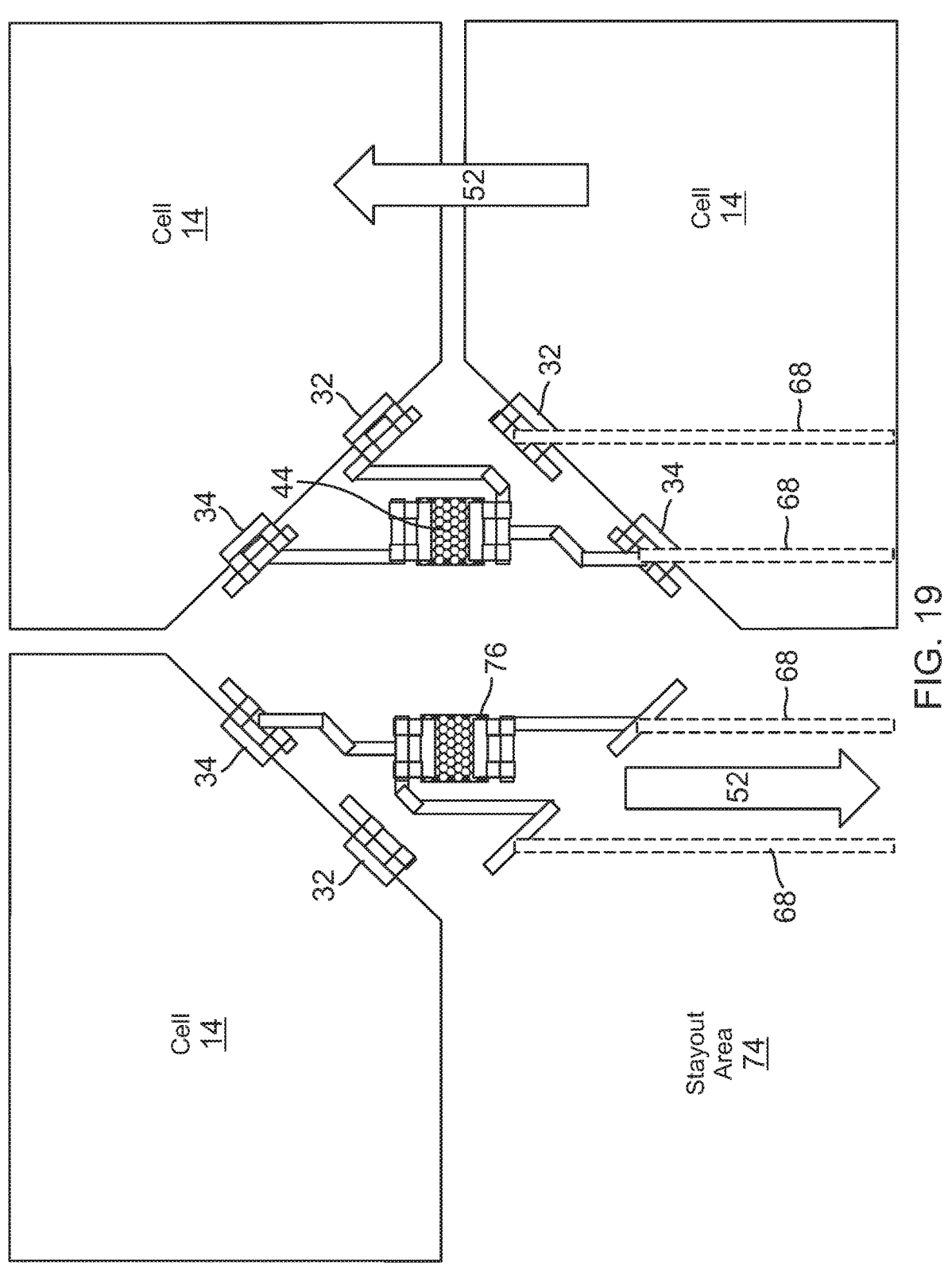

FIG. 19 shows an example where there is a missing or omitted solar cell labeled as a stayout area, according to one example.

Figure 20:
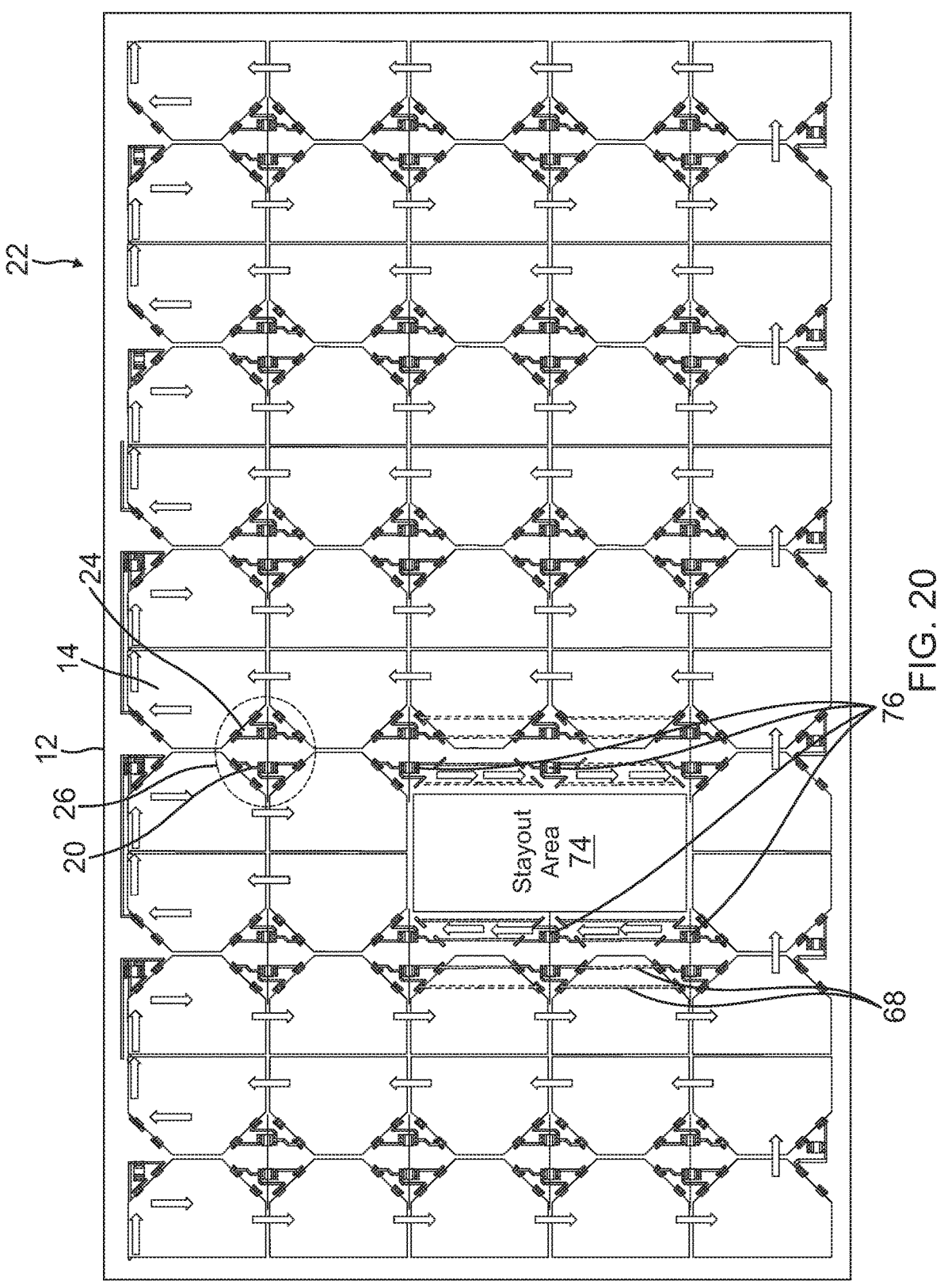

FIG. 20 shows the 2-D grid of the array having a large stay-out area in place of four omitted solar cells.

Figure 21:
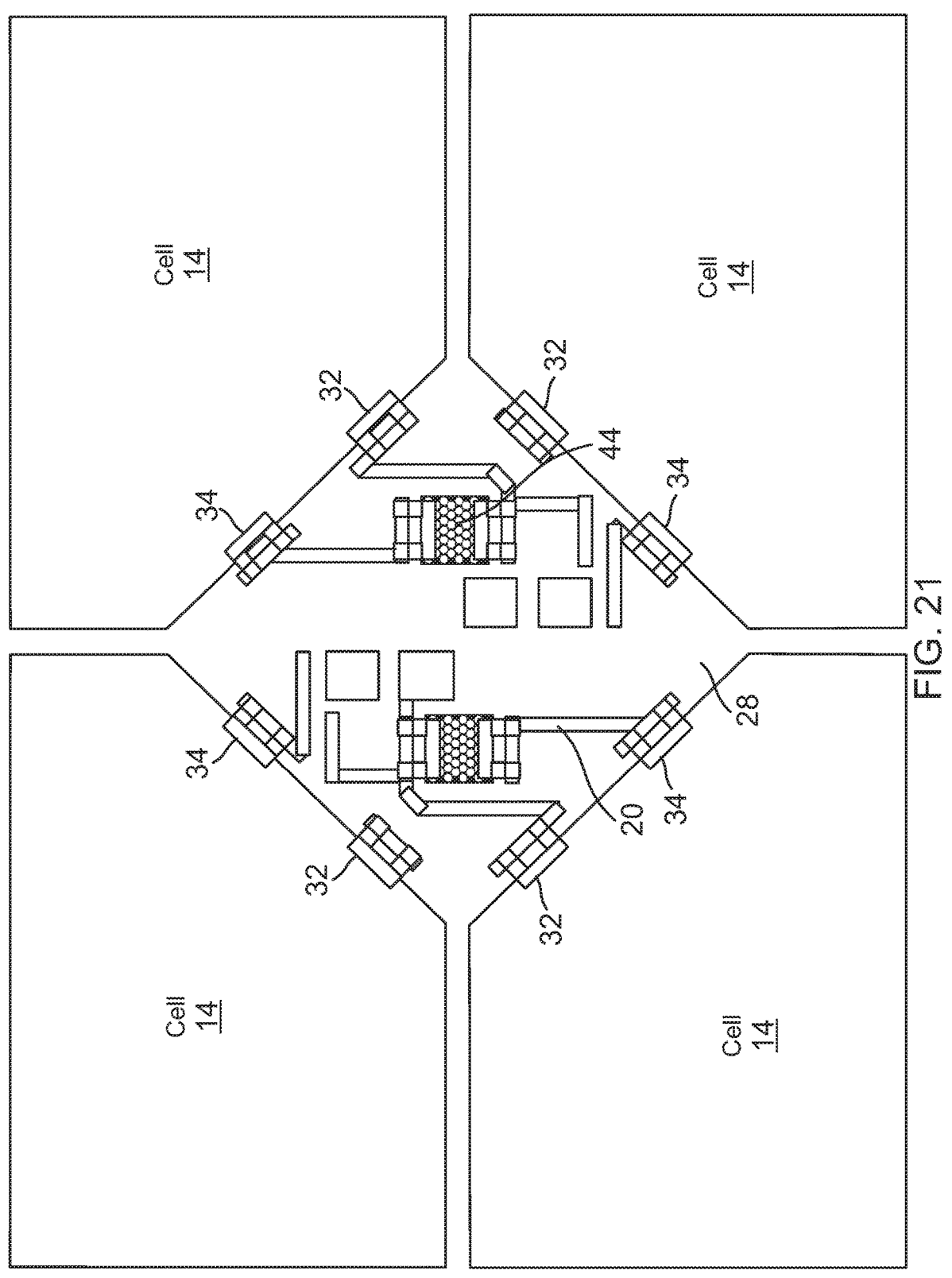

FIG. 21 further illustrates a connection scheme between a plurality of solar cells, according to one example.

Figure 22:
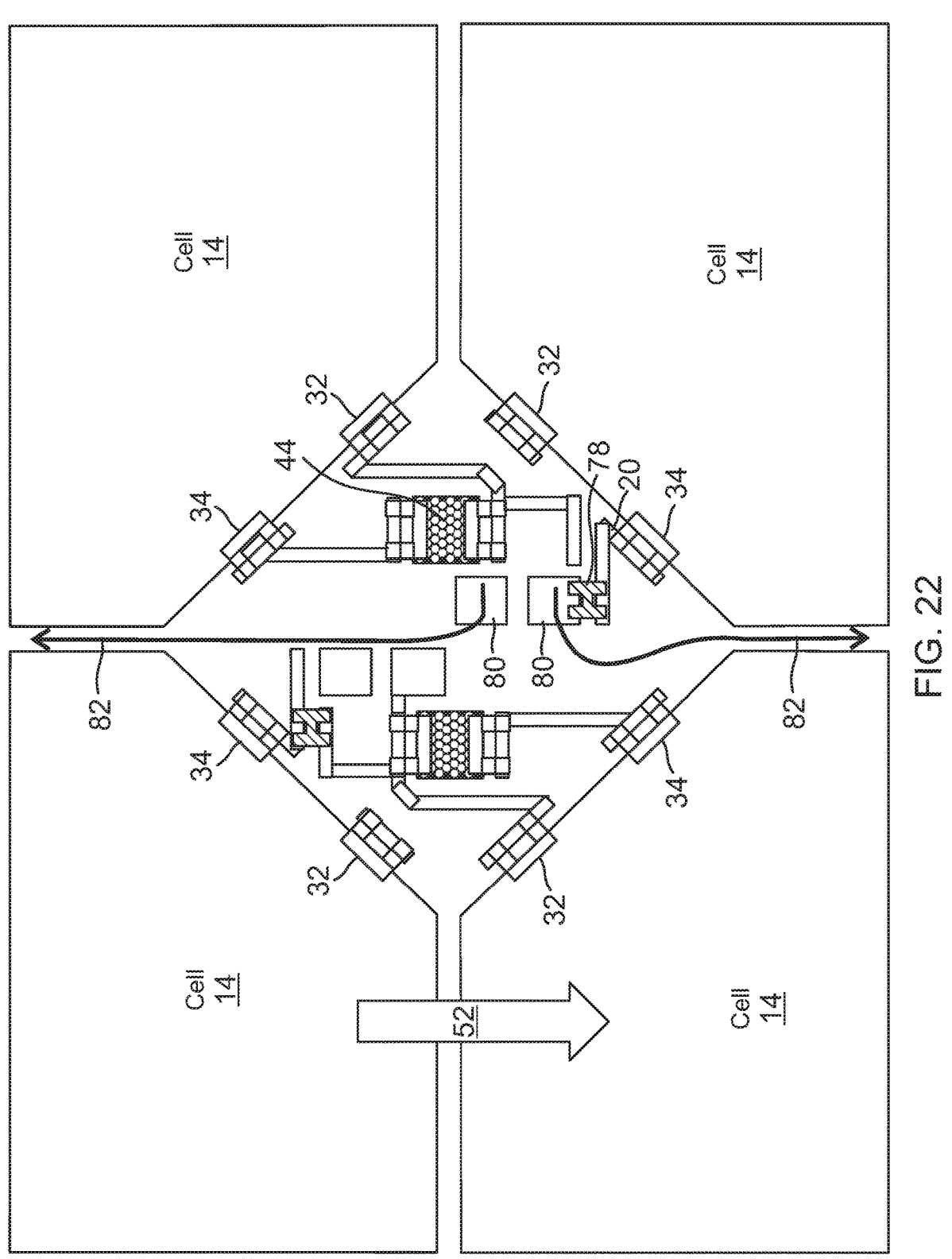

FIG. 22 illustrates an example where external wiring and one or more conductor elements comprising a jumper is added to an electrical connection.

Figure 23:
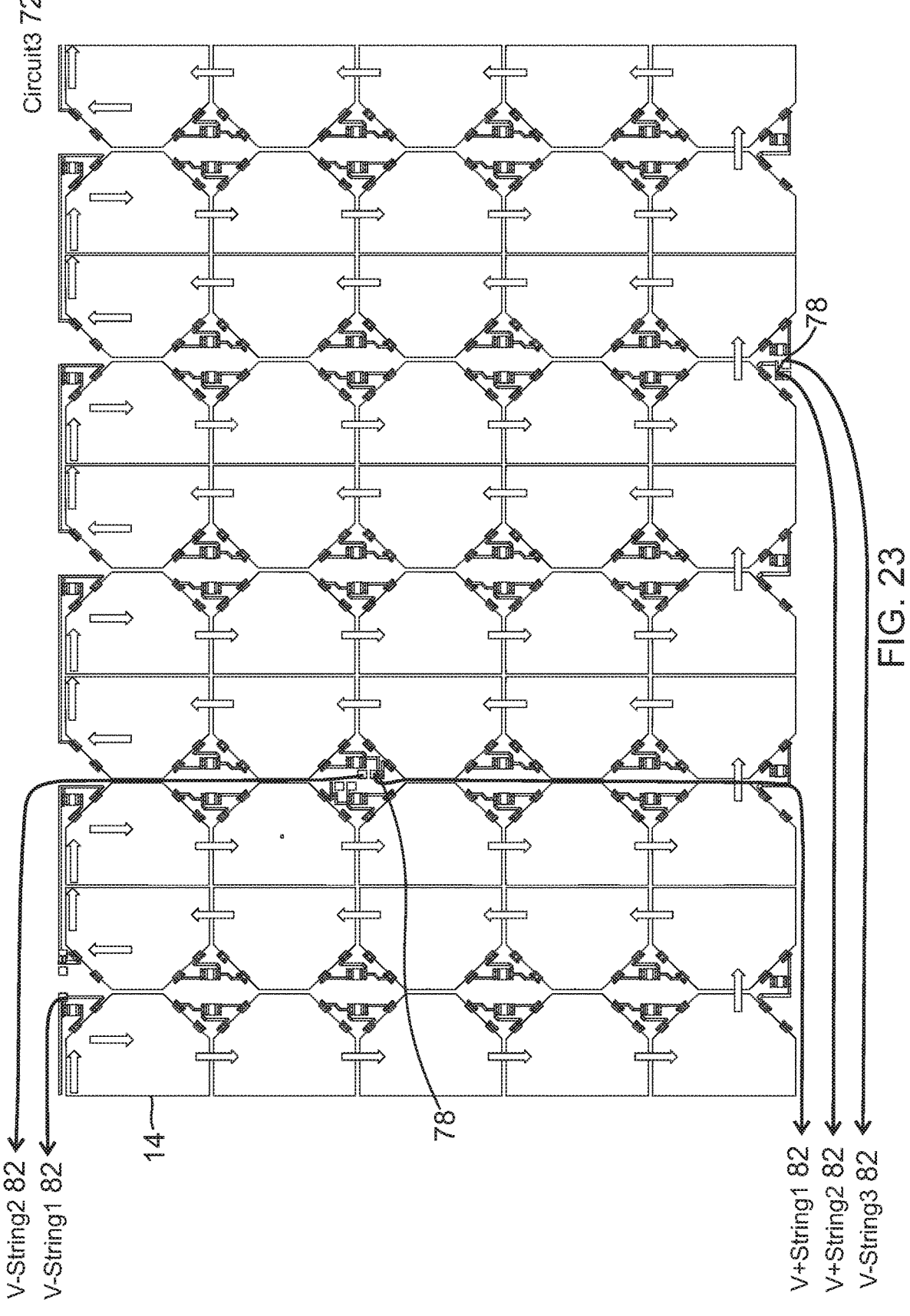

FIG. 23 shows the combination of structures into the 2-D grid of the array, according to one example.

Figure 24:
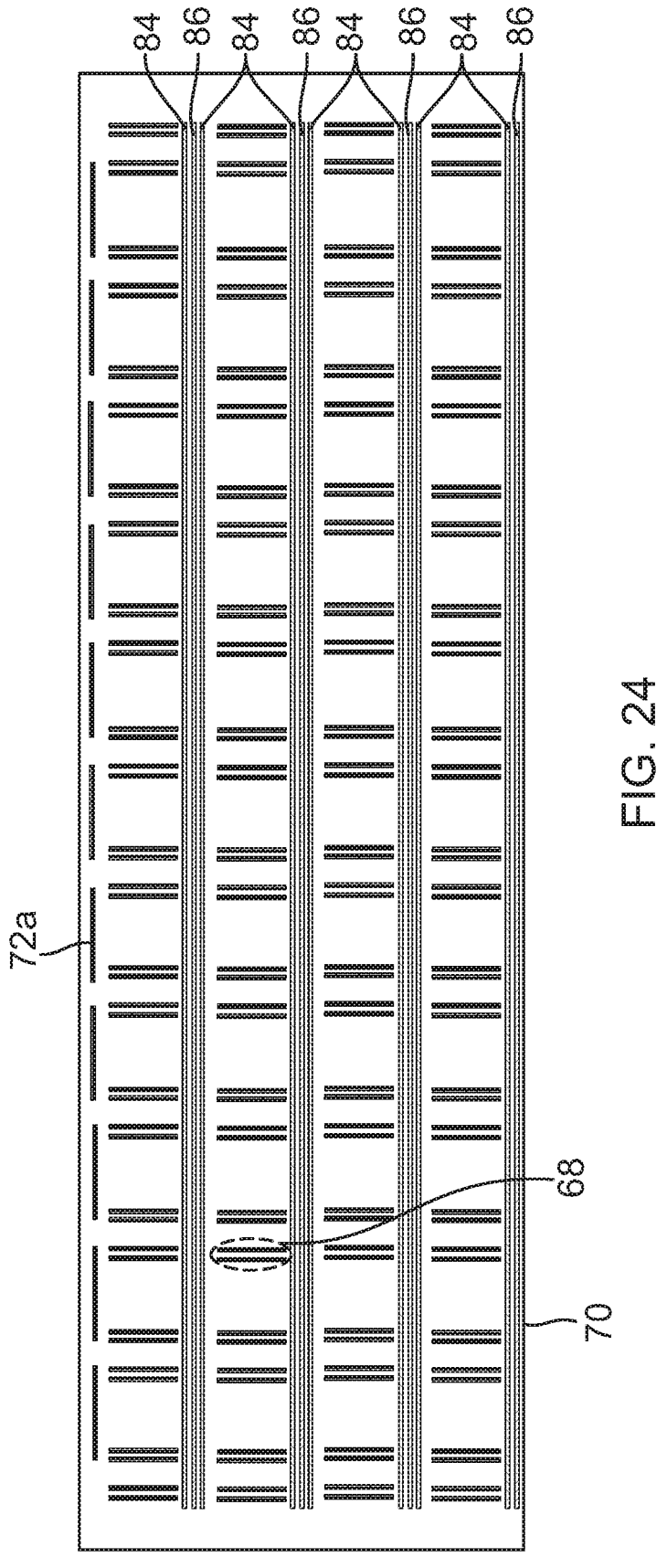

FIG. 24 illustrates another configuration for the buried layer embedded within the substrate, configured as shown in FIGS. 3 and 4, that includes the buried conductors beneath the solar cells that are used for connections between the cells.

Figure 25:
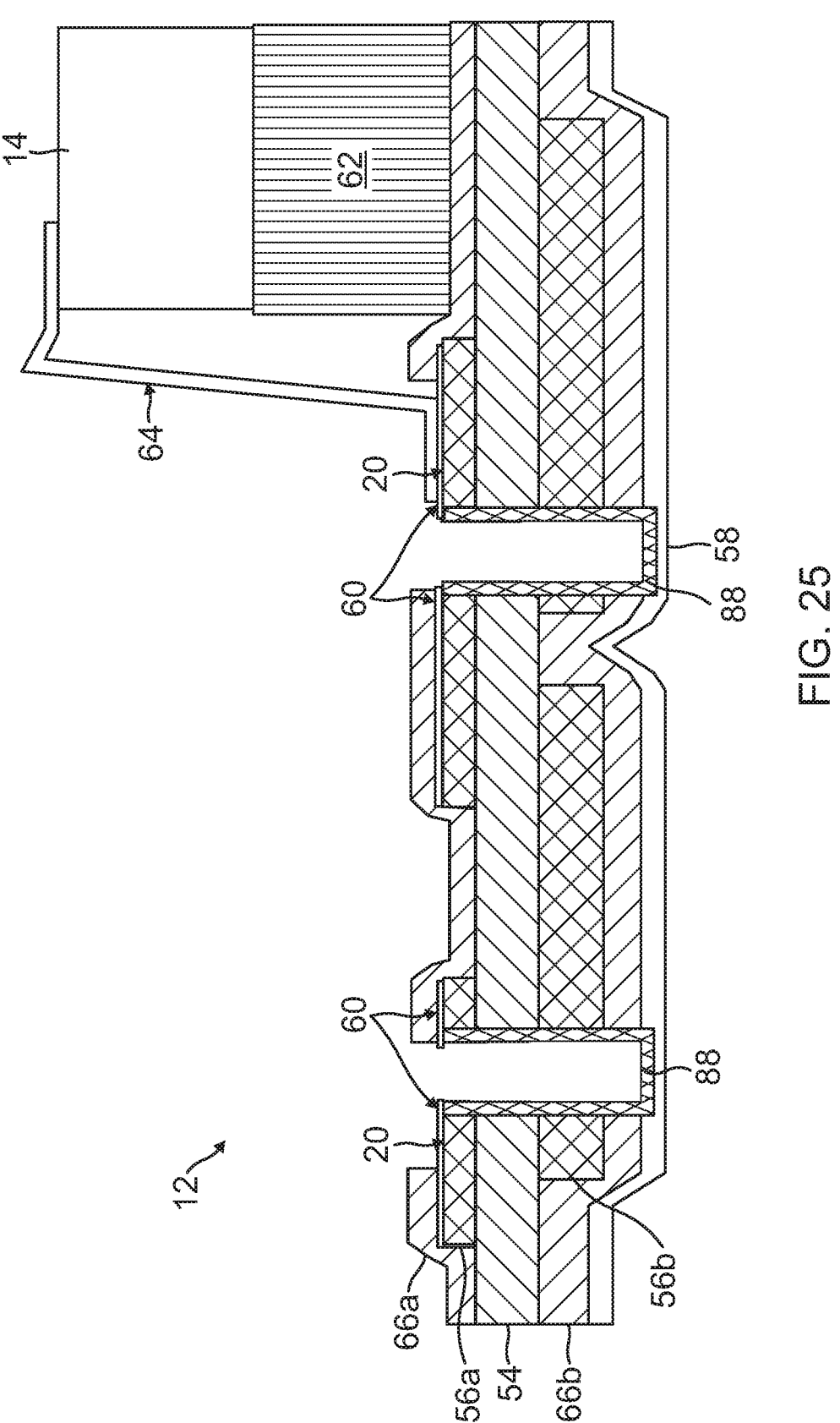

FIG. 25 shows a side view of an example wherein the substrate is a flex sheet assembly, according to one example.

Figure 26:
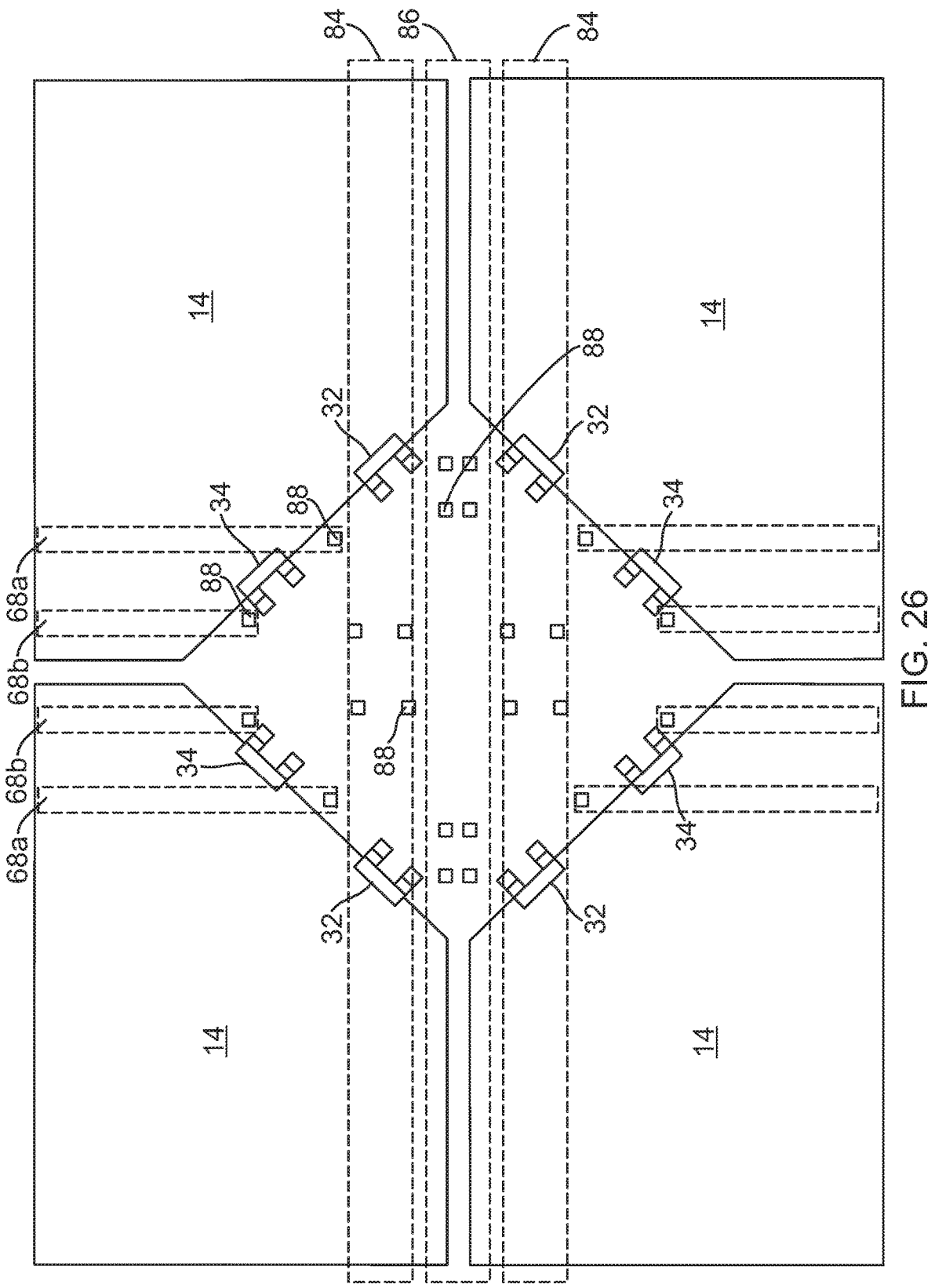

FIG. 26 shows the corner-to-corner bridge lines, as well as the power lines and common lines, according to one example.

Figure 27:
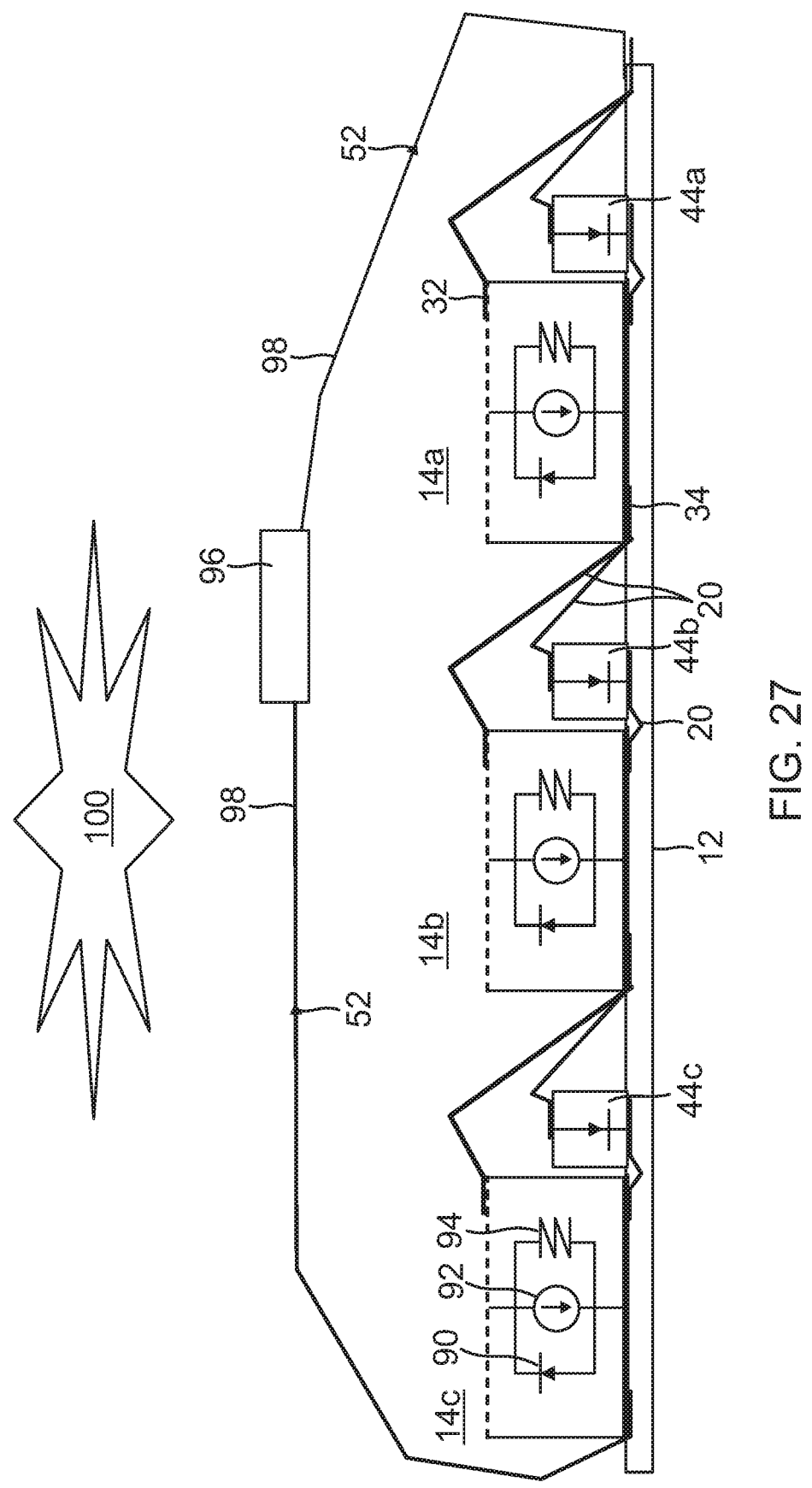

FIG. 27 shows a standard connection between three cells arranged on a substrate and connected in a series using corner conductors with bypass diodes, according to one example.

Figure 28:
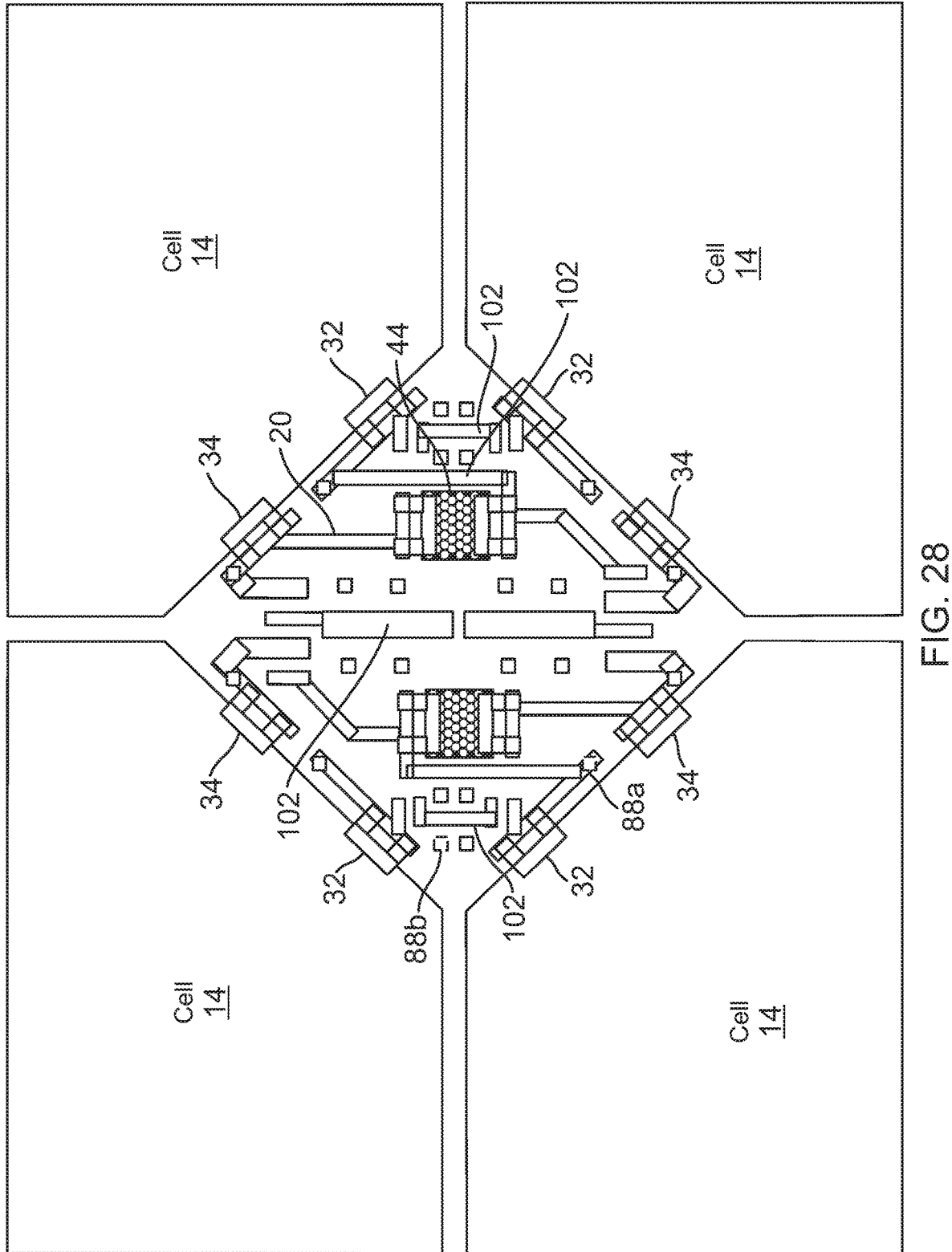

FIG. 28 shows how buried Copper layers are integrated, according to one example.

Figure 29:
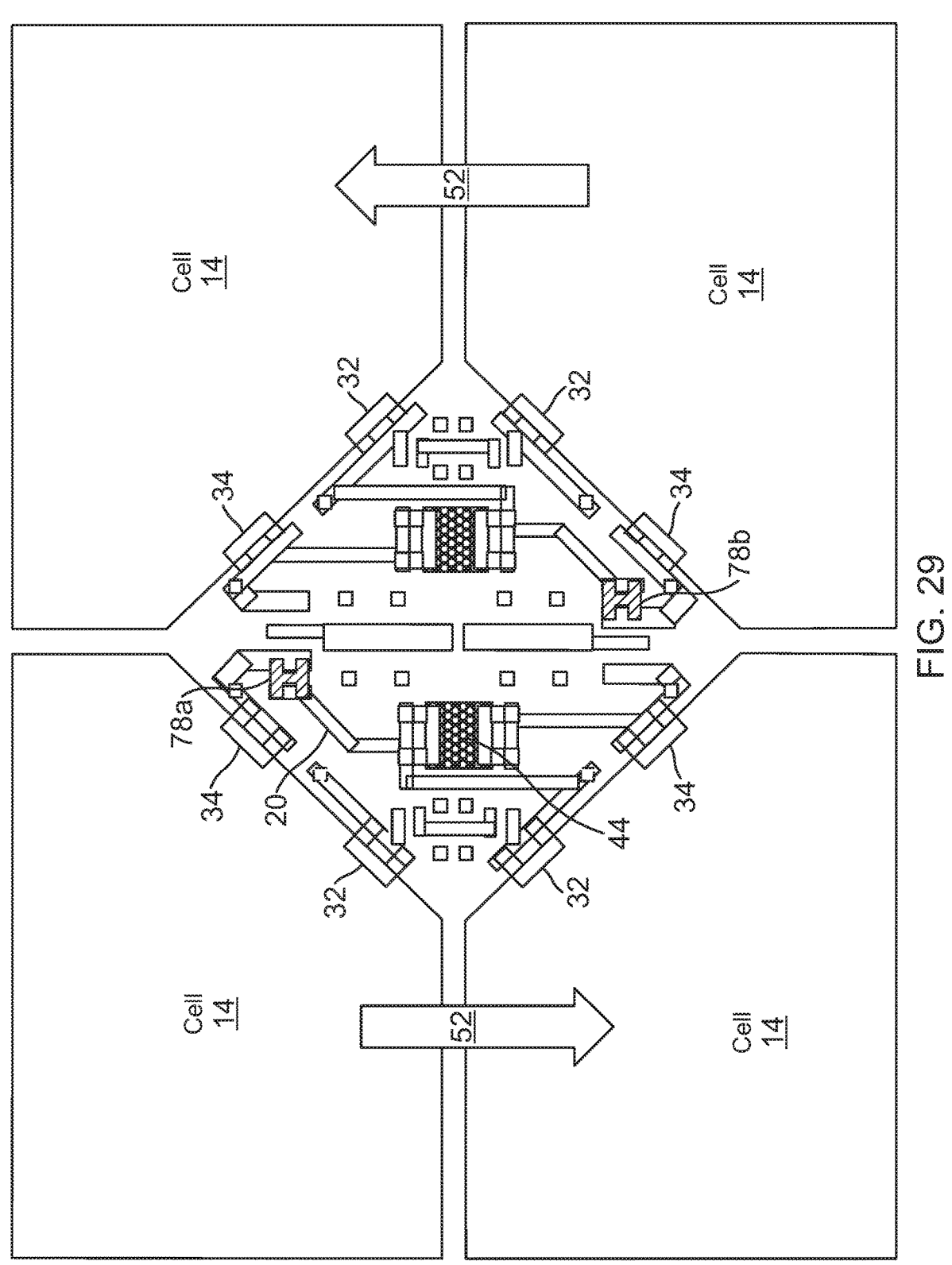

FIG. 29 shows a jumper that connects the back contact of the top left cell to the front contact of the bottom left cell, according to one example.

Figure 30:
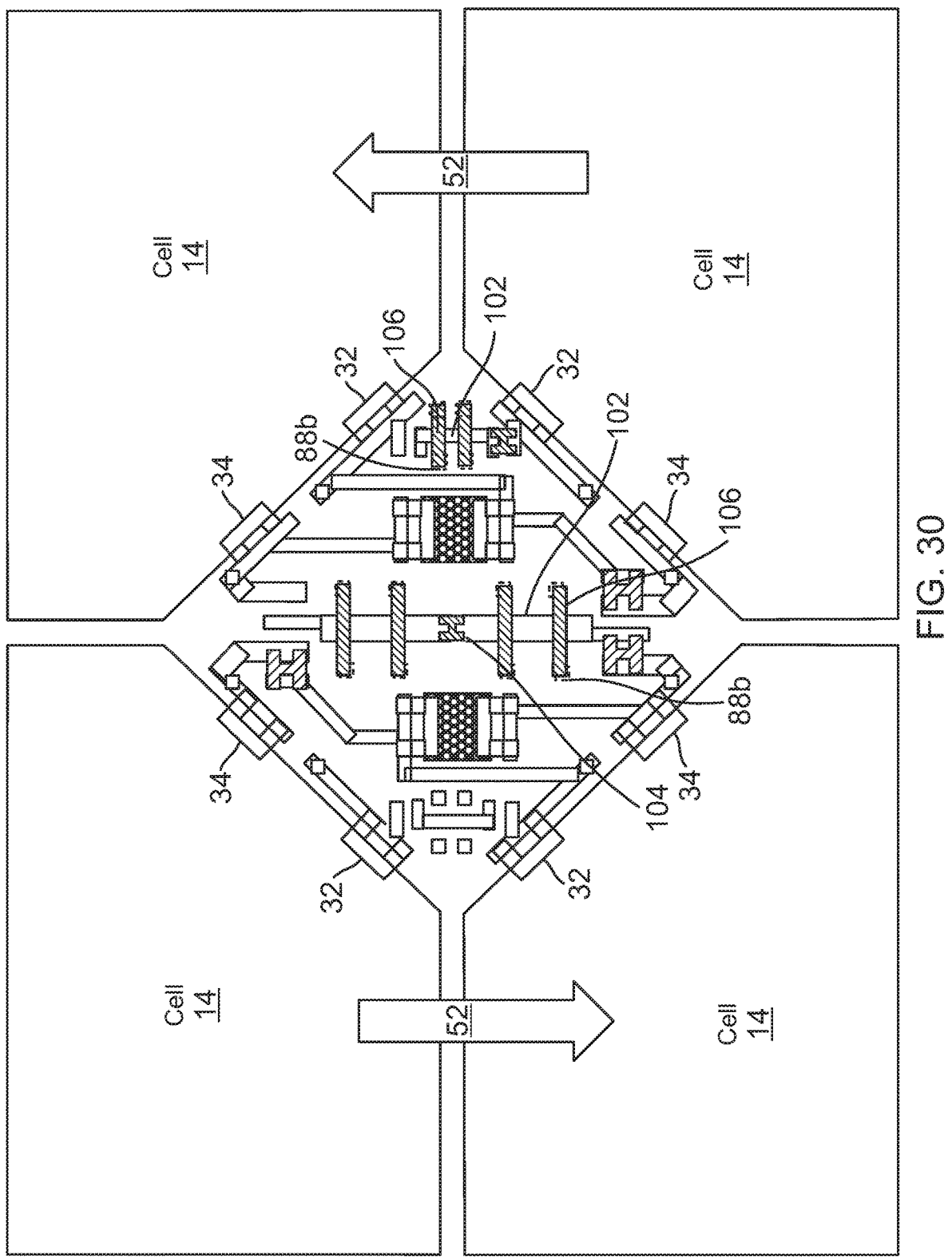

FIG. 30 shows a connection between the cells on the top left and bottom left of the figure, according to one example.

Figure 31:
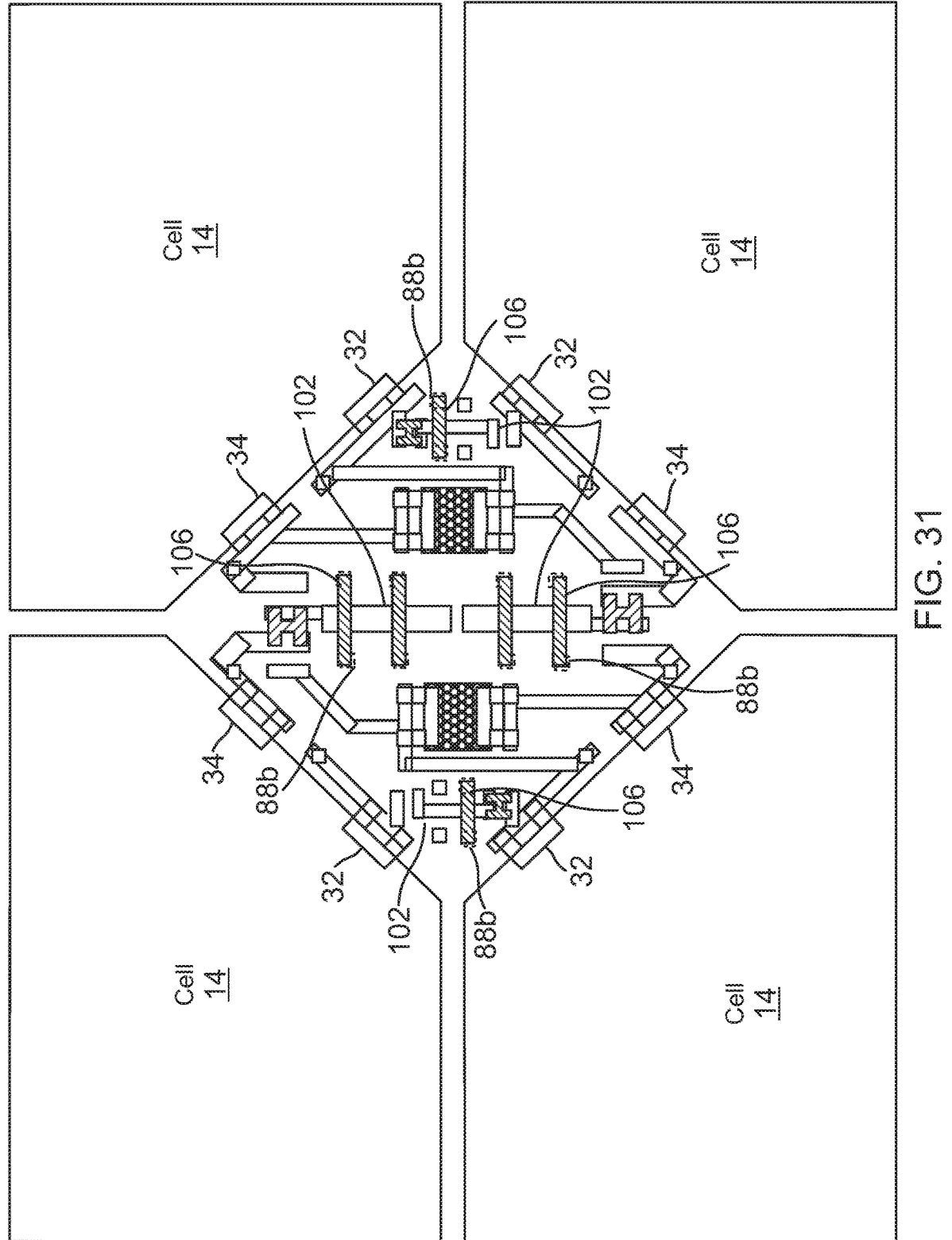

FIG. 31 shows the back contact of the cell on the top left of the figure terminated to the top center power bar, according to one example.

Figure 32:
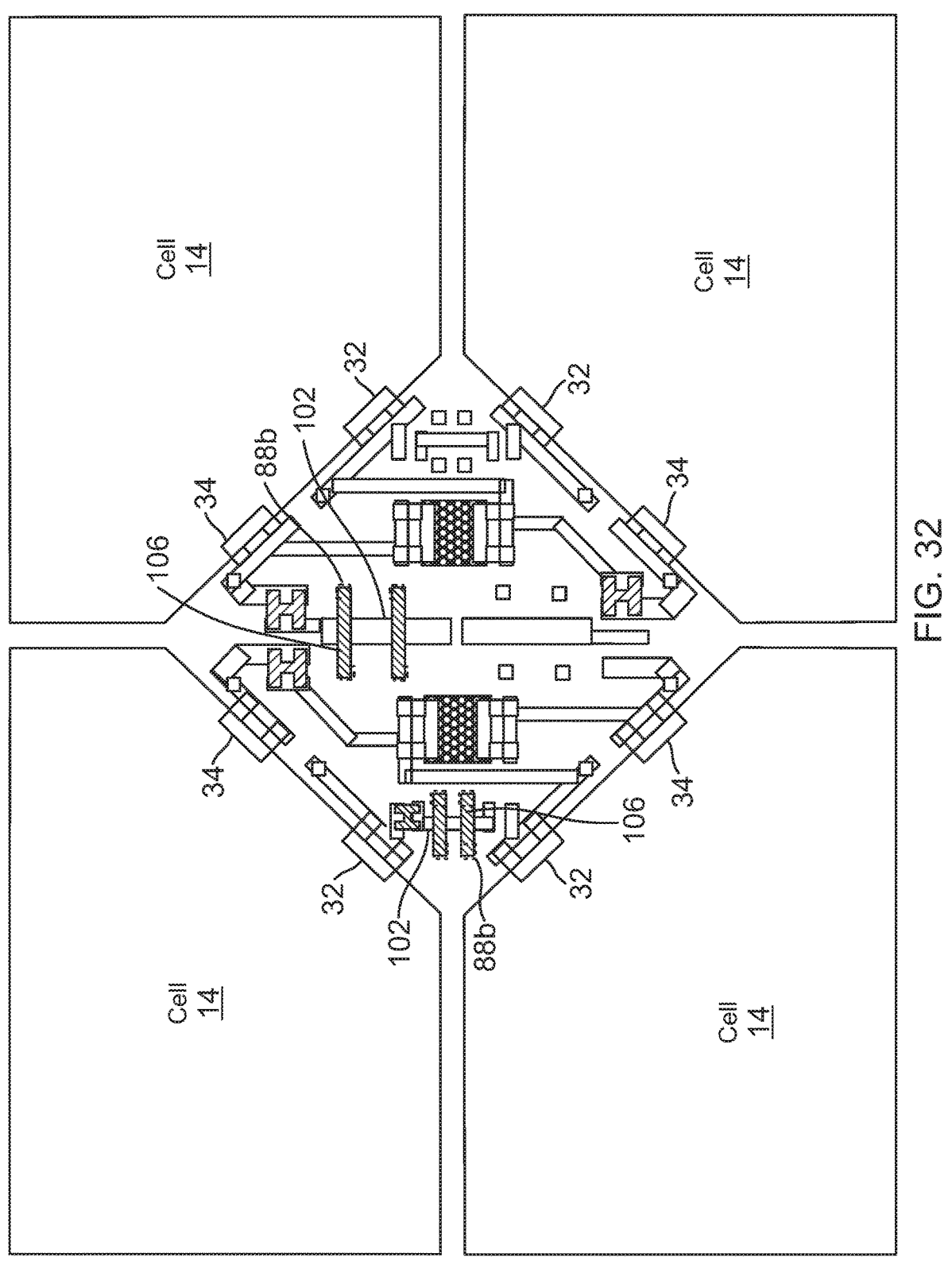

FIG. 32 shows the front contact of the cell on the top left of the figure connected to the left side power distribution bar.

Figure 33:
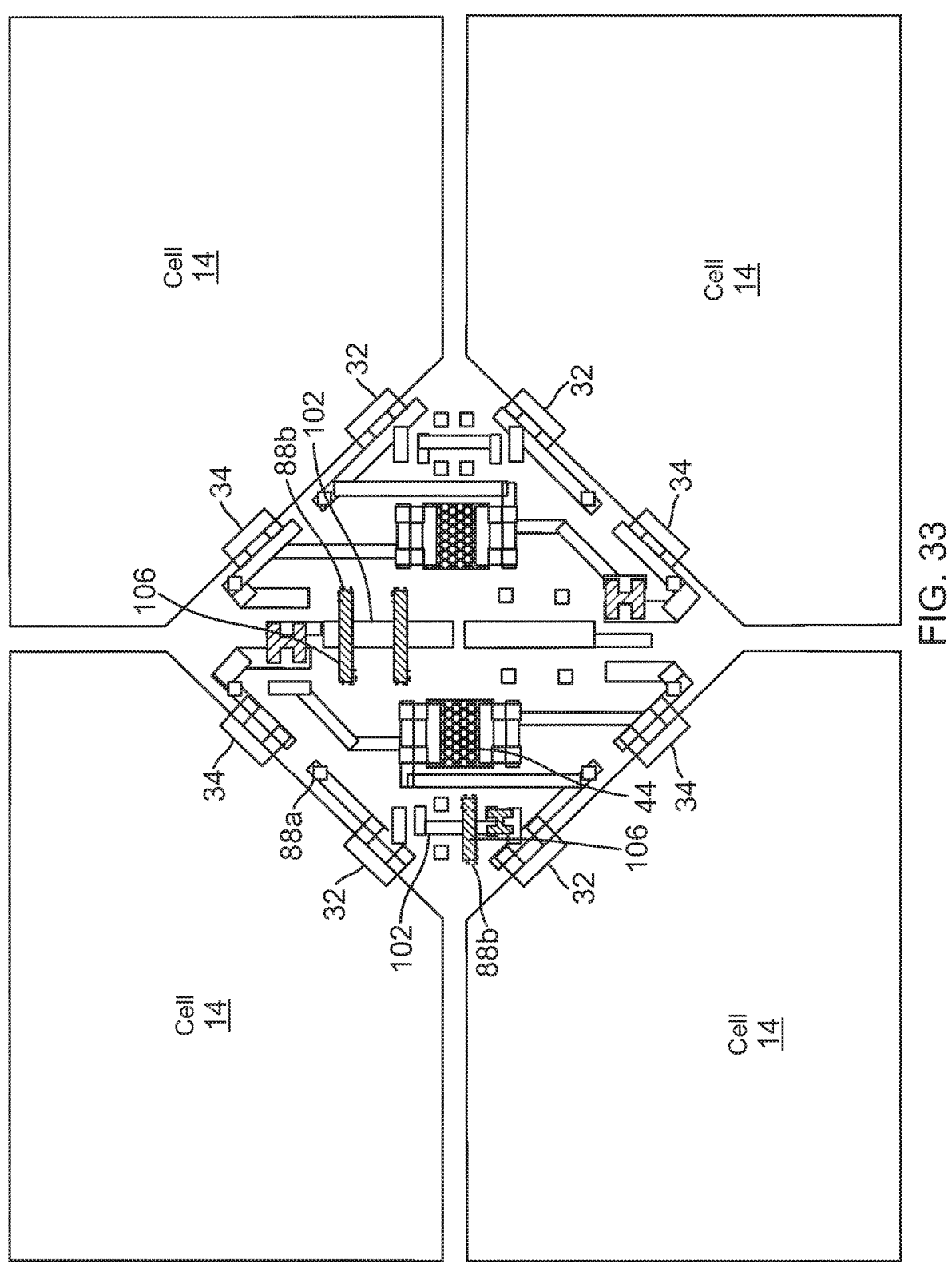

FIG. 33 shows the back contact of the cell on the top left of the figure is terminated to the top center power distribution bar, according to one example.

Figure 34:
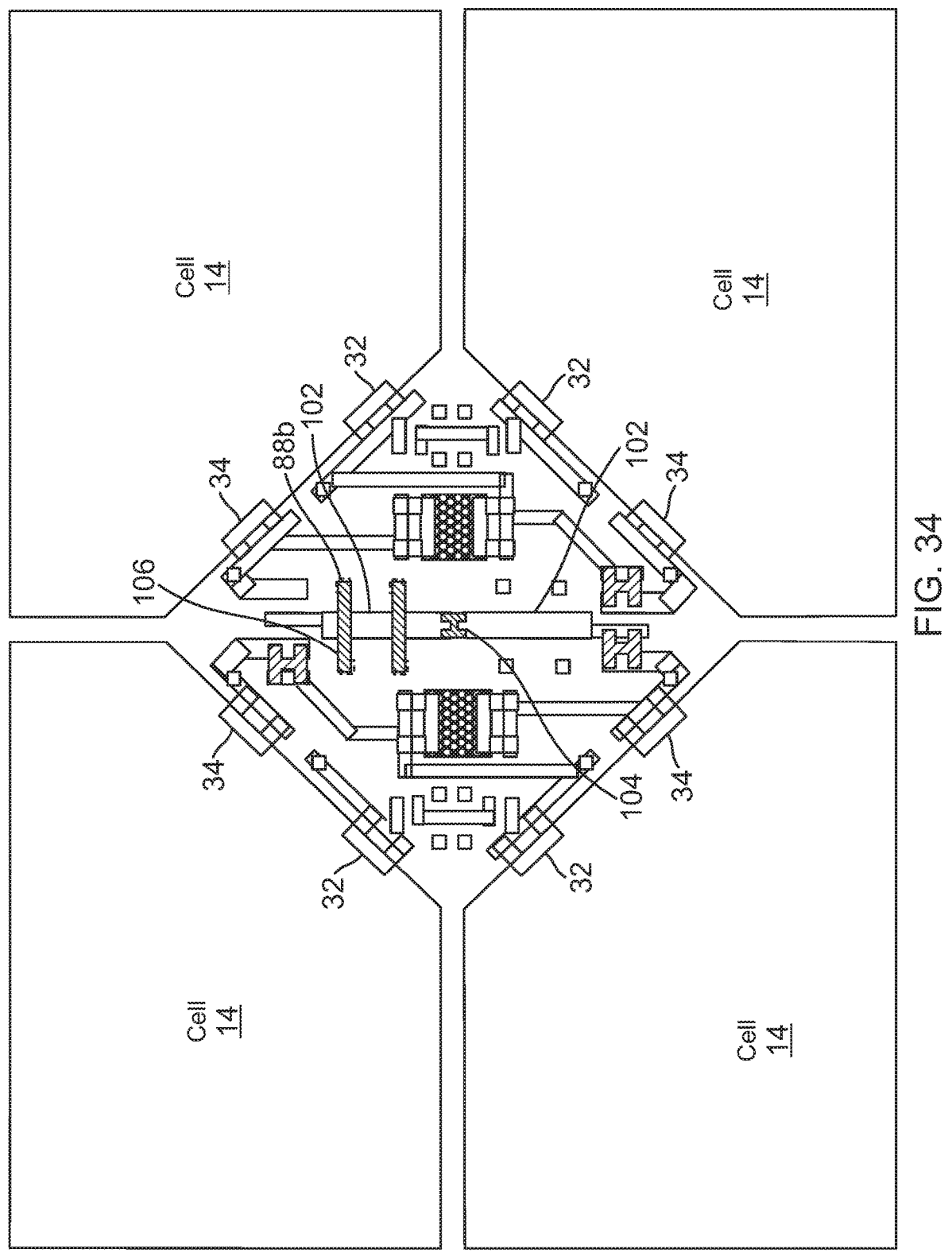

FIG. 34 shows the back contact of the cell on the top left of the figure is series connected to the cell on the bottom left of the figure, according to one example.

Figure 35:
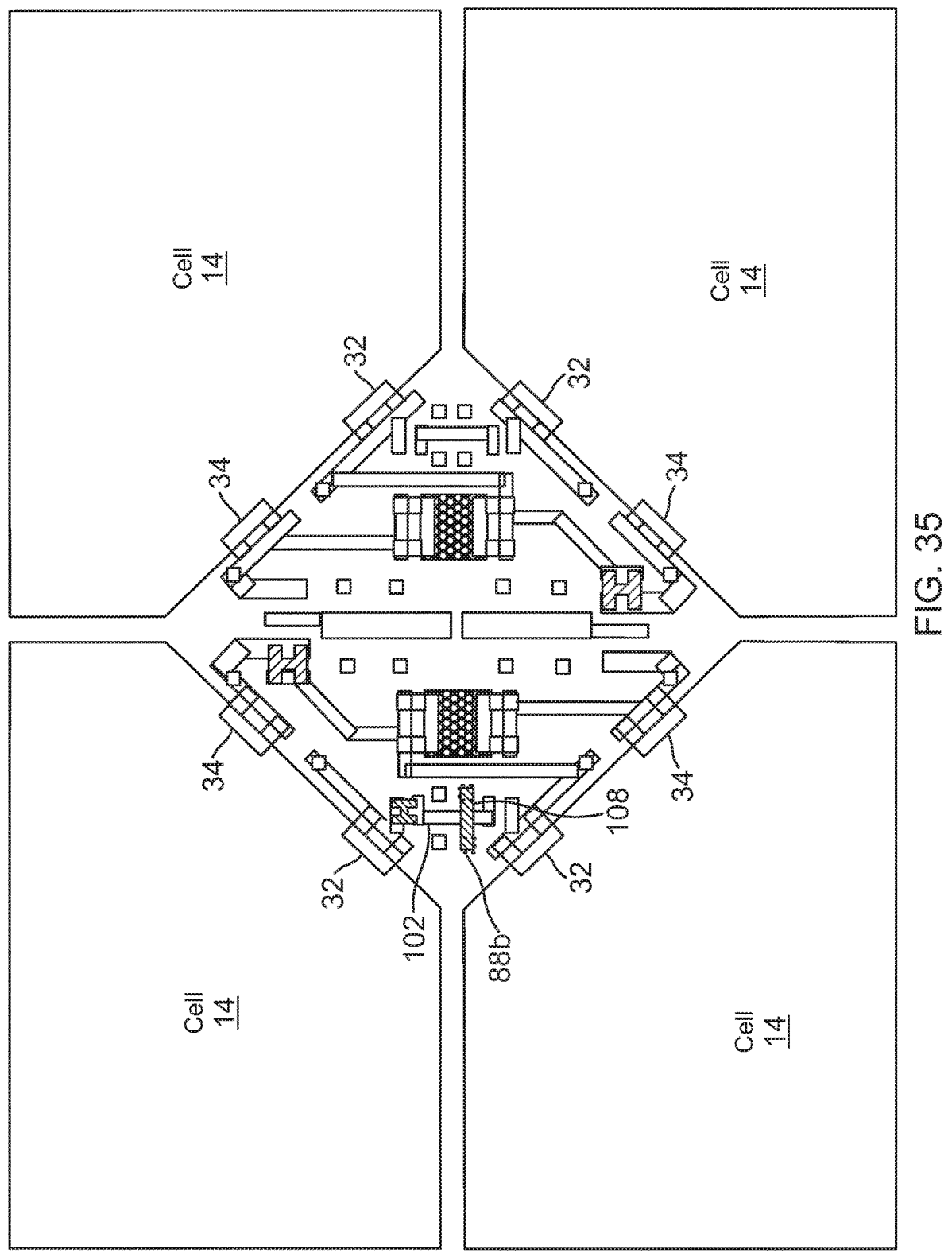

FIG. 35 shows the front contact of the cell on the top left of the figure connected to the left side power distribution bar, according to one example.

Figures 30, 31, 32, 36:
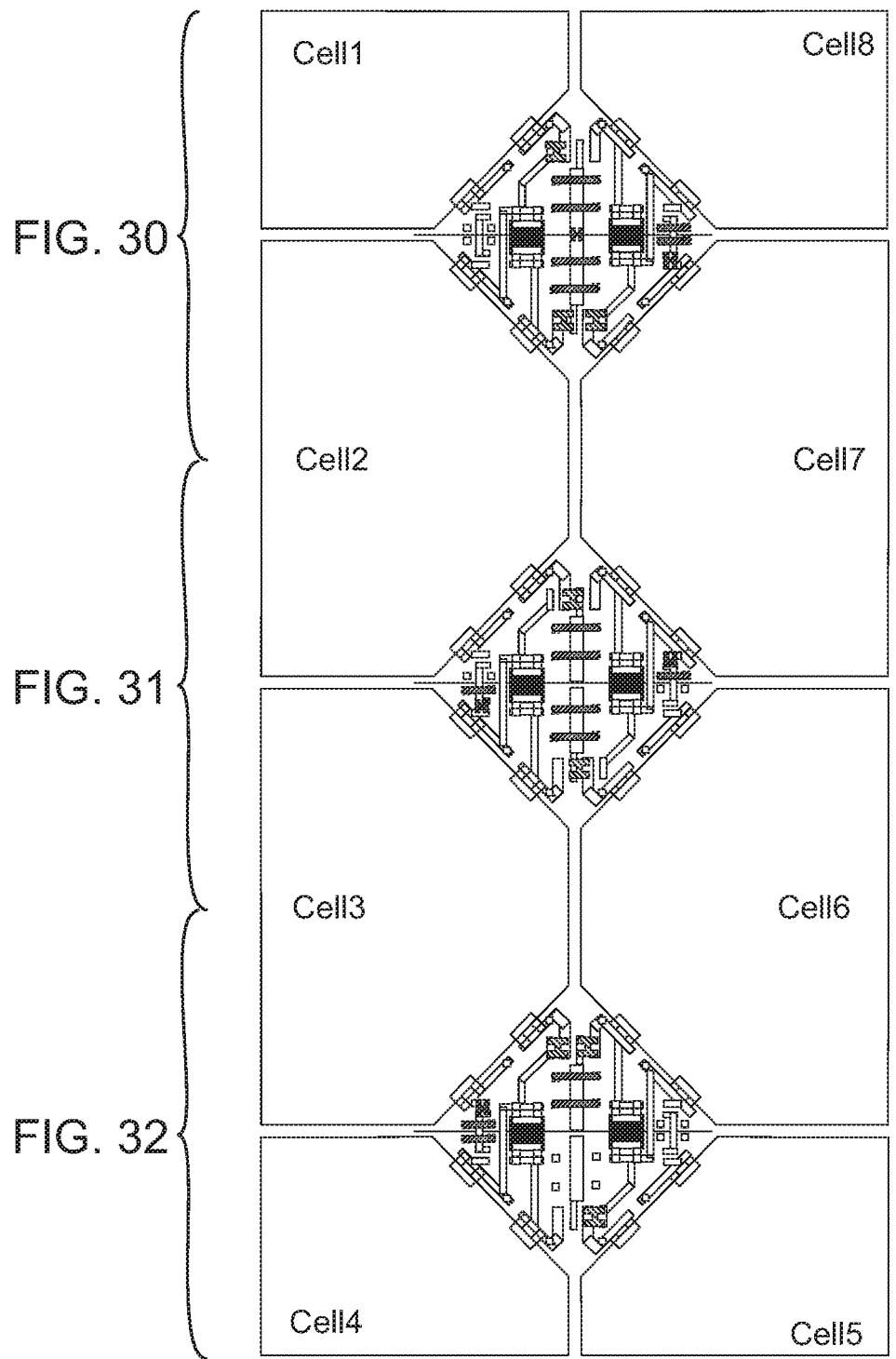

FIG. 36 combines and references FIGS. 30, 31 and 32, according to one example.

Figure 37:
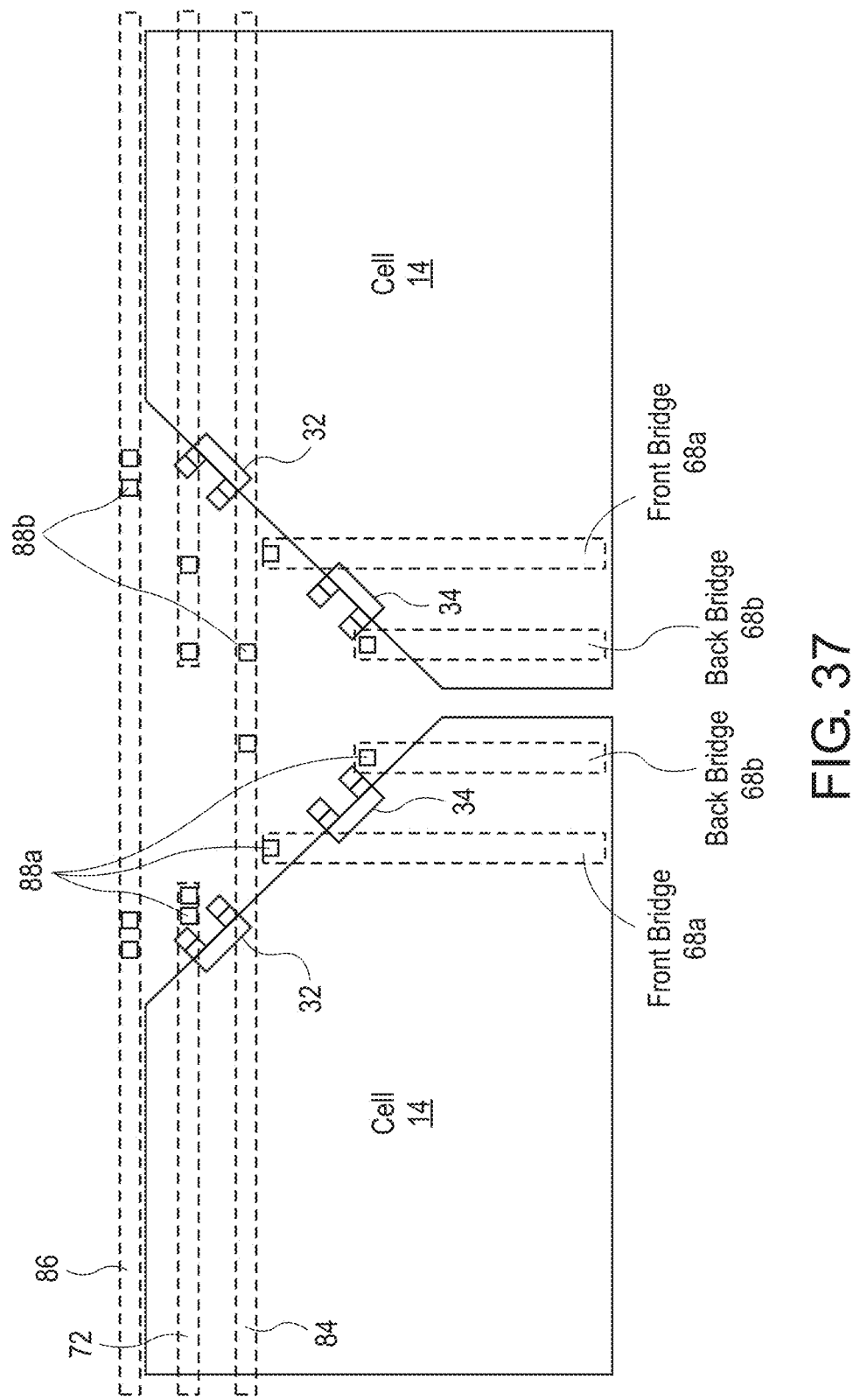

FIG. 37 shows the conductors, power lines and common lines at the end of a column of solar cells, according to one example.

Figure 38:
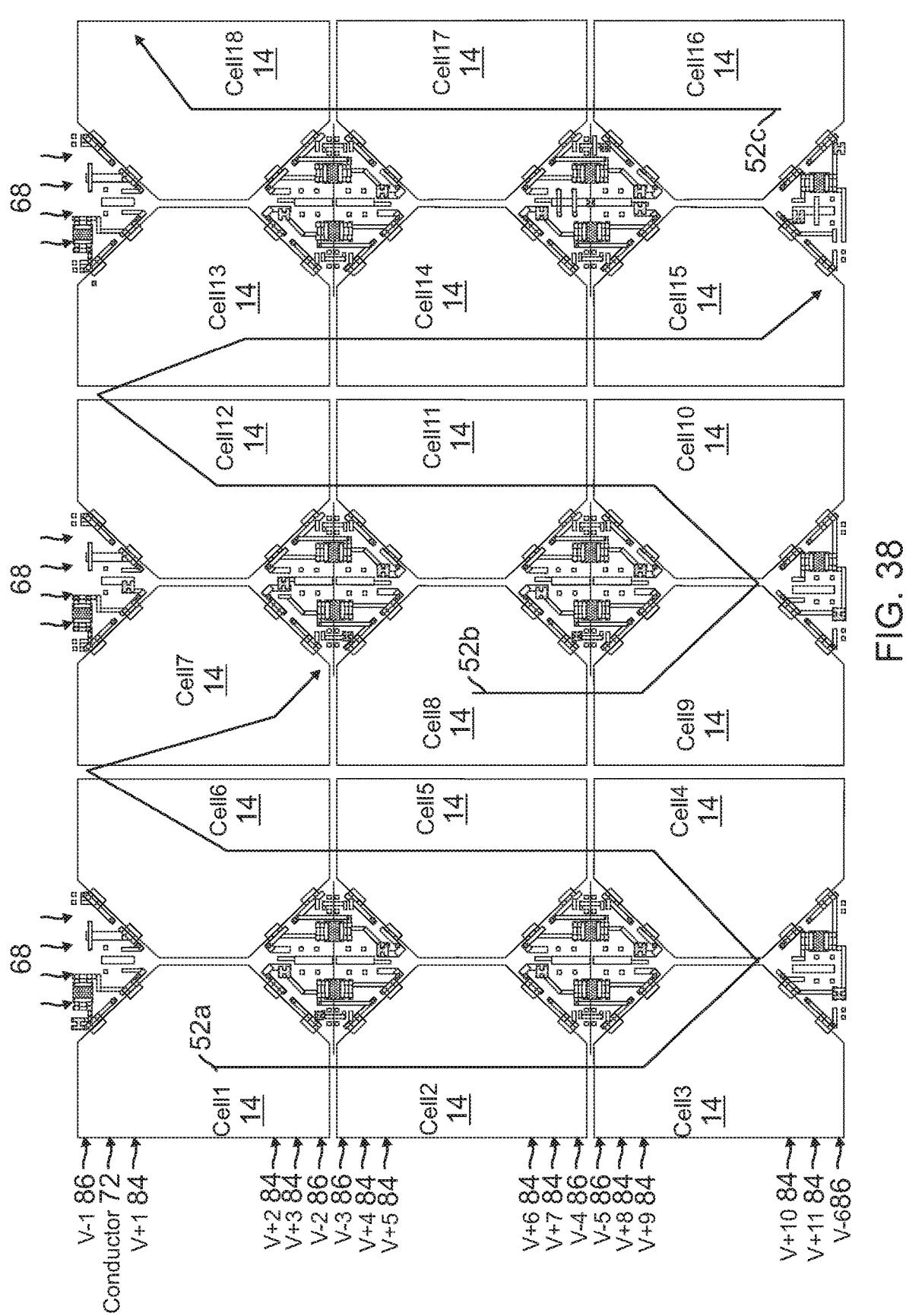

FIG. 38 shows a variation comprising array of solar cells arranged as three (3) rows by six (6) columns.

Figure 39:
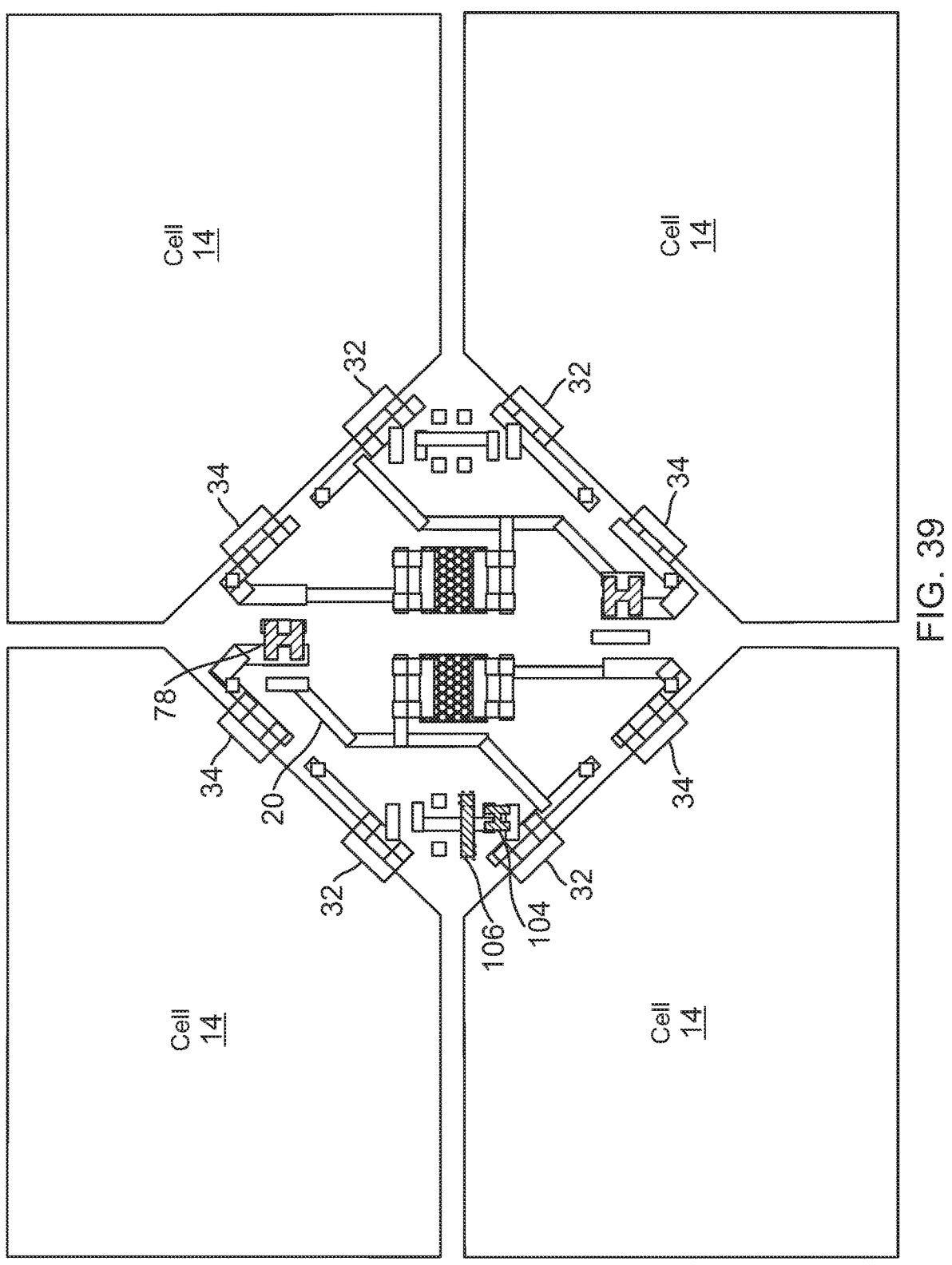

FIG. 39 shows the connections made to match that of FIG. 33, but with fewer interconnections.

Figure 40:
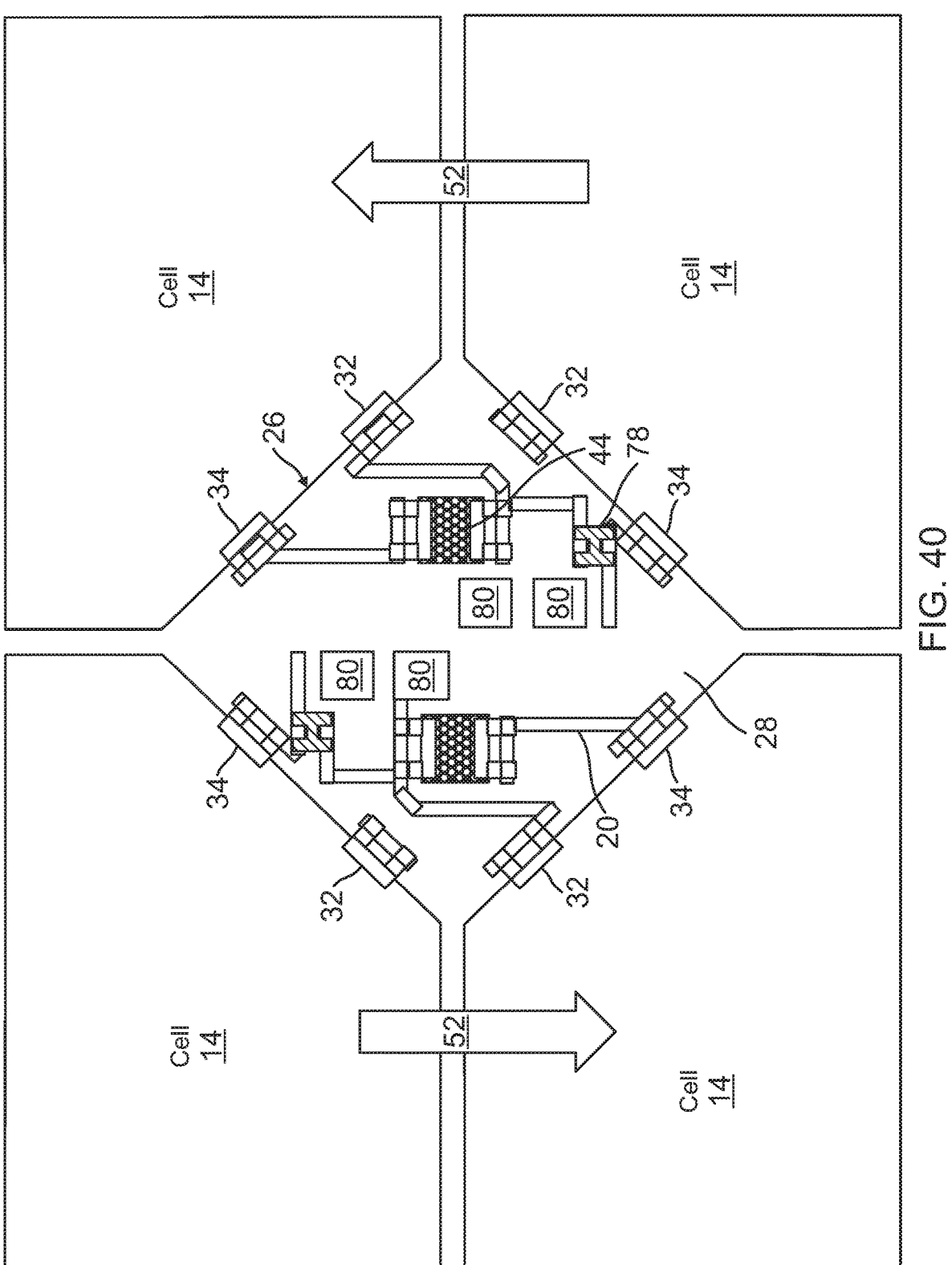

FIG. 40 illustrates a connection scheme between a plurality of solar cells, according to one example.

Figure 41:
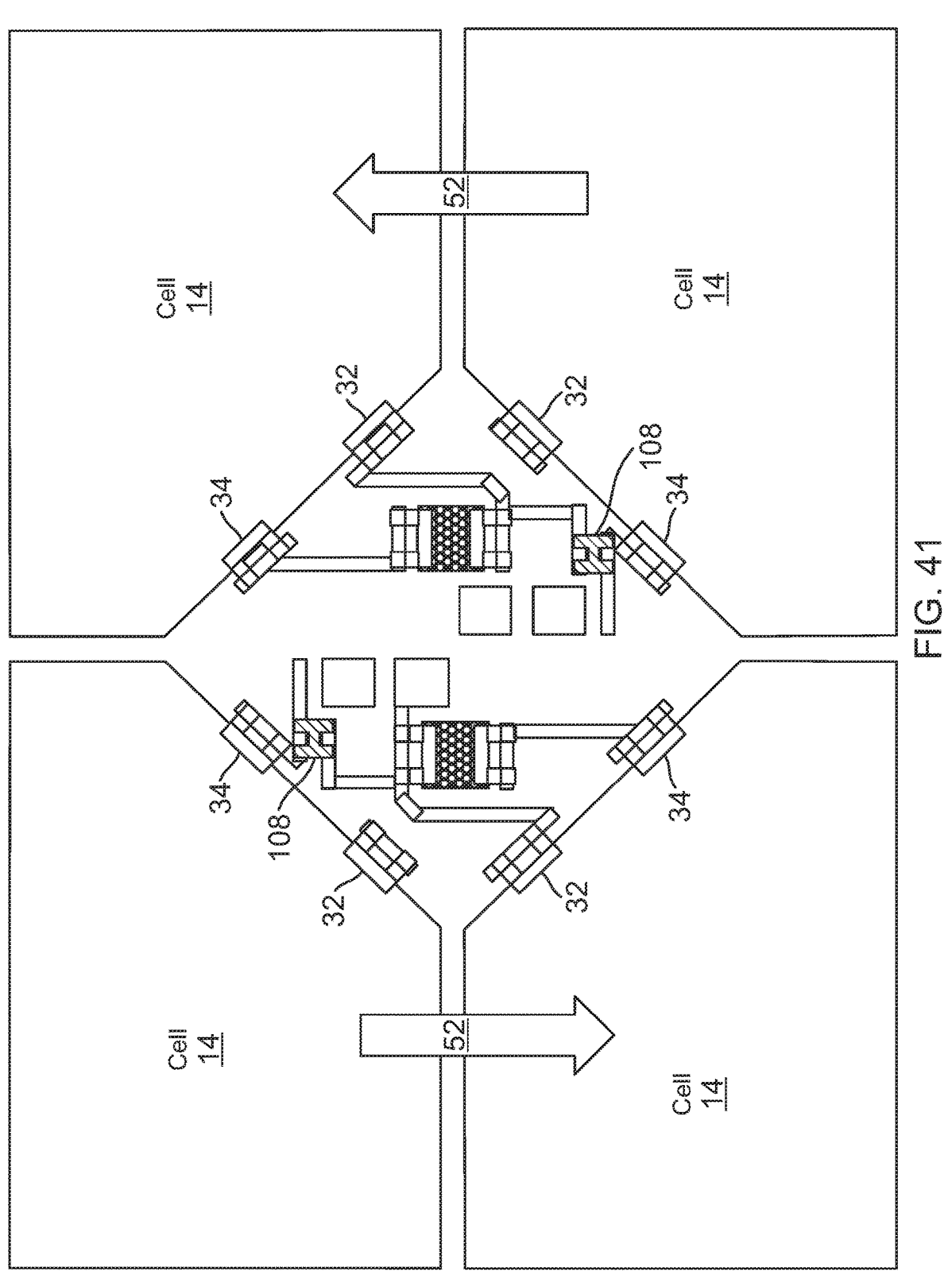

FIG. 41 shows how the jumper could be replaced with a printed conductor of similar shape, according to one example.

Figure 42:
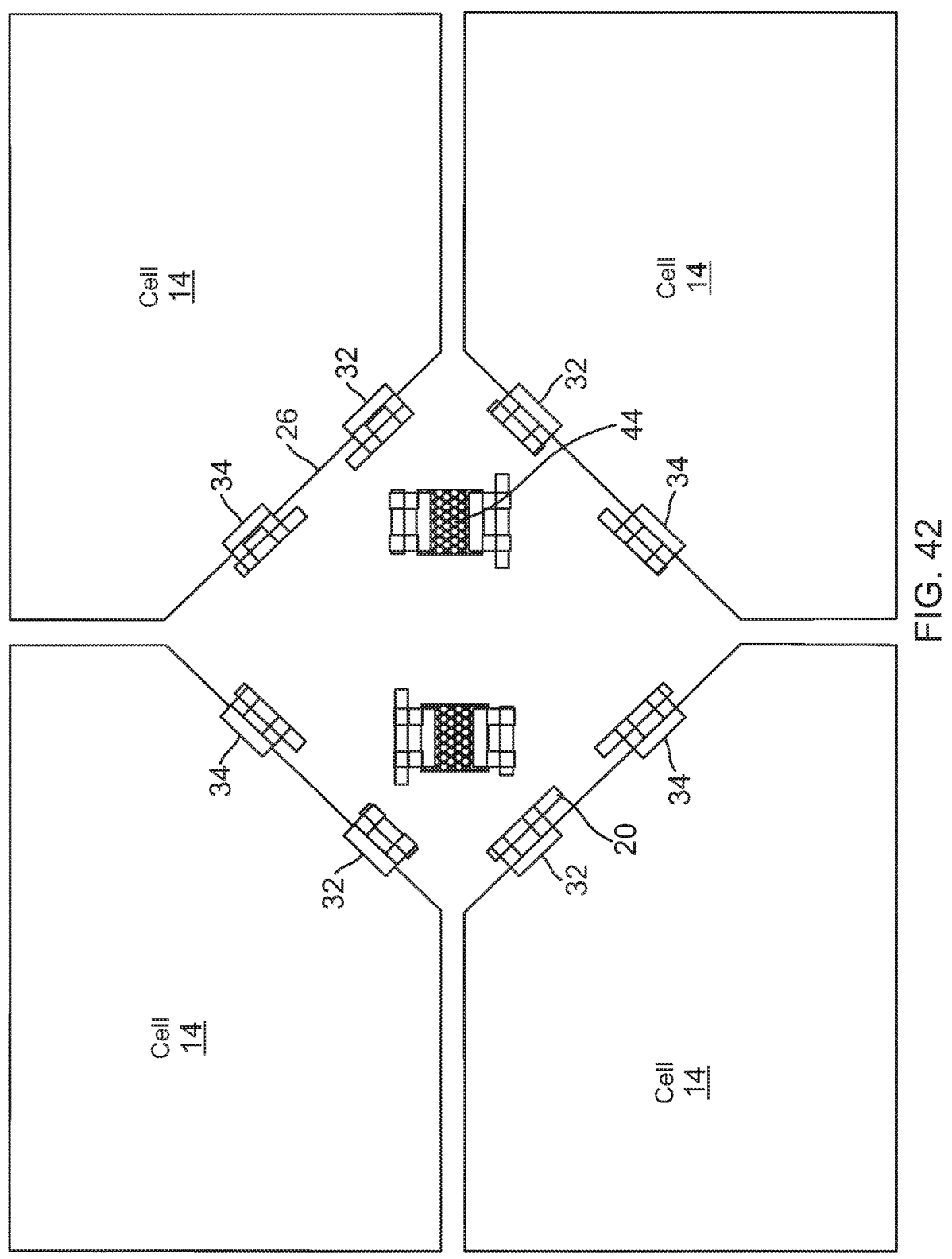

FIG. 42 shows the corner regions having corner conductors that are printed on the exposed area of the substrate before the solar cells and bypass diodes are applied to the substrate, according to one example.

Figure 43A:
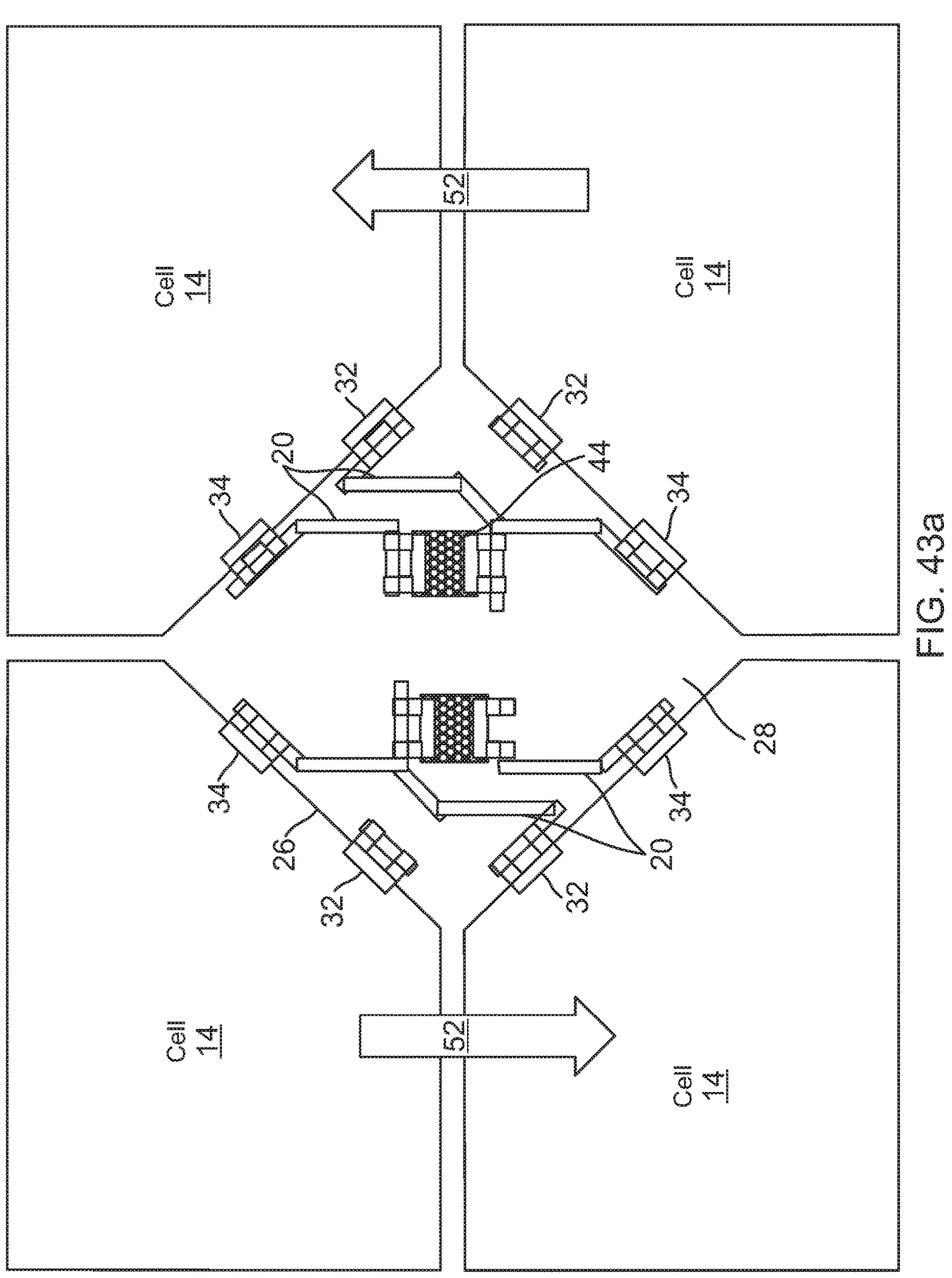
Figure 43B:
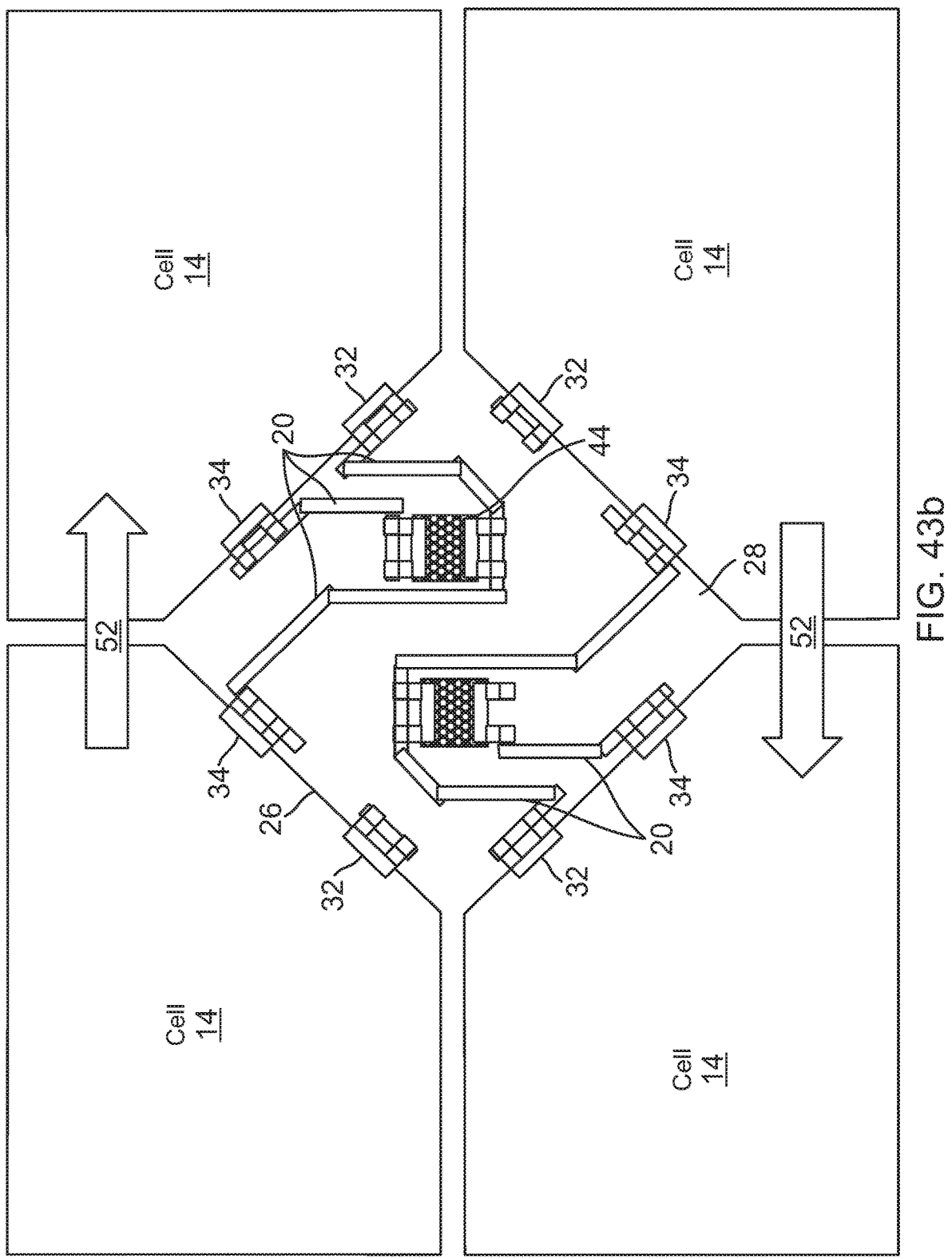

FIGS. 43A and 43B show the corner regions having corner conductors that are printed on the exposed area of the substrate, according to one example.

Figure 44:
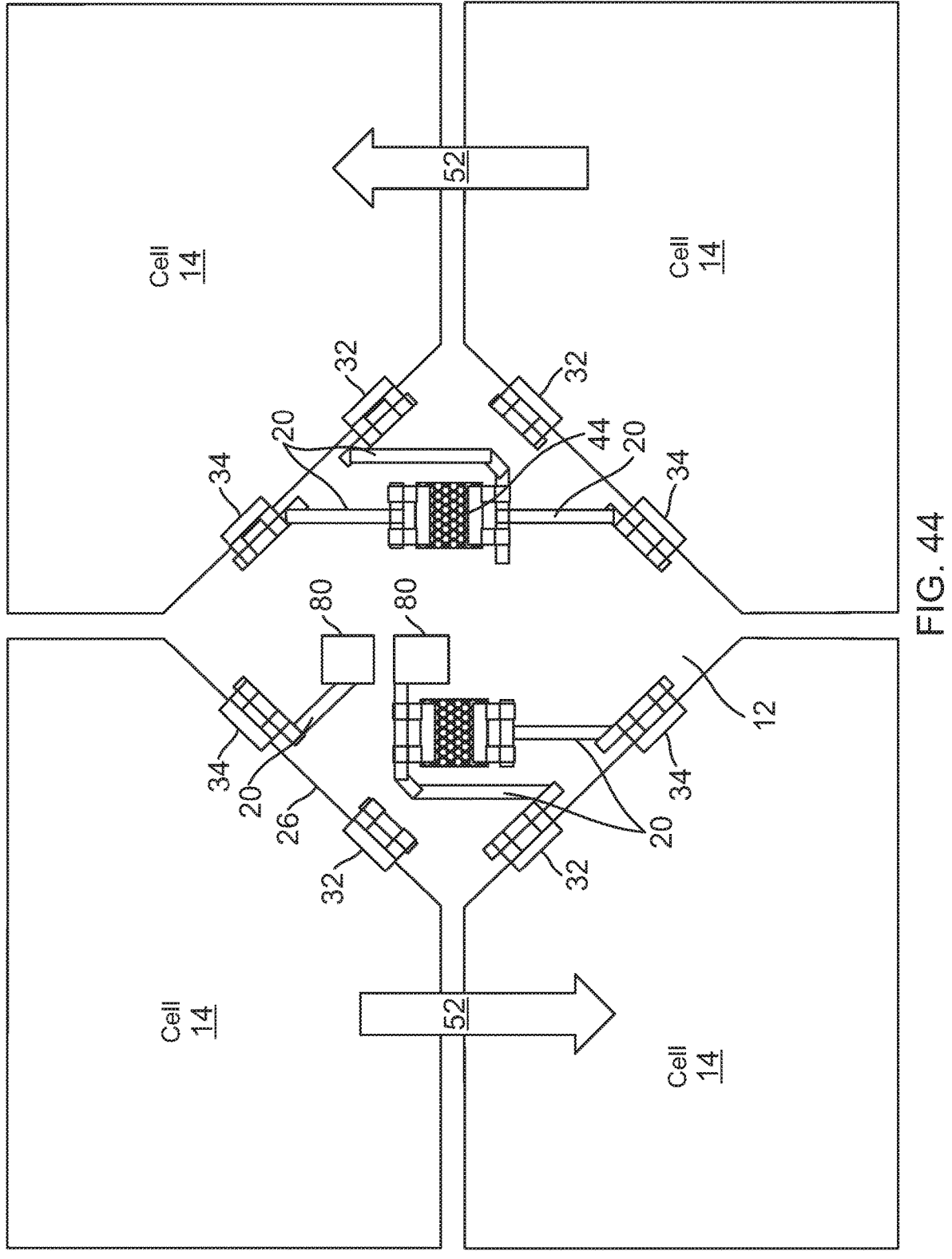

FIG. 44 shows another configuration of printed corner conductors where the circuits terminate at large pads, according to one example.

Figure 45:
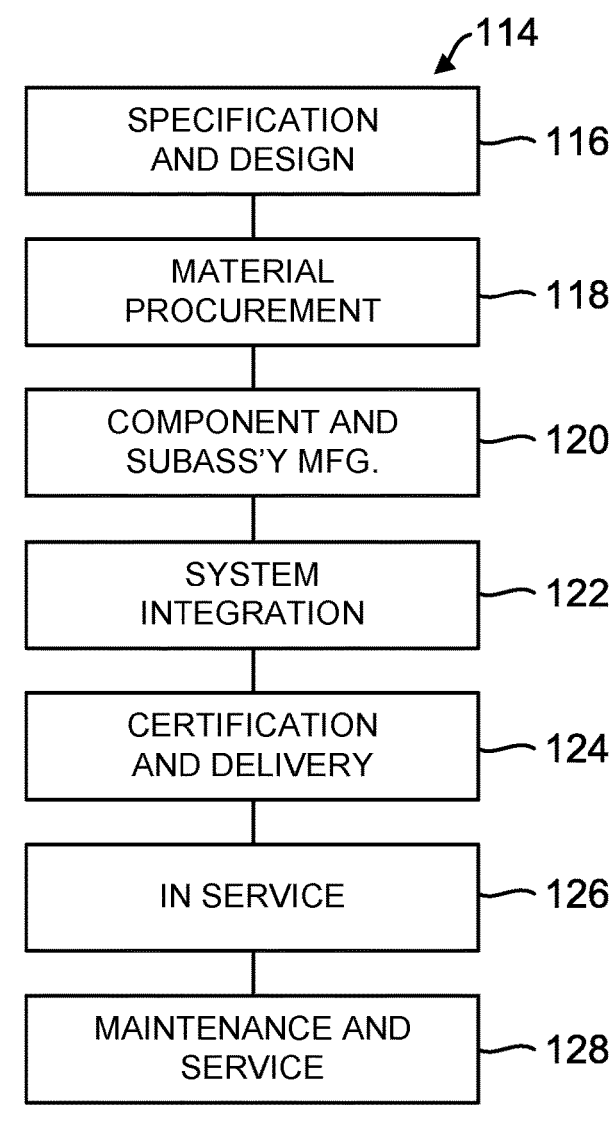

FIG. 45 describes a method of fabricating a solar cell, solar cell panel and/or satellite, according to one example.

Figure 46:
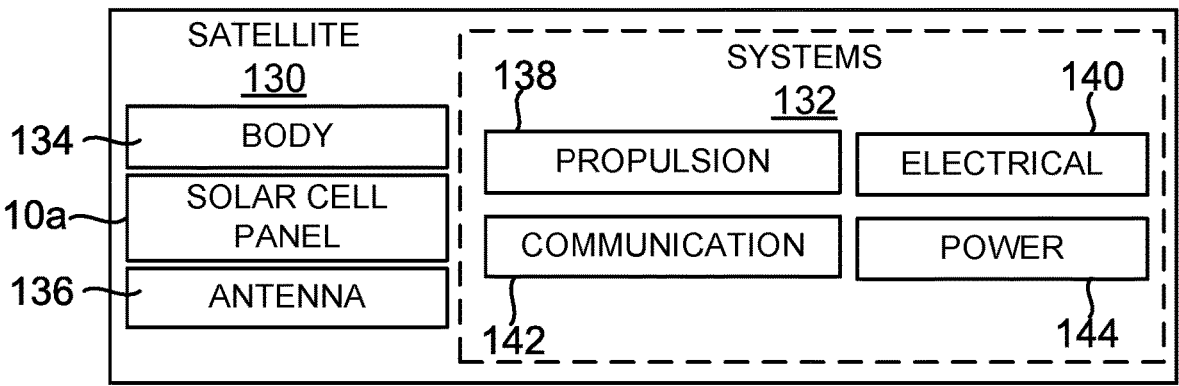

FIG. 46 illustrates a resulting satellite having a solar cell panel comprised of solar cells, according to one example.

Figure 47:
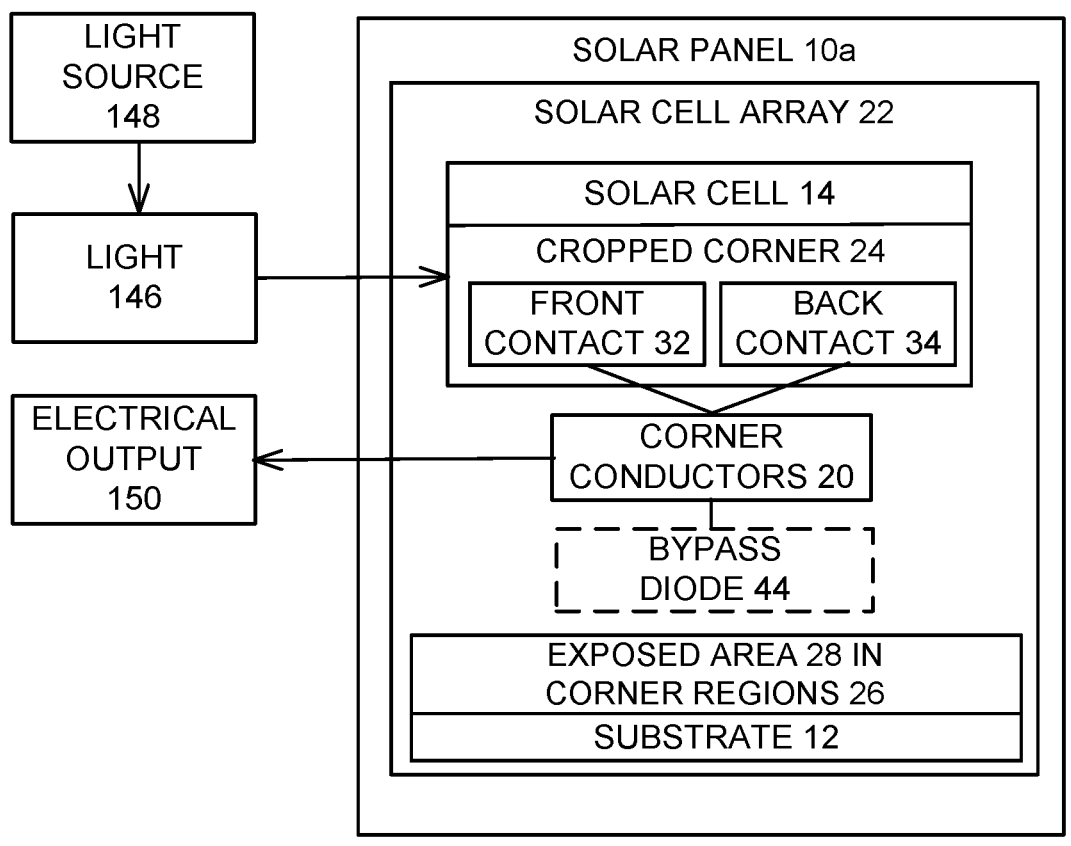

FIG. 47 is an illustration of the solar cell panel in the form of a functional block diagram, according to one example.

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

General Description

A new approach to the design of solar cell arrays, such as those used for spaceflight power applications, is based on electrical connections among the solar cells in the array.

This new approach rearranges the components of a solar cell and the arrangements of the solar cells in the array. Instead of having solar cells connected into long linear strings and then assembled onto a substrate, the solar cells are attached individually to a substrate, such that corner regions of adjacent cells are aligned on the substrate, thereby exposing an area of the substrate. Electrical connections between cells are made by corner conductors formed on or in the substrate in these corner regions. Consequently, this approach presents a solar cell array design based on individual cells.

Thus, a single laydown process and layout can be used in the fabrication of solar cell arrays Current flow between solar cells and out termination wiring will be assisted with conductors embedded in the substrate and the possible addition of conducting jumpers. These electrical connections define the specific characteristics of the solar cell array, such as its dimensions, stayout zones, and circuit terminations. This approach simplifies manufacturing, enables automation, and reduces costs and delivery times.

Figure 1:
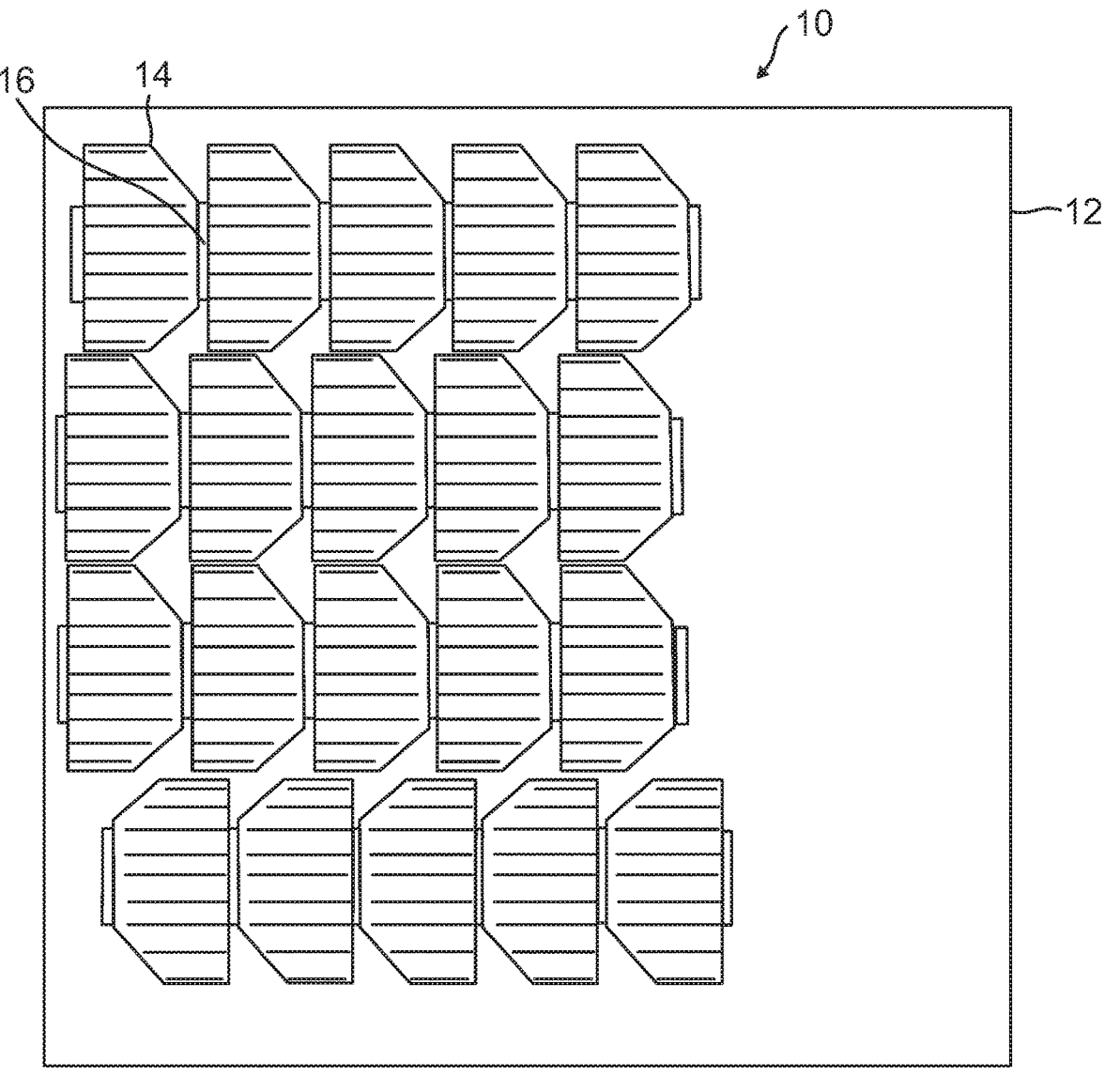
FIGS. 1 and 2 illustrate conventional structures for solar cell panels.
Figure 2:
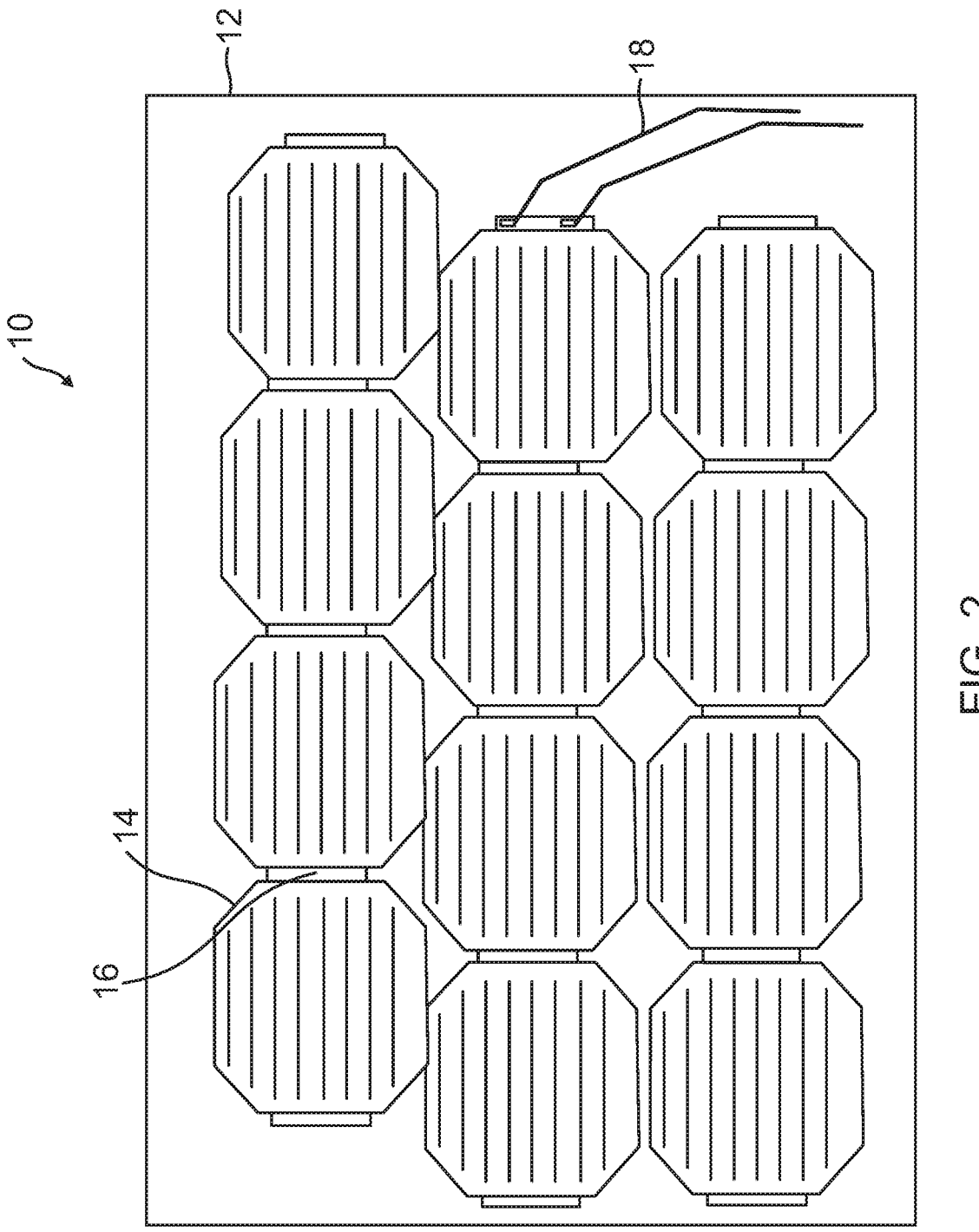

FIGS. 1 and 2 illustrate conventional structures for solar cell panels 10, which include a substrate 12, a plurality of solar cells 14 arranged in an array, and electrical connectors 16 between the solar cells 14. Half size solar cells 14 are shown in FIG. 1 and full size solar cells 14 are shown in FIG. 2. Space solar cells 14 are derived from a round Germanium (Ge) substrate starting material, which is later fabricated into semi-rectangular shapes to improve dense packing onto a solar panel 10. This wafer is often diced into one or two solar cells 14 herein described as half size or full size solar cells 14. The electrical connectors 16 providing electrical connections between solar cells 14 are made along the long parallel edge between solar cells 14. These series connections (cell-to-cell) are completed off-substrate, as strings of connected solar cells 14 are built having lengths of any number of solar cells 14. The completed strings of solar cells 14 are then applied and attached to the substrate 12.

In FIG. 2, wiring 18 is attached at the end of a string of solar cells 14 to electrically connect the string to other strings, or to terminate the resulting circuit and bring the current off of the array of solar cells 14. String-to-string and circuit termination connections are typically done on the substrate 12, and typically using wiring 18. However, some solar cell panels 10 use a printed circuit board (PCB)-type material with embedded conductors.

Adjacent strings of connected solar cells 14 can run parallel or anti-parallel. In addition, strings of connected solar cells 14 can be aligned or misaligned. There are many competing influences to the solar cell 14 layout resulting in regions where solar cells 14 are parallel or anti-parallel, aligned or misaligned.

Figures 3A, 3B:
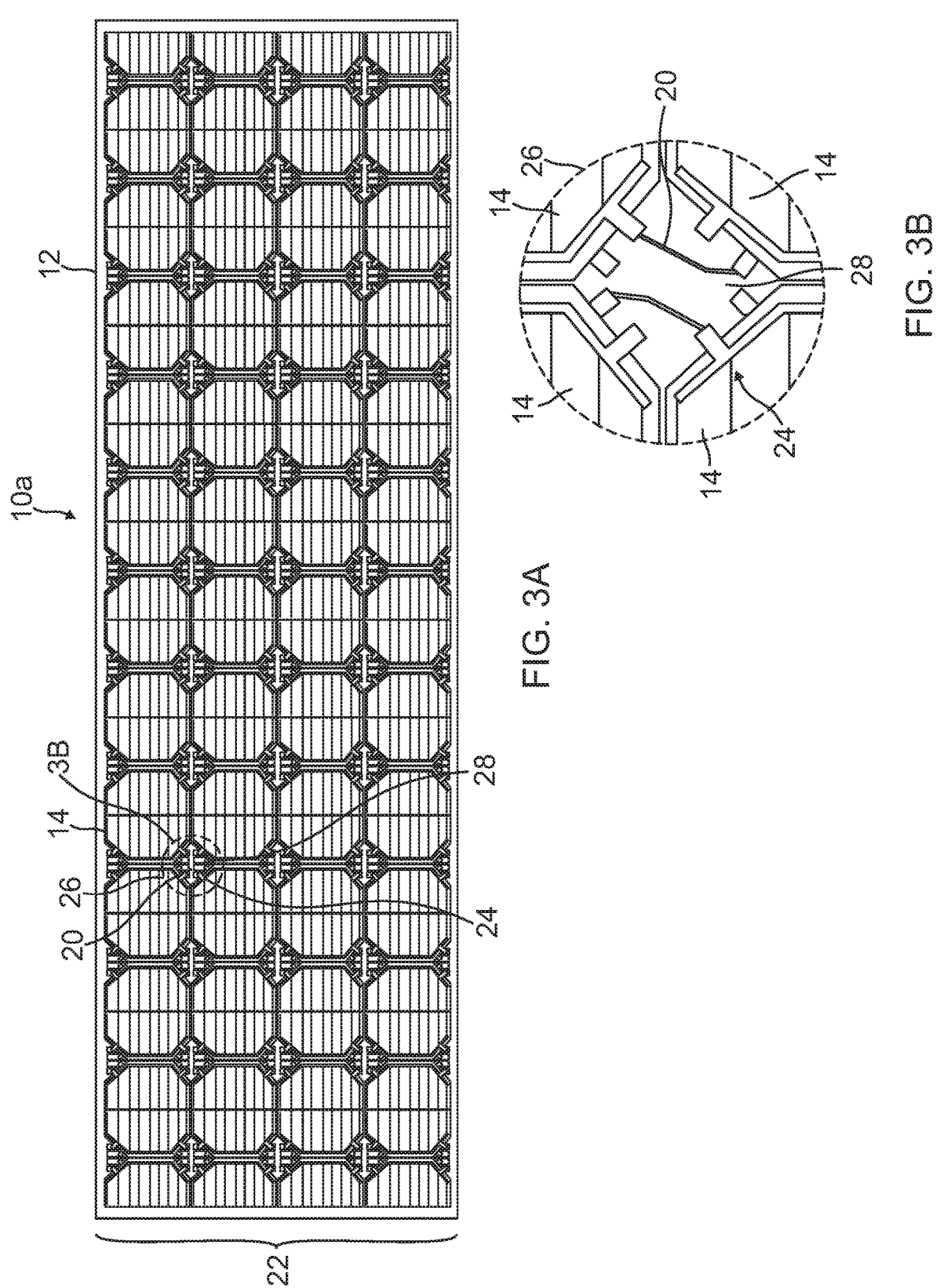
FIGS. 3A and 3B illustrate an improved structure for a solar cell panel, according to one example.

FIGS. 3A-3B illustrate an improved structure for a solar cell panel 10a, according to one example, wherein FIG. 3B is an enlarged view of the details in the dashed circle in FIG. 3A. The various components of the solar cell panel 10a are shown and described in greater detail in FIGS. 5-13.

The solar cell panel 10a includes a substrate 12 for solar cells 14 having one or more corner conductors 20 thereon. In one example, the substrate 12 is a multi-layer substrate 12 comprised of one or more Kapton® (polyimide) layers separating one or more patterned metal layers. The substrate 12 may be mounted on a large rigid panel 10a similar to conventional assembles. Alternatively, the substrate 12 can be mounted to a lighter more sparse frame or panel 10a for mounting or deployment.

A plurality of solar cells 14 are attached to the substrate 12 in a two-dimensional (2-D) grid of an array 22. In this example, the array 22 is comprised of ninety-six (96) solar cells 14 arranged in four (4) rows by twenty-four (24) columns, but it is recognized that any number of solar cells 14 may be used in different implementations.

The solar cells 14 have cropped corners 24 that define corner regions 26, as indicated by the dashed circle. The substrate 12 is configured such that, when corner regions 26 of adjacent ones of the solar cells 14 are aligned, an area 28 of the substrate 12 remains exposed when at least one of the solar cells 14 having at least one cropped corner 24 is attached to the substrate 12. The area 28 of the substrate 12 that remains exposed includes one or more of the corner conductors 20, and one or more electrical connections between the solar cells 14 and the corner conductors 20 are made in the corner regions 26 resulting from the cropped corners 24 of the solar cells 14.

In this example, the corner conductors 20 are conductive paths attached to, printed on, buried in, or deposited on the substrate 12, before and/or after the solar cells 14 are attached to the substrate 12, which facilitate connections between adjacent solar cells 14. The connections between the solar cells 14 and the corner conductors 20 are made after the solar cells 14 have been attached to the substrate 12.

In one example, four adjacent solar cells 14 are aligned on the substrate 12, such that four cropped corners 24, one from each solar cell 14, are brought together at the corner regions 26. The solar cells 14 are then individually attached to the substrate 12, wherein the solar cells are placed on top of the corner conductors 20 to make the electrical connection between the solar cells 14 and the corner conductors 20.

The solar cells 14 may be applied to the substrate 12 as CIC (cell, interconnect and coverglass) units. Alternatively, bare solar cells 14 may be assembled on the substrate 12, and then interconnects applied to the solar cells 14, followed by the application of a single solar cell 14 coverglass, multiple solar cell 14 coverglass, multiple solar cell 14 polymer coversheet, or spray encapsulation. This assembly protects the solar cells 14 from damage that would limit performance.

Figures 4A, 4B:
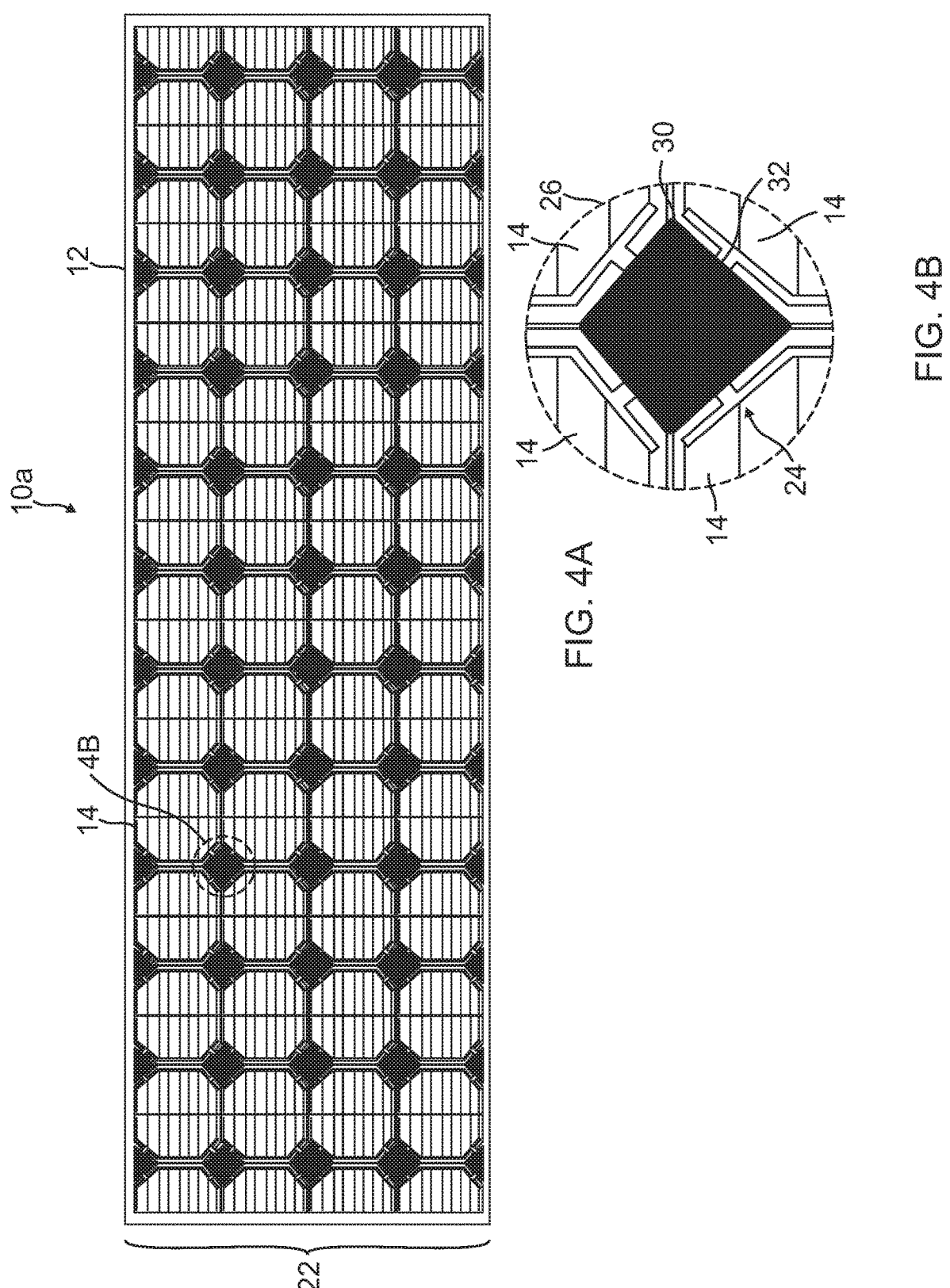
FIGS. 4A and 4B illustrate an alternative structure for the solar cell panel, according to one example.

FIGS. 4A and 4B illustrate an alternative structure for the solar cell panel 10a, according to one example, wherein FIG. 4B is an enlarged view of the details in the dashed circle in FIG. 4A. In this example, only a few corner conductors 20 are printed on or integrated with the substrate 12. Instead, most of the corner conductors 20 are contained within a power routing module (PRM) 30 that is attached to the substrate 12.

Figure 5:
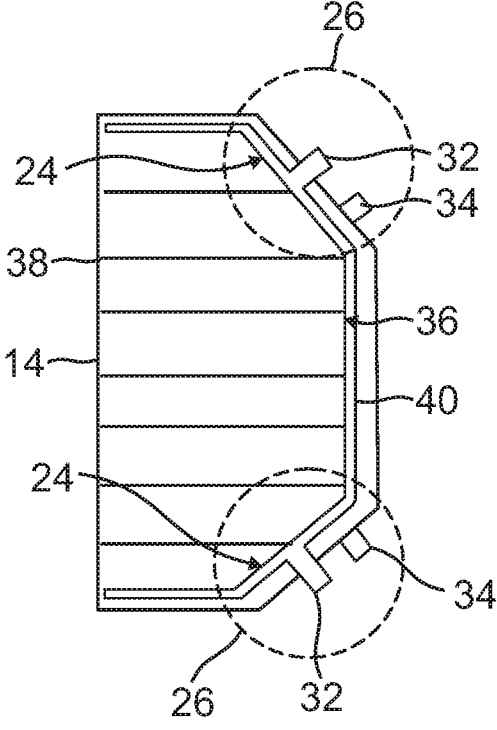
FIG. 5 illustrates the front side of an exemplary solar cell that may be used in the improved solar cell panel of FIGS. 3A-B and 4A-B.

FIG. 5 illustrates the front side of an exemplary solar cell 14 that may be used in the improved solar cell panel 10a of FIGS. 3A-3B and 4A-4B. The solar cell 14, which is a CIC unit, is a half-size solar cell 14. (Full-size solar cells 14 could also be used.)

The solar cell 14 is fabricated having at least one cropped corner 24 that defines a corner region 26, as indicated by the dashed circle, such that the corner region 26 resulting from the cropped corner 24 includes at least one contact 32, 34 for making an electrical connection to the solar cell 14. In the example of FIG. 5, the solar cell 14 has two cropped corners 24, each of which has both a front contact 32 on the front side of the solar cell 14 and a back contact 34 on a back side of the solar cell 14, where the contacts 32 and 34 extend into the corner region 26. (Full-size solar cells 14 would have four cropped corners 24, each of which would have a front contact 32 and a back contact 34.)

The cropped corners 24 increase utilization of the round wafer starting materials for the solar cells 14. In conventional panels 10, these cropped corners 24 would result in unused space on the panel 10 after the solar cells 14 are attached to the substrate 12. The new approach described in this disclosure, however, utilizes this unused space. Specifically, metal foil interconnects, comprising the corner conductors 20, front contacts 32 and back contacts 34, are moved to the corner regions 26. In contrast, existing CICs have interconnects attached to the solar cell 14 front side, and connect to the back side (where connections occur) during stringing.

The current generated by the solar cell 14 is collected on the front side of the solar cell 14 by a grid 36 of thin metal fingers 38 and wider metal bus bars 40 that are connected to both of the front contacts 32. There is a balance between the addition of metal in grid 36, which reduces the light entering the solar cell 14 and its output power, and the reduced resistance of having more metal. The bus bar 40 is a low resistance conductor that carries high currents and also provides redundancy should a front contact 32 become disconnected. Optimization generally desires a short bus bar 40 running directly between the front contacts 32. Having the front contact 32 in the cropped corner 24 results in moving the bus bar 40 away from the perimeter of the solar cell 14. This is achieved while simultaneously minimizing the bus bar 40 length and light obscuration. Additionally, the finger 38 length is now shorter. This reduced parasitic resistances in the grid 36 because the length of the fingers 38 is shorter and the total current carried is less. This produces a design preference where the front contacts 32 and connecting bus bar 40 are moved to provide shorter fingers 38.

Figure 6:
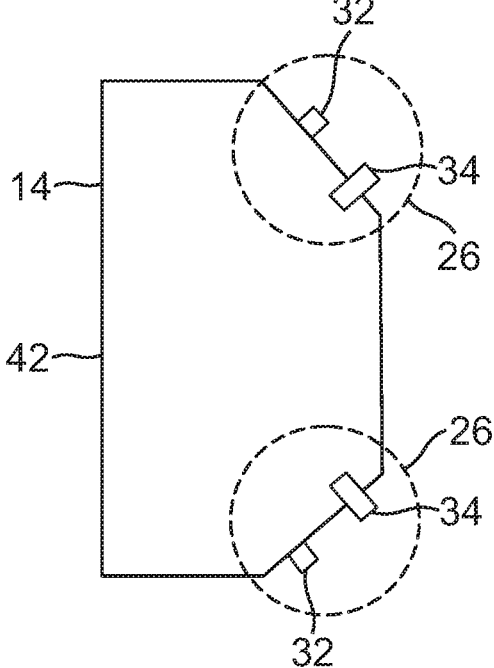
FIG. 6 illustrates the back side of the exemplary solar cell of FIG. 5.

FIG. 6 illustrates the back side of the exemplary solar cell 14 of FIG. 5. The back side of the solar cell 14 has a metal back layer 42 that is connected to both of the back contacts 34.

Figure 7:
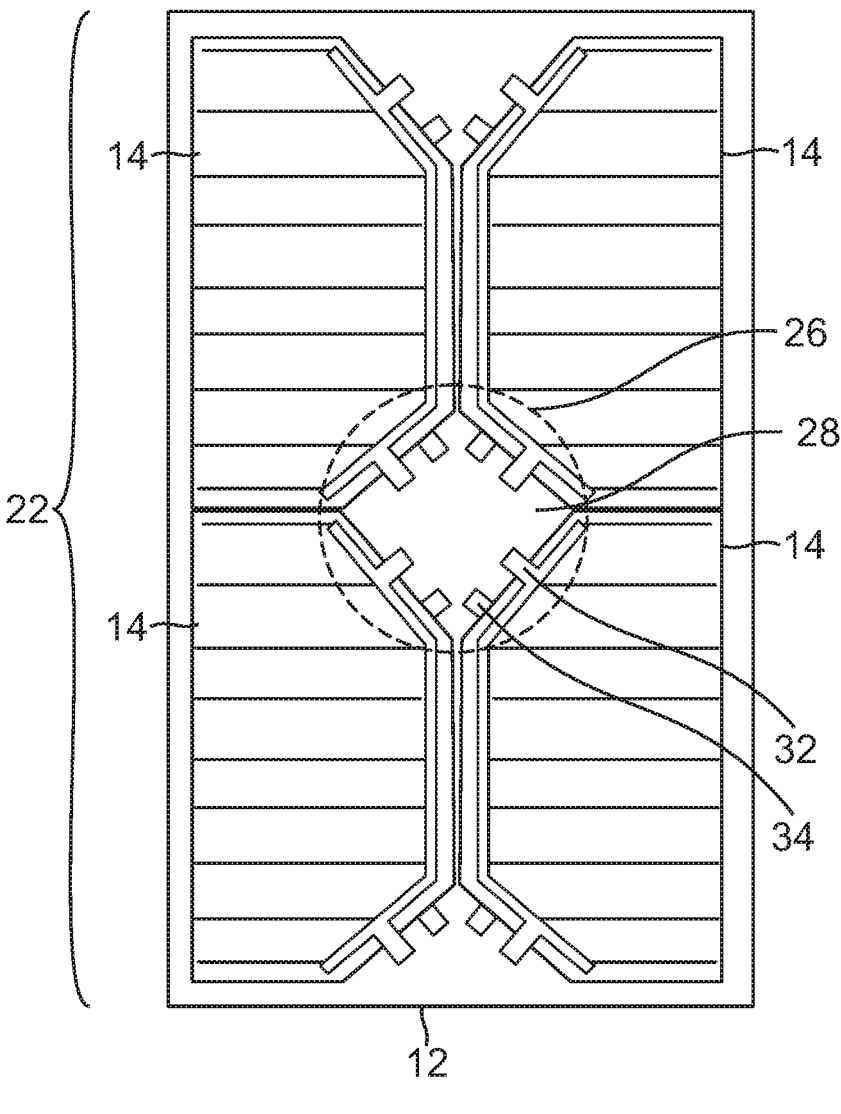
FIG. 7 illustrates cells arranged into the 2D grid of the array, according to one example.

FIG. 7 illustrates solar cells 14 arranged into the 2D grid of the array 22, according to one example. The array 22 comprises a plurality of solar cells 14 attached to a substrate 12, such that corner regions 26 of adjacent ones of the solar cells 14 are aligned, thereby exposing an area 28 of the substrate 12. Electrical connections (not shown) between the solar cells 14 are made in the exposed area 28 of the substrate 12 using the front contacts 32 and back contacts 34 of the solar cells 14 and corner conductors 20 (not shown) formed on or in the exposed area 28 of the substrate 12.

During assembly, the solar cells 14 are individually attached to the substrate 12. This assembly can be done directly on a support surface, i.e., the substrate 12, which can be either rigid or flexible. Alternatively, the solar cells 14 could be assembled into the 2D grid of the array 22 on a temporary support surface and then transferred to a final support surface, i.e., the substrate 12.

Figure 8:
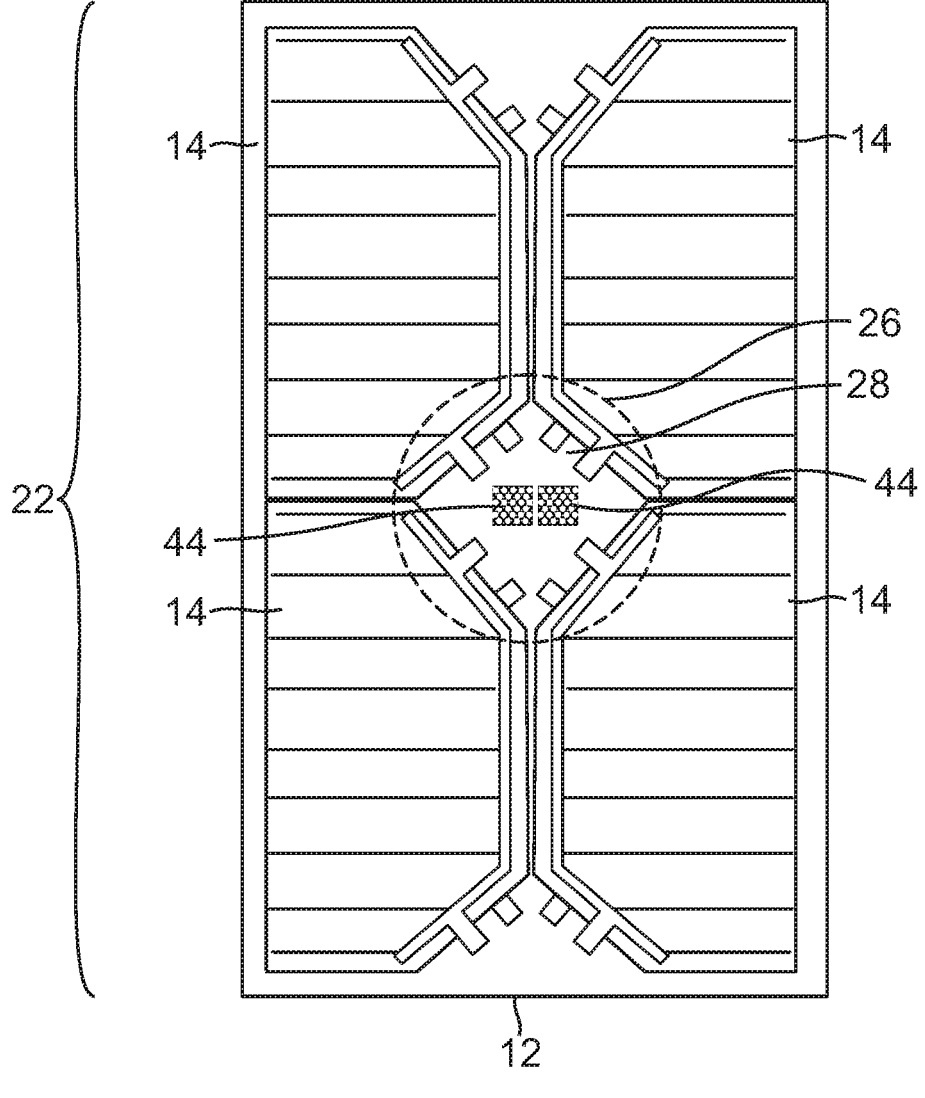
FIG. 8 illustrates an example of the array where one or more bypass diodes are added to the exposed area of the substrate in the corner regions.

FIG. 8 illustrates an example of the array 22 where one or more bypass diodes 44 are added to the exposed area 28 of the substrate 12 in the corner regions 26, for use in one or more of the electrical connections. The bypass diodes 44 protect the solar cells 14 when the solar cells 14 become unable to generate current, which could be due to being partially shadowed, which drives the solar cells 14 into reverse bias. In one example, the bypass diodes 44 are attached to the substrate 12 in the corner regions 26 independent of the solar cells 14.

Figure 9:
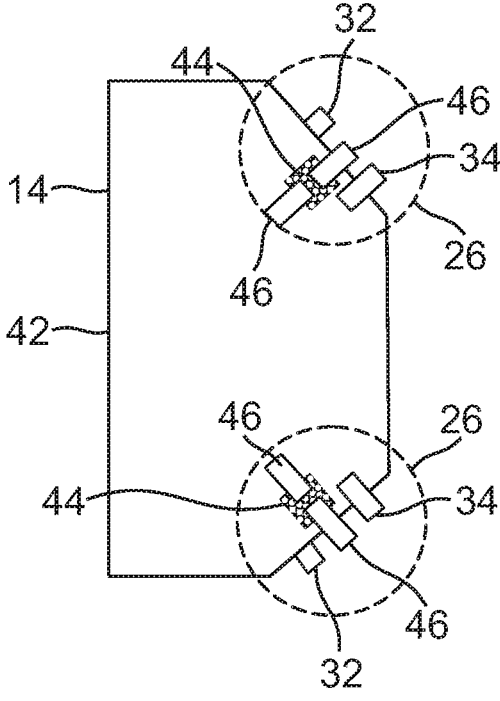
FIG. 9 illustrates an example where the bypass diode is applied to the back side of the cell, with an interconnect or contact for the bypass diode extending into the corner region between front and back contacts.

FIG. 9 illustrates an example where the bypass diode 44 is applied to the back side of the solar cell 14, with interconnects or contacts 46 for the bypass diode 44 connected to the back layer 42 and also extending into the corner region 26 between the front and back contacts 32, 34.

Figure 10:
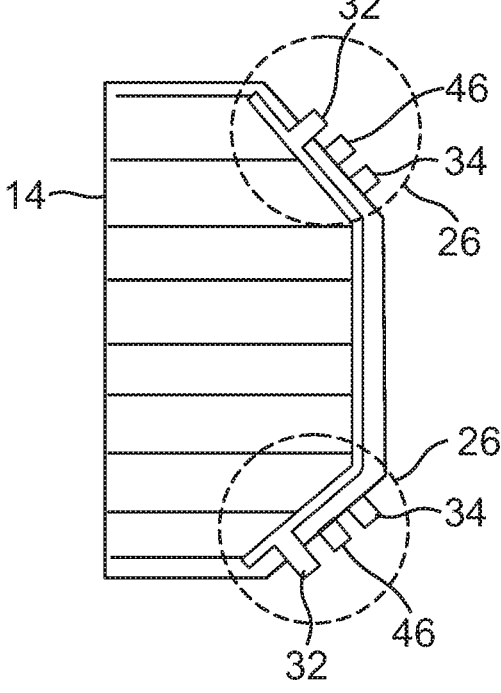
FIG. 10 illustrates a front side view of the example of FIG. 9, with the interconnect or contact for the bypass diode extending into the corner region between the front and back contacts.

FIG. 10 illustrates a front side view of the example of FIG. 9, with the interconnect or contact 46 for the bypass diode 44 (not shown) extending into the corner region 26 between the front and back contacts 32, 34.

Figure 11:
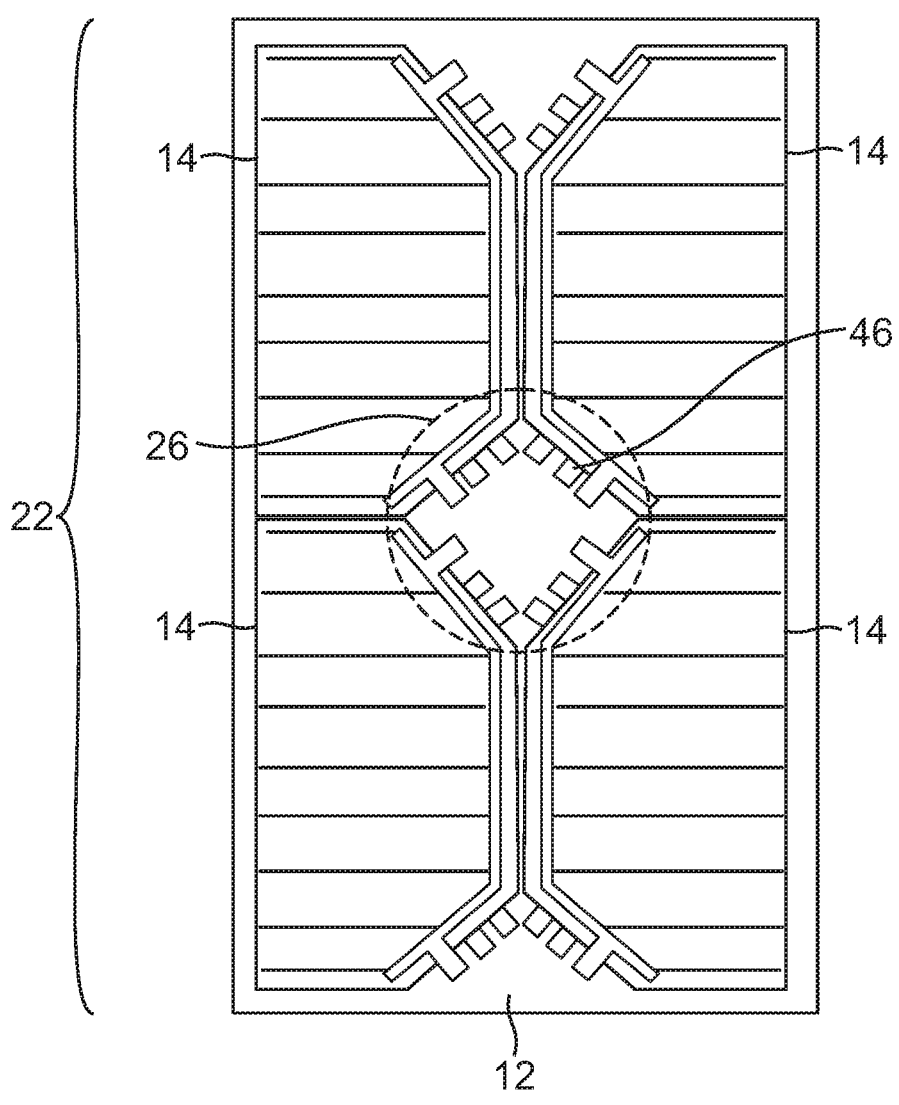
FIG. 11 illustrates the cells of FIGS. 9 and 10 arranged into the 2D grid of the array and applied to the substrate, where the bypass diodes are applied to the back side of the cells, with the contacts for the bypass diodes extending into the corner regions of the cells.

FIG. 11 illustrates the solar cells 14 of FIGS. 9 and 10 arranged into the 2D grid of the array 22 and applied to the substrate 12, where the bypass diodes 44 (not shown) are applied to the back side of the solar cells 14, with the contacts 46 for the bypass diodes 44 extending into the corner regions 26 of the solar cells 14.

One advantage of this approach is that the layouts illustrated in FIGS. 7, 8 and 11 are generalized layouts. Specifically, these layouts can be repeated across any panel 10*a* dimensions desired by a customer. This greatly simplifies assembly, rework, test, and inspection processes.

Following solar cell 14 and bypass diode 44 placement, there is another step where customization is accomplished. The front contacts 32 and back contacts 34 in the corner regions 26 of the solar cells 14 must be connected. This can be done in many combinations in order to route current through a desired path.

After attaching solar cells 14 to the substrate 12, connections are made between the solar cells 14 and the corner conductors 20. Front and back contacts 32, 34 of the solar cells 14 are present in each corner region 26 for attachment to the corner conductors 20. Interconnects for the front and back contacts 32, 34 of each of the solar cells 14 are welded, soldered, or otherwise bonded onto the corner conductors 20 to provide a conductive path 20, 32, 34 for routing current out of the solar cells 14.

Using the corner conductors 20, any customization can be made in the electrical connections. Adjacent solar cells 14 can be electrically connected to flow current in up/down or left/right directions as desired by the specific design. Current flow can also be routed around stay-out zones as needed. The length or width of the solar cell array 22 can be set as desired. Also, the width can vary over the length of the array 22.

Figure 12:
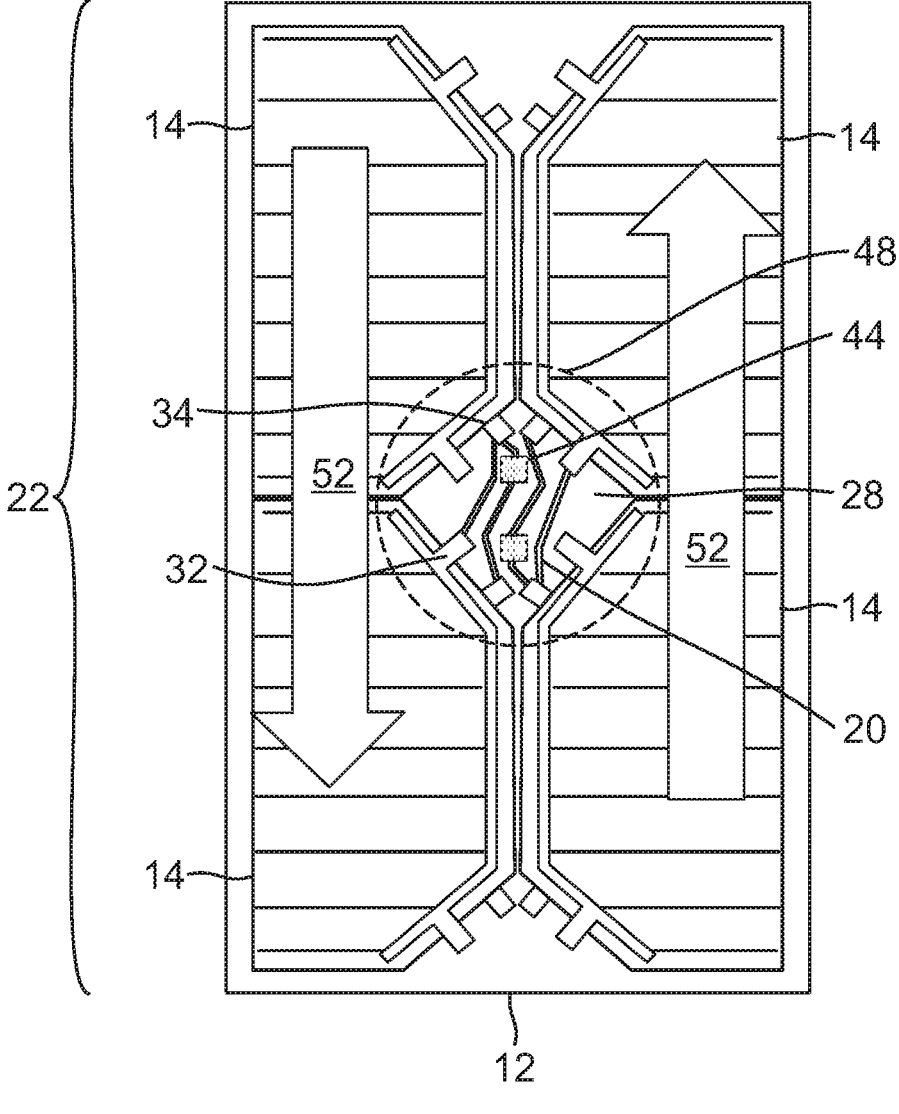
FIG. 12 shows up/down series connections between the cells of the array, according to one example.
Figure 13:
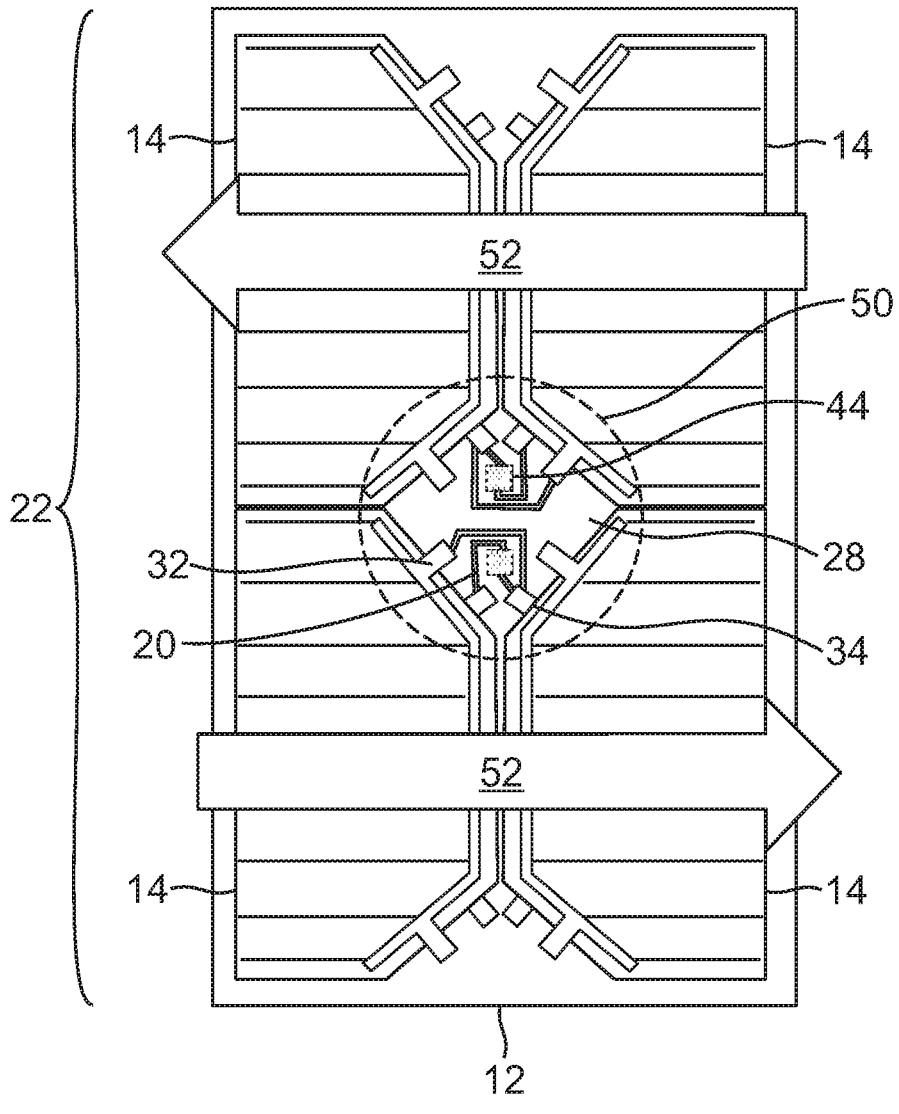
FIG. 13 shows left/right series connections between the cells of the array, according to one example.

In one example, the electrical connections are series connections that determine a flow of current through the plurality of solar cells 14. This may be accomplished by the connection schemes shown in FIGS. 12 and 13, wherein FIG. 12 shows up/down series connections 48 between the solar cells 14 of the array 22, and FIG. 13 shows left/right series connections 50 between the solar cells 14 of the array 22. In both FIGS. 12 and 13, these series connections 48, 50 are electrical connections between the front contacts 32 and back contacts 34 of the solar cells 14, and the bypass diodes 44, are made using the corner conductors 20 formed on or in the exposed areas 28 of the substrate 12. These series connections 48, 50 determine the current (power) flow, as indicated by the arrows 52, through the solar cells 14, in contrast to the assembly of large strings off-substrate.

The corner conductors 20 between solar cells 14 can be in many forms. They could be accomplished using wires that have electrical connections made on both ends, which could be from soldering, welding, conducting adhesive, or other process. In addition to wires, metal foil connectors, similar to the interconnects could be applied. Metal conductive paths or traces can also be integrated with the substrate 12.

In summary, this new approach attaches the solar cells 14 individually to a substrate 12 such that the corner regions 26 of one, two, three or four adjacent solar cells 14 are aligned on the substrate 12. The solar cells 14 can be laid out so that the cropped corners 24 are aligned and the corner regions 26 are adjacent, thereby exposing an area 28 of the substrate 12. Electrical connections between solar cells 14 are made in these corner regions 26 between front contacts 32 and back contacts 34 on the solar cells 14, bypass diodes 44, and corner conductors 20 on or in the exposed area 28 of the substrate 12, wherein these conductive paths are used to create a string of solar cells 14 in a series connection 48, 50 comprising a circuit.

Prefabricated Conductors on a Substrate

Complex electrical connections are needed between the solar cells 14. This new approach uses patterned corner conductors 20 printed, etched, or otherwise formed on a substrate 12. In alternative examples, the substrate 12 could be a PCB, which is rigid, or a flex sheet assembly, which is flexible.

Figure 14:
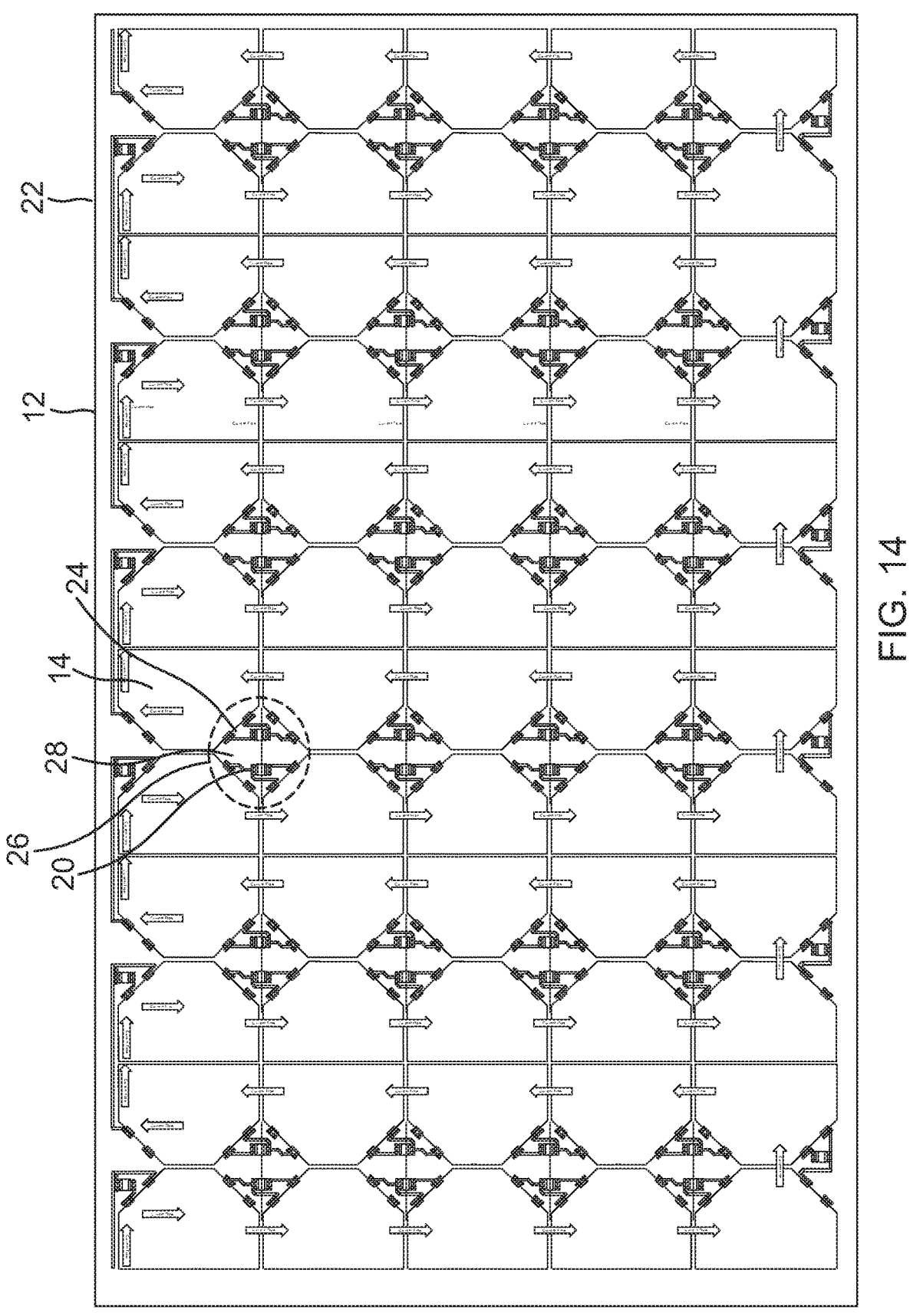
FIG. 14 illustrates these various components integrated into a larger 2-D grid of the array, according to one example.

FIG. 14 illustrates these various components integrated into a larger 2-D grid of an array 22 comprised of five (5) rows by twelve (12) columns of solar cells 14. This array 22 can be expanded as needed using these components.

The continuous current follows a serpentine path starting from the top left corner, moving down the first column, and then turning to flow up the second column, and then repeating the serpentine path for the following columns to move from left to right, down then up, as indicated by the arrows on the figure. In alternative examples, the connections for the current are modified to flow in opposite directions, e.g., right to left or left to right, and down then up or up then down, on the figure.

More electrical connections available in more corner regions 26 simplifies the corner connections and can provide redundancy. This disclosure details how a set of corner conductors 20 can be used in fabricating the 2-D grid of the array 22 of solar cells 14. This 2-D array 22 can be easily resized to fit the customer's requirements. This is a highly structured layout of solar cells 14 and corner conductors 20, which is advantageous for automation of manufacturing, inspection, and testing.

The corner conductors 20 could be made on any material. The corner conductors 20 could be printed directly on the substrate 12, which may comprise a conventional rigid panel, with screen printing or direct write printing (ink jet, aerosol jet, etc.).

Another valuable way to form the corner conductors 20 is with a flex (flexible) substrate 12, such as a flex sheet assembly. These substrates 12 are widely available commercially with a history in the space environment. Instead of the substrate 12 comprised of many solar cells 14, a limited area of the substrate 12 could be fabricated comprised of the elements needed in the corner region 26 including the corner conductors 20. This limited area of the substrate 12 could be attached to a larger assembly, such as a rigid panel. The solar cells 14 could then be applied adjacent to the applied substrates 12 with the corner conductors 20. Alternatively, a large area substrate 12 that is a flex sheet assembly could be fabricated that encompasses the area of both solar cells 14 and the corner regions 26. This substrate 12 could be fabricated in such a way as to exist on its own. It could be supported by another structure, such as a rigid panel or by elements at the perimeter that support the flex circuit assembly.

Figure 15:
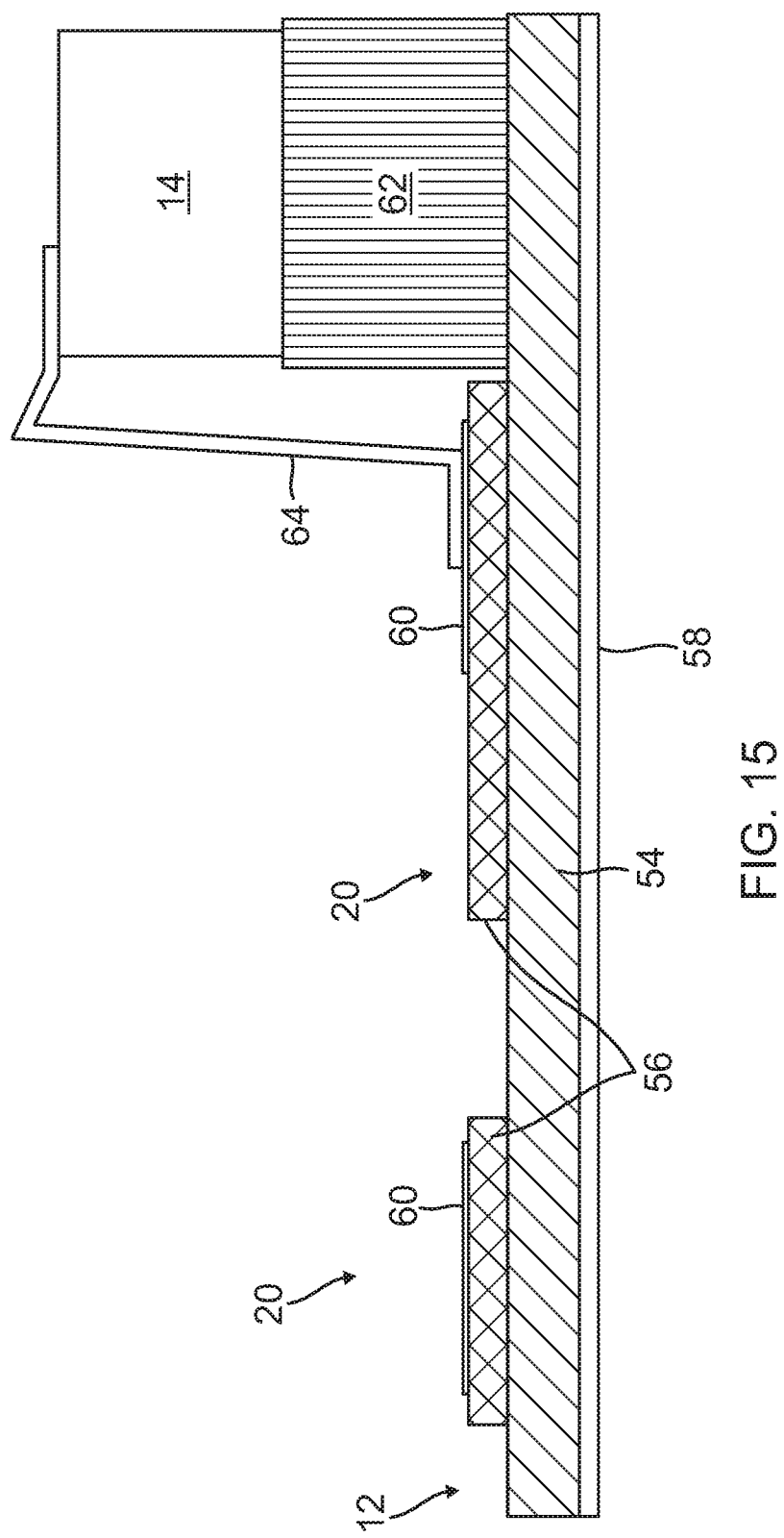
FIG. 15 shows a side view of an assembly using a flex sheet assembly, according to one example.

FIG. 15 shows a side view of a substrate 12 that is flex sheet assembly, according to one example. The substrate 12 comprises a polyimide sheet 54 and the corner conductors 20 comprise a patterned Copper (Cu) layer 56 on top of the polyimide sheet 54. A conducting back sheet of polyimide 58 can be applied to the polyimide sheet 54, which is useful in a space environment in that it will reduce the accumulation of charge. Another capability is the addition of a plated Silver (Ag) or Gold (Au) layer 60 on the Cu layer 56 as part of the corner conductors 20, which is commonly available in a flex sheet assembly. These layers improve the ability to make connections.

Shown on the right side is the solar cell 14 that is attached to the substrate 12 with adhesive 62. Also visible is the metal foil interconnect 64 attached to the solar cell 14 and the plated Ag or Au layer 60 of the corner conductors 20. This is a rather typical construction and assembly that could form the structures presented in earlier figures.

Figure 16:
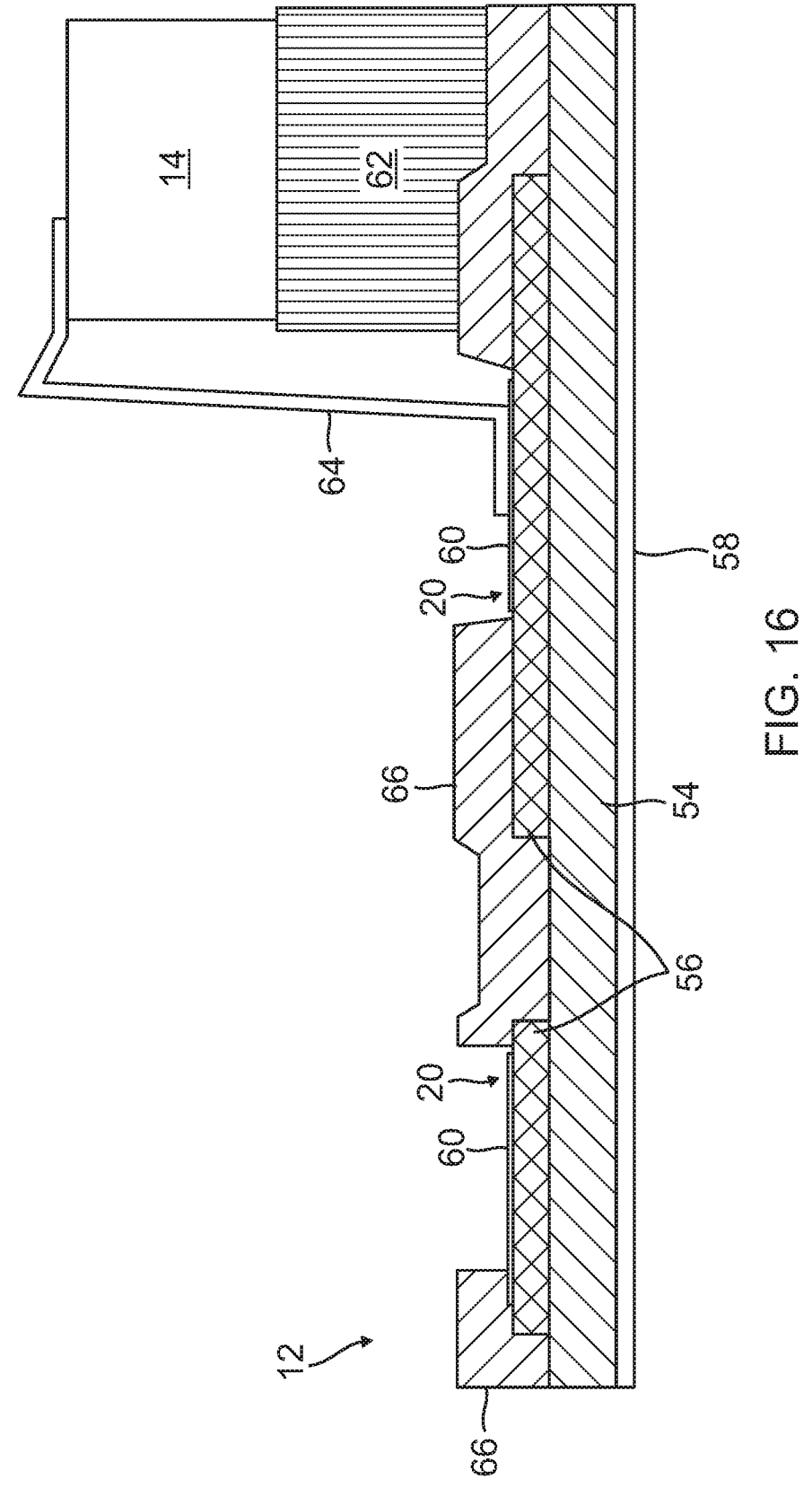
FIG. 16 illustrates the addition of a polyimide overlay on the substrate, according to one example.

FIG. 16 illustrates the addition of an insulating polyimide overlay 66 on the substrate 12. The polyimide overlay 66 includes holes or apertures that provide access for connections to the Cu layer 56 and/or plated Ag or Au layer 60 of the corner conductors 20. The polyimide overlay 66 otherwise encapsulates the flex sheet assembly, including at least portions of the corner conductors 20. Polyimide has a high breakdown strength, greater than air or vacuum, and the substrate 12 is covered by the polyimide overlay 66 for preventing ESD, which is an important concern in the space environment. Furthermore, this enables corner conductors 20 to pass under the solar cell 14. The adhesive 62 is non-conducting, but the continuous polyimide layer of the polyimide overlay 66 offers significant protection against shorting between buried corner conductors 20 and the solar cell 14.

Figure 17A:
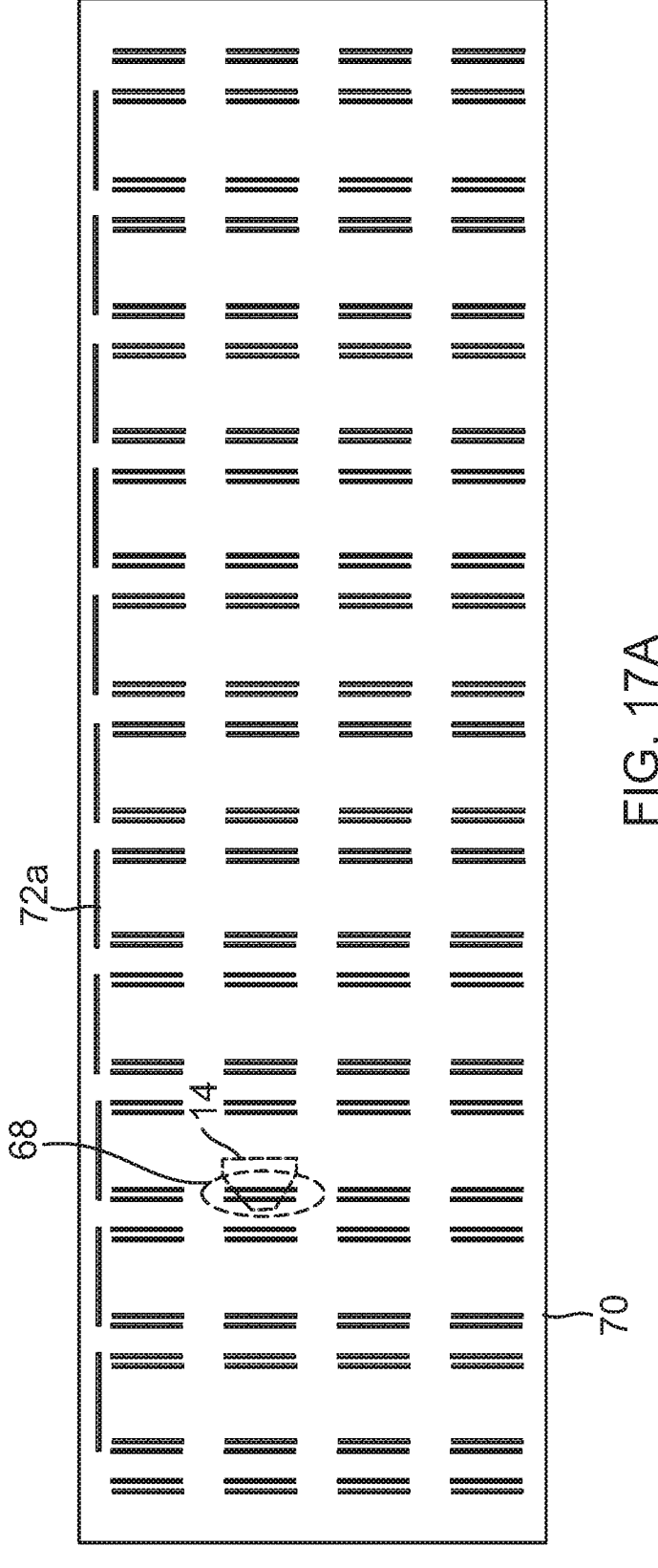
FIGS. 17A-17E illustrate the use of buried conductors in the substrate, according to different examples.

FIGS. 17A-17E illustrate the use of buried conductors 68 in the substrate 12, according to different examples. Specifically, FIG. 17A illustrates a buried layer 70 embedded within the substrate 12, configured as shown in FIGS. 3 and 4, that includes the buried conductors 68 beneath the solar cells 14 that are used for connections between the solar cells 14. A dotted outline of a solar cell 14 shows it placement with respect to buried conductors 68. In this example, there are two buried conductors 68 shown in the vertical directions that extend between the two corner regions 26 of every solar cell 14. Typically, a first one of these buried conductors 68 connects both front contacts 32 of the solar cell 14 and a second one of these buried conductors 68 connects both back contacts 34 of the solar cell 14.

Furthermore, there are buried conductors 72a across the top of FIG. 17A, which connect between solar cells 14 in adjacent columns of the array 22, where the current path passes between solar cells 14, but not at a cropped corner 24. In an alternative example, this could be accomplished with an extra conductor or wire positioned outside the perimeter of the array 22. This configuration also provides for corner-to-corner and column-to-column connections for the plurality of solar cells 14. The conductors 68 provide corner-to-corner connections for the plurality of solar cells 14, while the conductors 72a provide column-to-column connections for the plurality of solar cells 14

Figure 17B:
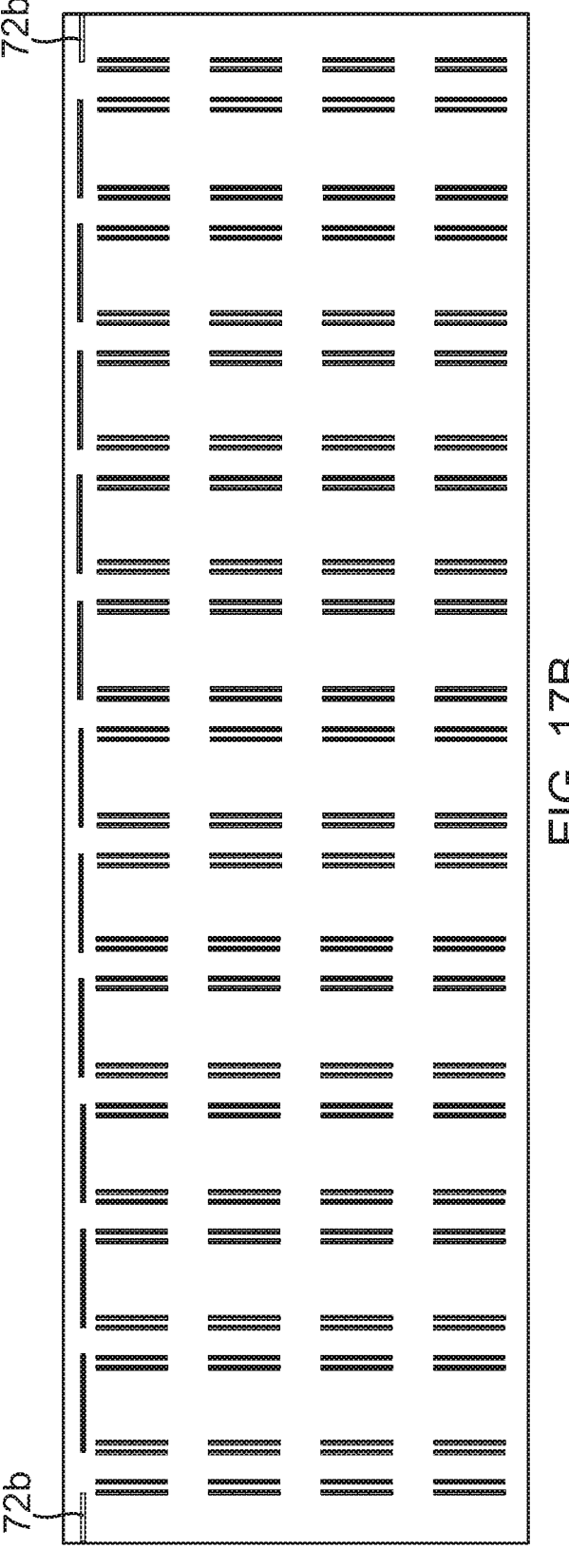
Figure 17C:
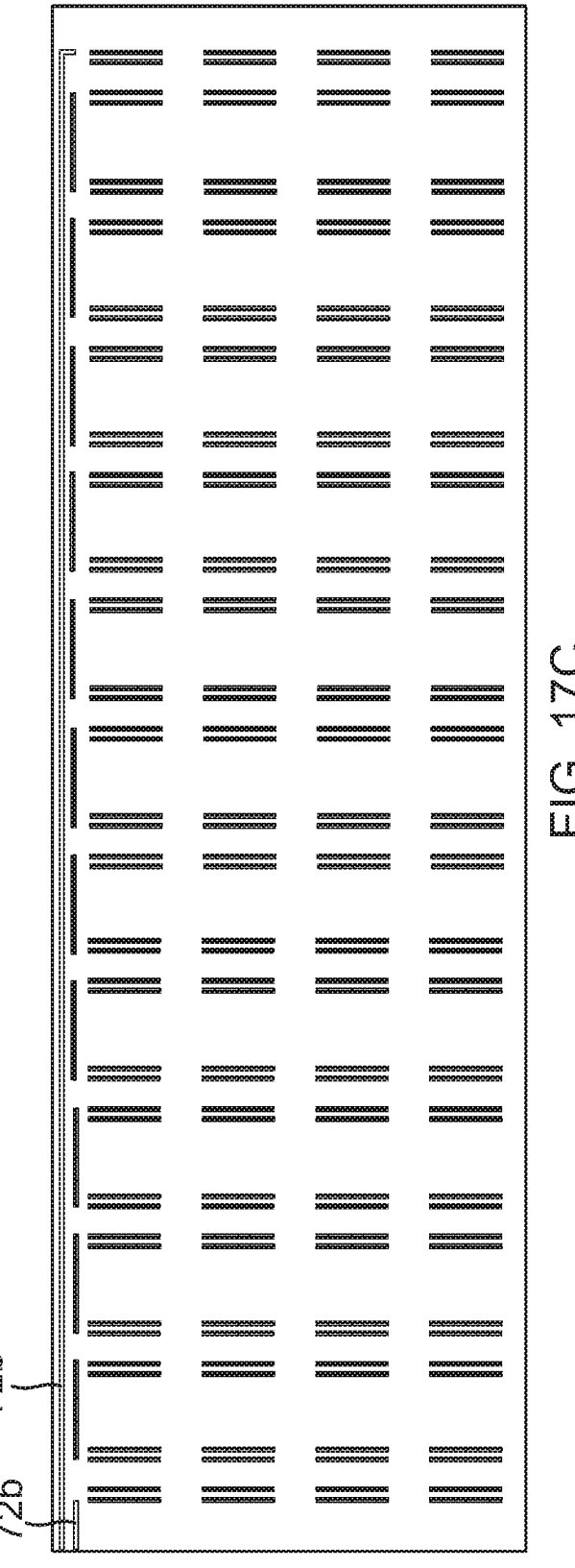
Figure 17D:
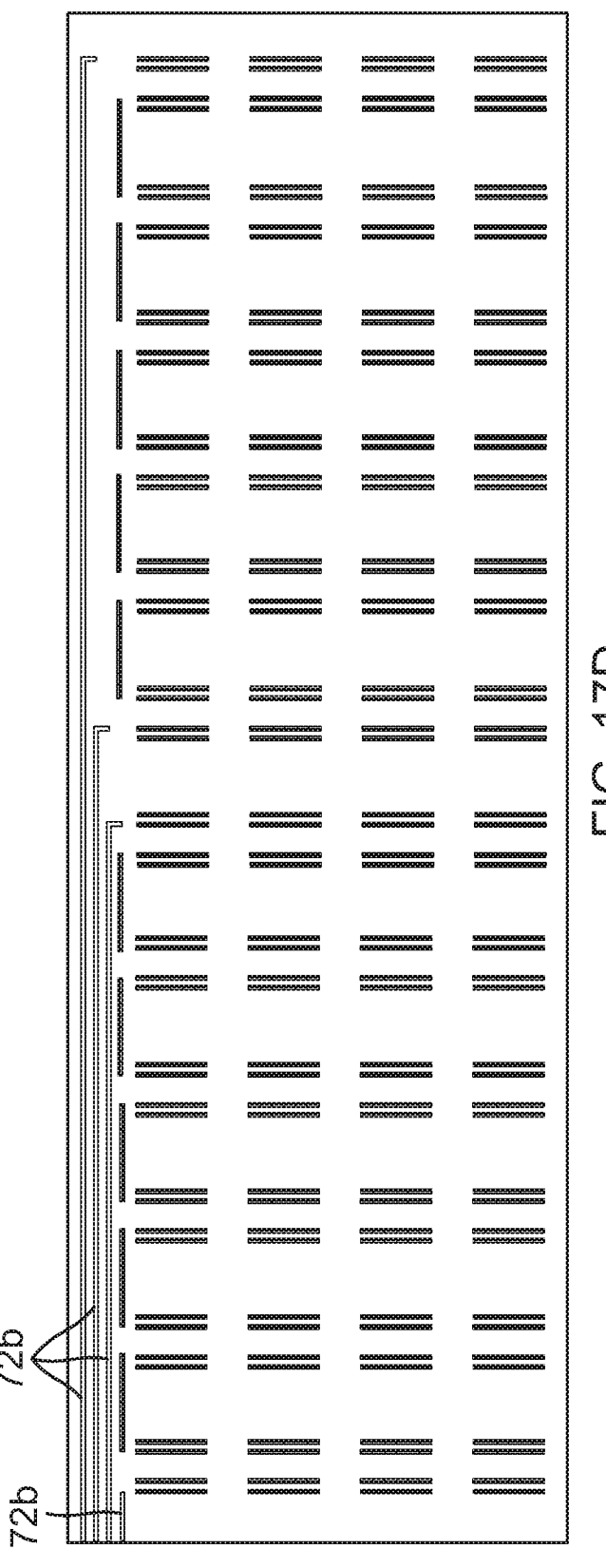
Figure 17E:
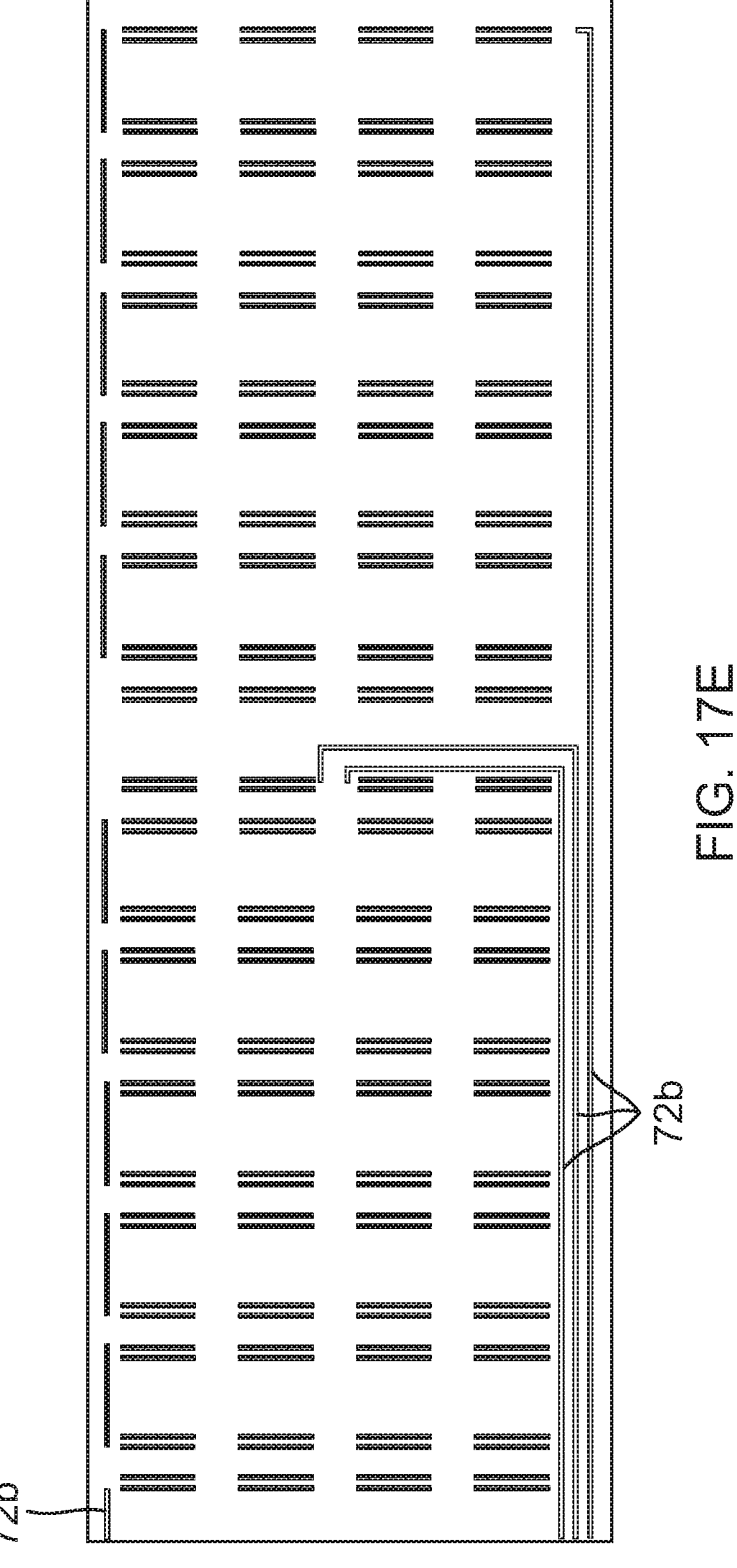

FIGS. 17B-17E illustrate various configurations for buried conductors 72b, which are output lines used for circuit termination. Specifically, FIG. 17B illustrates a configuration with one circuit on the substrate 12 with conductors 72b on both ends; FIG. 17C illustrates a configuration with one circuit on the substrate 12 with conductors 72b coming to the same side (which requires the conductors 72b to extend outside the other conductors 68, 72a); FIG. 17D illustrates a configuration where the conductors 72b terminate multiple circuits on the substrate 12 and bring the current out to the edge of the substrate 12 (which can be accomplished with a single Cu layer 56a and an insulating overlay 66); and FIG. 17E illustrates a configuration showing circuit termination by the conductors 72b for solar cells 14 at the top, middle, and bottom of a column.

FIG. 18 provides greater detail of the buried conductors 68, which are shown as dashed lines to indicate that they are hidden underneath the solar cells 14. These buried conductors 68 connect the front contacts 32 or the back contacts 34 of each solar cell 14, which provides significant value.

The addition of the buried conductors 68 provides redundancy, so that if one interconnect fails, the current flow 52 is maintained. This redundancy is of great importance in a space environment.

The buried conductors 68 also reduce series resistance. As shown in FIG. 5, the current from the solar cell 14 is collected on the front side of the solar cell 14 by thin metal fingers 38 and bus bar 40 that stretch across the front of the solar cell 14. There is a balance between the addition of metal for the bus bar 40, which reduces the light entering the solar cell 14 and its output power, and the reduced resistance and redundancy of having more metal for the bus bar 40. The addition of the buried conductors 68 in FIG. 18 allows the use of less metal in the bus bar 40, which increases power.

A similar structure could be used for the configuration at the top and/or bottom of each column of solar cells 14 in the array 22, as current passes between the solar cells 14. For example, an additional buried conductor 72a as shown in FIG. 17A could extend horizontally, e.g., left to right, bridging solar cells 14 in adjacent columns of the array 22.

FIG. 19 shows an example where there is a missing or omitted solar cell 14 in the bottom left portion labeled as a stayout area 74. Many panels 10a will have stayout areas 74 dedicated to the mechanical assembly of the panel 10a, wing, satellite or for other reasons dictated by the customer, and these stayout areas 74 cannot include solar cells 14. However, these stay-out areas 74 complicate the assembly of the solar cells 14 greatly.

In the example of FIG. 19, the buried conductors 68 shown provide for an ability to accommodate the stay-out area 74 where there is no solar cell 14. The current continues to flow through the buried conductors 68 bypassing the stay-out area 74 as indicated by arrow 52. In several of these configurations, the bypass diode 44 is replaced with a conductor 76. This combination allows the current flow 52 to continue redundantly using both conductors 68 in the absence of a solar cell 14 in the stay-out area 74.

These are combined in FIG. 20, which shows the 2-D array 22 having a large stay-out area 74 in place of four omitted solar cells 14. Also shown are the conductors 76 replacing four bypass diodes 44. The design can be modified to accommodate the customization needs of the customer.

Selecting Current Pathways

While the use of electrical connections between solar cells 14 in these corner regions 26 facilitates manufacturing, it also constricts customization. For example, solar cells 14 are connected in series, known as a string, to produce a high voltage output. The number of solar cells 14 needed to make up this string can vary for a number of reasons. String termination would be part of the electrical connections. Thus, the electrical connections would need to be customized for every circuit length, which incurs expense and delays, and thus is undesirable.

This section addresses these problems by selecting current pathways for the solar cells 14 by adding conductive elements to a corner region 26 to bridge between conductive paths, or by removing conductive elements from a corner region 26 to isolate between conductive paths. The corner region 26 is otherwise wasted on the panel 10a, but now is utilized to aid in the panel 10a manufacturing. Thus, in each corner region 26 resulting from cropped corners, it is possible to select current pathways to direct current or power to a next solar cell 14 in a circuit or to terminate the string.

In effect, current pathways can have two routes. One route is a series connection 48, 50 of solar cells 14, while another route is circuit termination. A simple step, such as adding a conductive element or removing a conductive element, is used to select a current pathway and route. This enables a simple, uniform design and layout, while also achieving the ability to easily adjust the circuit length as needed.

FIG. 21 further illustrates a generic layout between a plurality of solar cells 14, according to one example. The connection scheme has not been determined yet, and each side could be either series or circuit termination. The generic layout includes electrical connections between the front contacts 32 and back contacts 34 of the solar cells 14, and the bypass diodes 44, made in the exposed areas 28 of the substrate 12, using the corner conductors 20.

FIG. 22 illustrates an example where one or more conductor elements comprising a jumper 78 is added to the corner region 26 to select current pathways for the solar cells 14, wherein the jumper 78 bridges the electrical connections from at least one of the corner conductors 20 to one or more other conductive paths.

For example, the jumper 78 is welded or soldered between a corner conductor 20 and a pad 80, and may include stress relieving elements. The pad 80 terminates the circuit to a wire 82, wherein the wire 82 is connected to circuitry external to the solar cells 14. In alternative examples, the jumper 78 may also channel current to another solar cell 14.

The jumper 78 is a metal foil interconnect that is similar to existing metal interconnects used in solar cell panels 10. In one example, the jumper 78 has a shape comprised of two flange elements with parallel planes connected by a web element, which enables multiple connection points, although other shapes may be used as well. Other types of conductive elements, such as wires 82, could also be employed.

In the configuration of FIG. 22, the solar cell 14 on the bottom right hand side has the jumper 78 moved slightly to the side, which connects the back contact 34 of the bottom, right solar cell 14 to the pad 80. Also shown is the bottom wire 82 attached to the pad 80, wherein the bottom wire 82 connects the string to external circuitry.

In a conventional structure for the solar cell 14, the back contact 34 termination is a V+terminal. The top right solar cell 14 has a top wire 82 applied to another pad 80, which forms a V−terminal. The top wire 82 connected to the V−terminal connects to the front contact 32 for standard operation and through the bypass diode 44 to the back contact 34.

In other examples, the jumper 78 may be applied to enable termination of a string of solar cells 14, wherein wires 82 are connected to two solar cells 14 via pads 80. The jumper 78 may also be applied at a top of a row of solar cells 14 in the array 22 to enable continuation of a string of solar cells 14. In addition, the jumper 78 may be applied at a top of a row of solar cells 14 in the array 22 to enable termination of a string of solar cells 14, wherein wires 82 are connected to the two solar cells 14 via pads 80.

FIG. 23 shows the combination of these structures into a 2-D grid of an array 22, wherein the solar cells 14 are half-size solar cells 14. Jumper 78 positions are adjusted in order to have series connections 48, 50 or string terminations. The top left-most solar cell 14 starts a new circuit with a terminal wire 82 labeled V−String 1. Solar cells 14 are series connected until the fourth column of solar cells 14 from left to right. Here, the jumpers 78 terminate the wire 82 labeled V+String 1 and start with the wire 82 labeled V−String 2 on the next solar cell 14. This continues until the bottom of the 7th and 8th columns of solar cells 14, where the next circuits are terminated, at the wire 82 labeled V+String 2 and the wire 82 labeled V−String 3. At the top of the 10th column of solar cells 14, the conductor 72 labeled as String 3 continues the circuit to later columns of solar cells that are not drawn.

The value of this structure is significant. Now, there is a single printed corner conductor 20 pattern, single layout of solar cells 14, and single layout of bypass diodes 44. This single configuration enables automation of manufacturing, testing, and inspection. The application of a jumper 78 provides for a simple way to control the number of solar cells 14 in a string.

In these figures, an electrical connection is made to enable choice of a current path. This is done by adding or removing conducting elements to select current pathways for the solar cells 14. The patterned corner conductors 20 could be fabricated, such that there is solid metal where the jumpers 78 are shown in the figures. Alternatively, instead of attaching a solid metal jumper 78 that may be a foil or wire, the connection could be accomplished by printed metal, which could involve a variety of metal powder configurations held together with polymer, epoxy, adhesive matrices or that solidify into a solid metal matrix. The removal of metal from one of the current paths would accomplish the same final result, for example, using laser ablation equipment to perform this task.

Multilayer Conductors

While the use of electrical connections between solar cells 14 in the corner regions 26 facilitates automation, there are limits to the power generation capability, manufacturability, and survivability of this design. Specifically, extracting power from an array 22 using existing solutions requires running wires 82 across the surface of the array 22, which is prone to difficulty and risks.

This section describes the incorporation of multilayer conductors embedded in the substrate 12 for electrically connecting to the corner conductors 20 and the solar cells 14. The multilayer conductors pass underneath, and parallel or orthogonal to, the corner conductors 20 and the solar cells 14. These multilayer conductors also carry power from any point on the 2-D grid of the array 22 of solar cells 14 to a perimeter of the substrate 12, without the need for external wiring 82, which simplifies the extraction of power from the circuits in the array 22.

FIG. 24 illustrates another configuration for the buried metal layer 70 embedded within the substrate 12, configured as shown in FIGS. 3 and 4. The buried metal layer 70 includes the conductors 68, 72 beneath the solar cells 14, which are bridge lines for electrically connecting between cropped corners 24 of the solar cells 14, wherein the buried conductors 68, 72 are configured in the same manner as shown in FIG. 17. However, the buried metal layer 70 also include V+lines 84 and V−lines 86 for distributing power among the solar cells 14, wherein the V+lines 84 and V−lines 86 are configured horizontally in the buried metal layer 70 of the substrate 12, orthogonal to the conductors 68, passing underneath the solar cells 14 to the perimeter of the substrate 12.

The conductors 68 as bridge lines can be configured in a number of different ways: the conductor 68 runs under the solar cells 14 to electrically connect a front contact 32 on one corner 24 of the solar cell 14 to a front contact 32 on another corner 24 of the same solar cell 14; the conductor 68 runs under the solar cell 14 to electrically connect a back contact 34 on one corner 24 of the solar cell 14 to a back contact 34 on another corner 24 of the same solar cell 14.

In addition, the string termination lines V+84 and V−86 can be configured in a number of different ways: the V+lines 84 and V−lines 86 distribute current from the solar cells 14 to a perimeter of the substrate 12; the V+line 84 and V−line 86 run at least a portion of a length of the array 22 in a perpendicular direction to the array 22; or there are a plurality of the V+lines 84 and V−lines 86, and the solar cells 14 connect to the plurality of the V+lines 84 and V−lines 86 for distributing power among the solar cells 14.

In each corner region 26, there may be one or more vias or vertical conduction paths (not shown) through the substrate 12 that vertically connect the conductors 68, 72, the V+line 84 and the V−line 86 to the solar cells 14 and corner conductors 20. In addition, the conductors 68, 72, the V+line 84 and the V−line 86 may be vertically connected to other conductors 68, 72, V+line 84 and V−line 86, respectively.

FIG. 25 shows a side view of an example wherein the substrate 12 is a flex sheet assembly including multilayer conductors. The substrate 12 includes a polyimide base layer 54 with Cu layer 56a above and Cu layer 56b below, wherein Cu layers 56a and 56b form a multilayer conductor. Cu layer 56a with plated Ag or Au layer 60 is patterned as the corner conductors 20 for one layer to the multilayer conductors, and Cu layer 56b is patterned as the conductors 68 and 72, as well as the V+line 84 and V−line 86, for another layer to the multilayer conductors.

The substrate 12 also includes insulating layers that separate at least one of the multilayer conductors from at least another one of the multilayer conductors. In one example, there are a top polyimide overlay layer 66a and bottom polyimide overlay layer 66b, wherein the top polyimide overlay layer 66a has holes drilled through it, and the holes are Cu-plated vias 88 that electrically connect Cu layer 56a with Cu layer 56b. Additionally, a conducting polyimide layer 58 can be applied to the back surface of the substrate 12.

The top polyimide overlay layer 66a can be omitted underneath the solar cell 14. This can be advantageous if the top polyimide overlay layer 66a is prone to bubbles or other defects.

There is an alignment between Cu layer 56a, Cu layer 56b and the top polyimide overlay layer 66a. In this example, the top polyimide overlay layer 66a almost fully encases the Cu layer 56a, polyimide layer 54, and Cu layer 56b, with only small access holes to the Cu layer 56a and Cu layer 56b. This requires the top polyimide overlay layer 66a to roll up and over the corners of the Cu layers 56a and 56b. By encasing the metal of the Cu layers 56a, 56b, the top polyimide overlay layer 66a provides valuable protection against ESD.

The top polyimide overlay layer 66a has larger holes to avoid overlapping the edges of the Cu layers 56a and 56b. This top polyimide overlay layer 66a may be easier to fabricate with less defects than a full top polyimide overlay layer 66a.

There is a connection between two or more traces of the Cu layer 56a, wherein the traces of the Cu layer 56a are also connected by vias 88 to Cu layer 56b. The top polyimide overlay layer 66a may not be needed; in that case, there would be no hindrance of the top polyimide overlay layer 66a to any jumper 78 connection.

A jumper 78 (not shown) can connect directly from the Cu layer 56a to the Cu layer 56b. Similarly, the interconnect 64 may connect the solar cell 14 to either Cu layer 56a or Cu layer 56b. This eliminates the Cu-plated via 88 connections, which could be a reliability concern, especially in the flex sheet assembly. However, there is more polyimide topography from the top polyimide overlay layer 66a that the jumper 78 needs to reach over. The thickness of the top polyimide overlay layer 66a is typically about ~0.1 mm, while the length of the jumper typically may be about ~4 mm. Having the metal of the jumper 78 surrounded by large amounts of polyimide from the top polyimide overlay layer 66a may impede the jumper 78, but will also impede ESD, which can be valuable.

Electrical access is provided to the buried Cu layer 56b. This could be accomplished with the via 88 connection between Cu layer 56a and Cu layer 56b, or with a direct connection between Cu layer 56a and Cu layer 56b. Also, there may be multiple connections between Cu layer 56a and Cu layer 56b. This redundancy is an important attribute and can be employed when possible.

The traces of the Cu layer 56b that comprise the V+line 84 and V−line 86 can be wide to maximize the Cu cross-sectional area and conductivity. This can be important for high currents and long conductors. These V+line 84 and V−line 86 can have multiple vias 88 that connect to them, making for redundant reliable connections, as shown in FIG. 26 below. Alternatively, these V+line 84 and V−line 86 can thin, so that there more of them. More lines 84, 86 may be important for arrays 22 with many circuits needing individual output lines 84, 86.

FIG. 26 shows the corner-to-corner bridge lines 68a, 68b, as well as the V+line 84 and V−line 86, which are in the Cu layer 56b and are connected by vias 88. While the bridge lines 68a, 68b could be in the Cu layer 56a with a top polyimide overlay 66a, the Cu layer 56b can be thinner or thicker than the Cu layer 56a, as needed. Another option is that these bridge lines 68a, 68b could exist in both Cu layer 56a and Cu layer 56b, providing bottom resistance and improved redundancy. This figure focuses on buried conductors, and a final structure will also have corner conductors 20.

FIG. 27 shows a standard connection between three solar cells 14a, 14b, 14c arranged on a substrate 12 and connected in a series using corner conductors 20 with bypass diodes 44a, 44b, 44c. Each solar cell 14a, 14b, 14c is depicted as a diode 90 in parallel with a current source 92 in parallel with a shunt resistor 94. The current 52 flows clockwise around the figure. As current 52 returns from a load 96 at a low voltage (V−) 98, it connects to the front contact 32 of solar cell 14a and to bypass diode 44a. If solar cell 14a is illuminated by light source 100, the current source 92 operates and boosts the voltage 98 of the current 52 through the solar cell 14a. The current 52 exits the back contact 34 of solar cell 14a, which is connected to the front contact 32 of solar cell 14b and continues to the back contact 34 of solar cell 14b, to the front contact 32 of solar cell 14c, to the back contact 34 of solar cell 14c, and again to the load 96, at an increased voltage (V+) 98. This series of solar cells 14a, 14b, 14c is known as a string, producing a desired current 52 and voltage 98. The number of solar cells 14a, 14b, 14c in the circuit determines the voltage 98, which is roughly 2V per triple junction solar cell 14a, 14b, 14c.

If a solar cell 14a, 14b, 14c does not produce current 52, due to shadowing, for example, the voltage 98 of the circuit will be applied across the shadowed solar cell 14a, 14b, 14c and likely damage it. The bypass diode 44a, 44b, 44c protects against this. If solar cell 14b is not producing current 52, then voltage 98 will develop across the solar cell 14b and bypass diode 44b, which will enable current 52 to flow through bypass diode 44b. Use of a Silicon (Si) bypass diode 44b will enable current 52 flow at roughly 0.5V, protecting the solar cell 14b. The connections described here need to be maintained in the configurations described in further figures. Furthermore, redundancy of conductors and connections is important to ensure operation over the lifetime of the solar cells 14a, 14b, 14c.

FIG. 28 shows how the buried Cu layer 56b integrates with the Cu layer 56a, which comprise the corner conductors 20. Vias 88a are shown for connections between Cu layer 56a, which are corner conductors 20, and Cu layer 56b, which are bridge lines 68. Vias 88b are also shown for connections between Cu layer 56a, which are power distribution bars 102, and Cu layer 56b, which are V+line 84 and V−line 86. Interconnects can connect these bars 102 to multiple solar cells 14 and to multiple V+lines 84 and V−lines 86. Bypass diodes 44 are also shown.

FIG. 29 shows a jumper 78a that connects the back contact 34 of the top left solar cell 14 to the front contact 32 of the bottom left solar cell 14. This jumper 78a also connects through the bypass diode 44 to the back contact 34 of the bottom left solar cell 14. This connection path provides for the current flow 52 from top to bottom shown on the left side of the figure. A similar configuration using jumper 78b provides for the current flow 52 from bottom to top shown on the right side of the figure.

FIGS. 30, 31, 32, 33, 34 and 35 illustrate some of the advantages of this disclosure. By applying conducting interconnects, the single design of the flex sheet assembly can have many electrical connection pathways. This is important for bottoming the cost to purchase material and simplifies the manufacturing and automation.

FIG. 30 shows a connection between the solar cells 14 on the top left and bottom left of the figure. The solar cell 14 on the bottom left terminates the back contact 34 to the center power bars 102, which are connected to the V+lines 84 (not shown) and V-lines 86 (not shown) through the interconnects 106 to the vias 88b. The power distribution bars 102 in the center have a bridging interconnect 104 allowing access to all of the V+lines 84 and V−lines 86 through the interconnects 106 to the vias 88b. The solar cell 14 on the bottom right of the figure terminates the front contact 32 to the right side power bar 102, which is connected to the V−line 86 through the interconnects 106 to the vias 88b, and the back contact 34 is series connected to the solar cell 14 on the top right of the figure. The arrows 52 indicate the direction of current flow.

FIG. 31 shows the back contact 34 of the solar cell 14 on the top left of the figure terminated to the top center power bar 102, which is connected to the V+lines 84 (not shown) and V−lines 86 (not shown) through the interconnects 106 to the vias 88b, while the solar cell 14 on the bottom left of the figure terminates the front contact 32 to the left side power bar 102, which is connected to the V−line 86 through the interconnect 106 to the vias 88b. The back contact 34 of the solar cell 14 on the bottom right of the figure is terminated to the bottom center power bar 102, which is connected to the V+lines 84 and V−lines 86 through the interconnects 106 to the vias 88b, while the solar cell 14 on the top left of the figure terminates the front contact 32 to the right side power bar 102, which is connected to the V−line 86 through the interconnect 106 to the vias 88b.

FIG. 32 shows the front contact 32 of the solar cell 14 on the top left of the figure connected to the left side power distribution bar 102, which is connected to the V−line 86 (not shown) through the interconnects 106 to the vias 88b, with the back contact 34 series connected to the solar cell 14 on the bottom left of the figure. The back contact 34 of the solar cell 14 on the bottom right of the figure is connected to the solar cell 14 on the top right of the figure, while the back contact 34 of the solar cell 14 on the top right of the figure is terminated to the top center power distribution bar 102, which is connected to the V+line 84 (not shown) through the interconnects 106 to the vias 88b.

FIG. 33 shows the back contact 34 of the solar cell 14 on the top left of the figure is terminated to the top center power distribution bar 102, which is connected to the V+line 84 line (not shown) through the interconnects 106 to the vias 88b, while the front contact 32 of the solar cell 14 on the top left of the figure is connected to the bridge line 68 (not shown) through the via 88a. The front contact 32 of the solar cell 14 on the bottom left of the figure is connected to the left side power distribution bar 102, which is connected to the V−line 86 (not shown) through the interconnect 106 to the vias 88b, as well as the bypass diode 44, while the back contact 34 of the solar cell 14 on the bottom left of the figure is also connected to the V−line 86 through the bypass diode 44. The back contact 34 of the solar cell 14 on the bottom right of the figure is series connected to the solar cell 14 on the top right of the figure.

FIG. 34 shows the back contact 34 of the solar cell 14 on the top left of the figure is series connected to the solar cell 14 on the bottom left of the figure. The back contact 34 of the solar cell 14 on the bottom left of the figure is connected to the bottom center power distribution bar 102, which is connected by the interconnect 104 to the top center power distribution bar 102, which is terminated to the V+line 84 (not shown) through the interconnects 106 to the vias 88b. The back contact 34 of the solar cell 14 on the bottom right of the figure is series connected to the solar cell 14 on the top right of the figure.

FIG. 35 shows the front contact 32 of the solar cell 14 on the top left of the figure connected to the left side power distribution bar 102, which is connected to the V−84 (not shown) through the interconnect 106 to the vias 88b, while the back contact 34 of the solar cell 14 on the top left of the figure is series connected to the solar cell 14 on the bottom left of the figure. The back contact 34 of the solar cell 14 on the bottom right of the figure is series connected to the solar cell 14 on the top right of the figure.

The description of FIG. 36 is made with reference to FIGS. 30, 31 and 32 appended together. Specifically, the solar cells 14 of FIGS. 30, 31 and 32 are connected such that the current in the left side travels down the solar cells 14, which are series connected, terminated to the V+line 84 and/or terminated to the V−line 86. Similarly, the solar cells 14 of FIGS. 30, 31 and 32 are connected such that the current in the right side travels up the solar cells 14, which are series connected, terminated to the V+lines 84 and/or terminated to the V−lines 86. In addition, the cells of FIGS. 33, 34 and 35 may be appended together in a similar but mirrored manner, with the current flow reversed.

This demonstrates how circuits can terminate into multiple V+lines 84 and V−lines 86. This shows great redundancy on the connections to V+lines 84 and V−lines 86. A key part of this is using the vertical corner-to-corner connections (68a and 68b) shown in FIG. 26. It is unlikely that more than two V+lines 84 are needed for redundancy. Furthermore, a single V+line may be desirable in some cases as redundant connection can be made to the single V+line 84. The connection is generally the most sensitive part needing redundancy.

FIG. 37 shows the conductors 72, V+lines 84 and V−lines 86 at the end of a column of solar cells 14, as well as the bridge lines 68a, 68b under the solar cells 14. In addition, an interconnect (not shown) may be applied for series connection.

In this configuration, current would come from the left side of the figure through the buried conductor 72 and via 88a to connect to the front contact 32 of the left solar cell 14. The conductor 72 would also connect through a bypass diode 44 (not shown) to the back contact 34. The current would then travel down the figure. The solar cell 14 on the right side of the figure would receive current from solar cells 14 below (not shown). The back contact 34 of the solar cell 14 on the right side of the figure has an interconnect connecting it to the conductor 72, which carries the current off the right side of the figure to the next solar cell 14 (not shown).

The solar cell 14 on the left side of the figure can be terminated to the V−line 86 through via 88b. The solar cell 14 on the right side of the figure can be terminated to the V+line 84 through the via 88b.

FIG. 38 shows a variation comprising an array 22 of solar cells 14 arranged as three (3) rows by six (6) columns. The figure indicates the bridges 68 and 72, as well as multiple V+lines 84 and V−lines 86. The solar cell 14 in the top left corner (cell1 14) terminates on the V−1,2,3 lines 86 using both corners for these connections. The current of the first circuit then flows through series connections to cell7 14, as indicated by the arrow 52a, wherein cell7 14 terminates onto V+1,2,3 lines 84. The current of the second circuit then starts with cell8 14 terminating on V−3,5 lines 86, as indicated by the arrow 52b, wherein the circuit is series connected between cell8 14 and cell15 14 and cell15 14 terminates on V+6,7,10 lines 84. The current of the third circuit starts with cell16 14 connected to V−5,6 lines 86, as indicated by the arrow 52c, and the circuit then continues with series connection through cell18 14 and off the figure.

This configuration shows the advantages of this disclosure. A single design using multilayer conductors in a substrate 12, wherein the substrate 12 could be a flex sheet assembly or printed circuit board. The strength of this disclosure is that a single design of this expensive part is needed. Thus, the expense can be reduced by fabricating in bulk. Furthermore, the long delivery time is eliminated as it becomes an off-the-shelf item that can be fabricated in advance for any variety of programs, customers, etc.

There is also a single assembly of solar cells 14 and bypass diodes 44 onto the array 22. Conventional arrays of solar cells 14 have a very custom, variable location for each of the solar cells 14 in the array.

Having such a structured layout also simplifies the layout automation, and as well as testing and inspection. The procurement of a multilayer substrate 12 and its assembly with solar cells 14 and bypass diodes 44 is generic. This is an assembly common for any rectangular solar cell array 22.

Solar cell arrays 22 have different operating environments and voltage requirements which ultimately determine the number of solar cells 14 in a circuit. The string length often ranges from 20 to 55 solar cells 14. This is a critical customization. In this layout, this is easily achieved by adding the interconnects at needed locations. Thus, the only customization is in the placement of the conductor and its attachment through a solder or welding (resistive, laser, ultrasonic) process.

The addition of the conducting interconnect is equivalent to having these traces fabricated in place and then having the metal removed. The removal could easily be accomplished through a laser ablation process.

A base level layout could be where all connections are made as the starting point. Then, metal could be removed, in order to have a desired connection pattern. Moreover, there may be electrical paths through the Cu layers via a plated via, or the removal of at least portions of the Cu layers. Some of the polyimide may also be removed in this process.

An important capability of this layout is the ability to provide stayout zones 74. Panel 10*a* fabrication often involves customer direction to not have any hardware in a certain location that may have a hole or serve other mounting needs of the panel 10*a* assembly. The corner-to-corner buried connections enable solar cells 14 to be left off of the assembly. Then, the bypass diode 44 is replaced with a solid conductor. This may result in severing V+lines 84 or V−lines 86, which would need to remain unused.

There also may be variations in the design of the power distribution bars 102. For example, the center power distribution bar 102 can be solid, which provides access to more V+lines 84. However, only one solar cell 14 could terminate on the V+line 84 in a corner region 26.

There also may be a variation where the structure has more hard wired connections and thus less choices and less interconnects. Hard wired electrical connections reduce failure risk, which is often desirable.

This is balanced against a solar cell 14 being able to terminate to V+lines 84 and V−lines 86 in both corner regions 26, which provides redundancy and design flexibility in case some V+lines 84 and V−lines 86 are already in use. Also, this requires use of V+lines 84 and V−lines 86 that are adjacent, eliminating the protection of using V+lines 84 and V−lines 86 in different corner regions 26.

FIG. 39 shows the connections made to match those of FIG. 33, but with fewer corner conductors 20, jumpers 78, interconnects 104 and interconnects 106. Furthermore, there is more space between the corner conductors 20 and other conductive elements.

This limits the design flexibility, but results in fewer electrical corner conductors 20 and saves layout space. Thus, corner conductors 20 can be more widely spaced for better ESD protection or to shrink the required corner region 26. A small corner region 26 results in more solar array area used to produce power.

Overall, this format has numerous specific configurations, many of which have been described herein. In practice, there is a balance between broad flexibility of the layout that requires multiple connections and dense conductors, versus more hardwired connections that conserve space, and have less connections to apply.

Printed Conductors

This section describes printing metal corner conductors 20 on the substrate 12 in the corner regions 26, before and/or after the solar cells 14 and/or diodes 44 are attached to the substrate 12, to provide the electrical connections between solar cells 14. The printing of corner conductors 20 can simplify manufacturing, while providing for customization. The electrical connections can be made in any desirable way using the printed corner conductors 20, with little effort to modify the design.

FIG. 40 shows a corner connection layout similar to FIG. 22 discussed above. This figure illustrates how one or more conductor elements, such as a jumper 78, are added to the corner regions 26. The jumper 78 allows circuits to be terminated at the corner region 26 or to channel current 52 to the next solar cell 14.

The jumper 78 is a metal foil element that is similar to existing metal interconnects. As described above, the jumper 78 has a shape comprised of two flange elements, which have parallel planes, connected by a web element, which enables multiple connection points, although other shapes may be used as well. The jumper 78 could be welded or soldered onto conducting paths and pads. Other types of conductor elements, such as wires 82, could also be employed.

The jumper 78 allows selection between two possible current pathways. The layout of FIG. 40 provides a pathway of series connection of the solar cell 14 or circuit termination to the large pad 80 where a wire 82 could be attached.

Instead of using a solid metal conductor, such as the jumper 78, FIG. 41 shows how the jumper 78 could be replaced with a printed conductor 108 of similar shape. Like the printed corner conductors 20, the printed conductor 108 may also require curing, but does not require a weld or solder process, which could be advantageous.

In FIG. 42, the corner regions 26 are shown having corner conductors 20 that are printed on the exposed area 28 of the substrate 12 before the solar cells 14 and bypass diodes 44 are applied to the substrate 12. The printing of the corner conductors 20 can connect these elements in virtually any manner or configuration. The primary constraint is to avoid crossing corner conductors 20. The layout of FIG. 42 is generic, and could be built in bulk and applied to any panel 10*a* configuration, which is an advantage for manufacturing cost and delivery times.

In FIGS. 43A and 43B, the corner regions 26 are shown having corner conductors 20 that are printed on the exposed area 28 of the substrate 12. This printing could happen before or after solar cells 14 and bypass diodes 44 are attached. It is preferred to do this printing before the solar cells 14 and bypass diodes 44 are attached to facilitate curing or cleanup that may be needed. These figures show how printing the corner conductors 20 can direct the flow of current, as indicated by the arrows 52. The printing technique allows for customization, where FIG. 43A has the current 52 flowing vertically, while FIG. 43B has the current 52 flowing horizontally.

FIG. 44 shows another configuration of printed corner conductors 20 where the circuits terminate at large pads 80, which are also printed, and to which a bulk wire 82 can be connected (not shown). The printing of corner conductors 20 and pads 80 can be extended to any number of different layouts and configurations to achieve left-right or top-bottom current paths, stayout zones, etc. Furthermore, the addition of buried or multilayer connections embedded in the substrate 12 can also be connected with the printed corner conductors 20 and pads 80, which can conform over the topographies.

The printed conductors 20 could connect to vias at the surface to buried conductors. Similarly, a buried conductor may be exposed through an insulation layer. The printing can be made across the substrate 12 surface and extend down to the exposed, buried conductor.

In this example, the corner conductors 20 are printed directly on the substrate 12, in order to simplify manufacturing, while enhancing customization. Specifically, the printed corner conductors 20 can be designed for any configuration. Printed corner conductors 20 may require curing, but do not require welding or soldering processes. Instead, the printed corner conductors 20 directly connect the solar cells 14, via their front contacts 32 and back contacts 34, with other elements, such as bypass diodes 44.

There are many conductive printing solutions currently available. For a space-based solar cell panel 10*a*, the printed corner conductors 20 need to be highly conductive, have ultra-low outgassing, and cure with a maximum temperature below 250° C.

Some printable conductors include significant polymer content that may not satisfy these requirements. However, there are some formulations based on nano-metal inks that are preferable, including nano-metal inks available in Au, Ag and Cu. Plasma spray of micro-metal particles has also shown the ability to print a polymer-free metal with high conductivity.

These nano-metal inks are comprised of powders that solidify into a solid metal in the temperature range of about 150-250° C. During curing, solvent and surfactants largely evaporate, leaving little polymer or organic content. The resulting metal corner conductors 20 have a conductivity near that of bulk metal. Furthermore, a variety of printing tools are available to print these nano-metals in ink form or as an aerosol process.

The functionality of the printed corner conductors 20 is enhanced by the use of buried or multilayer conductors embedded in the substrate 12. Moreover, the printed corner conductors 20 can be encapsulated in polymer insulators, which also can be printed, to reduce sensitivity to ESD. The printing of corner conductors 20 and pads 80 can also involve the printing of an insulator, which is a polymer or ceramic/oxide. The insulator is printed on the corner conductors 20 and pads 80, in order to encapsulate the printed corner conductors 20 and pads 80, and reduce sensitivity to ESD. Furthermore, another printed conductive layer could be deposited on the insulator to carry radiation-induced charges.

The value of this structure is significant. Now, there is a single printed corner conductor 20 pattern, single layout of solar cells 14, and single layout of bypass diodes 44. This single configuration has great advantages for automation of manufacturing, testing, and inspection.

Printing of conducting pathways is an advantageous process to achieve the needed customization. A wide variety of pathways can be achieved using a single starting layout of FIG. 42, where only needed current pathways exist. This allows the corner regions 26 to be more fully utilized. Tradeoffs and optimization can be changed. Since fewer corner conductors 20 are needed in the corner regions 26, the corner regions 26 can be shrunk, increasing the fraction of panel 10a area with power-producing solar cells 14. Alternatively, corner conductors 20 can be larger to reduce resistance and gain reliability. In another tradeoff, larger spaces between corner conductors 20 can be designed, which results in less risk of damage from ESD. These characteristics are of great value in a space-based panel 10a.

Fabrication

Examples of the disclosure may be described in the context of a method 114 of fabricating a solar cell 14, solar cell panel 10a and/or satellite, comprising steps 116-128, as shown in FIG. 45, wherein the resulting satellite 130 having a solar cell panel 10a comprised of solar cells 14 are shown in FIG. 46.

As illustrated in FIG. 45, during pre-production, exemplary method 114 may include specification and design 116 of the solar cell 14, solar cell panel 10a and/or satellite 130, and material procurement 118 for same. During production, component and subassembly manufacturing 120 and system integration 122 of the solar cell 14, solar cell panel 10a and/or satellite 130 takes place, which include fabricating the solar cell 14, solar cell panel 10a and/or satellite 130. Thereafter, the solar cell 14, solar cell panel 10a and/or satellite 130 may go through certification and delivery 124 in order to be placed in service 126. The solar cell 14, solar cell panel 10a and/or satellite 130 may also be scheduled for maintenance and service 128 (which includes modification, reconfiguration, refurbishment, and so on), before being launched.

Each of the processes of method 114 may be performed or carried out by a system integrator, a third party, and/or an operator (e.g., a customer). For the purposes of this description, a system integrator may include without limitation any number of solar cell, solar cell panel, satellite or spacecraft manufacturers and major-system subcontractors; a third party may include without limitation any number of venders, subcontractors, and suppliers; and an operator may be a satellite company, military entity, service organization, and so on.

As shown in FIG. 46, a satellite 130 fabricated by exemplary method 114 may include systems 132, a body 134, solar cell panels 10a comprised of solar cells 14, and one or more antennae 136. Examples of the systems 132 included with the satellite 130 include, but are not limited to, one or more of a propulsion system 138, an electrical system 140, a communications system 142, and a power system 144. Any number of other systems 132 also may be included.

FIG. 47 is an illustration of the solar cell panel 10a in the form of a functional block diagram, according to one example. The solar cell panel 10a is comprised of the solar cell array 22, which is comprised of one or more of the solar cells 14 individually attached to the substrate 12. Each of the solar cells 14 absorbs light 146 from a light source 148 and generates an electrical output 150 in response thereto.

At least one of the solar cells 14 has at least one cropped corner 24 that defines a corner region 26, such that an area 28 of the substrate 12 remains exposed when the solar cell 14 is attached to the substrate 12. When a plurality of solar cells 14 are attached to the substrate 12, the corner regions 26 of adjacent ones of the solar cells 14 are aligned, thereby exposing the area 28 of the substrate 12.

The area 28 of the substrate 12 that remains exposed includes one or more corner conductors 20 attached to, printed on, or integrated with the substrate 12, and one or more electrical connections between the solar cells 14 and the corner conductors 20 are made in a corner region 26 resulting from the cropped corner 24 of the at least one of the solar cells 14.

The corner region 26 resulting from the cropped corner 24 includes at least one contact, for example, a front contact 32 on a front side of the solar cell 14 and/or a back contact 34 on a back side of the solar cell 14, for making the electrical connections between the corner conductors 20 and the solar cell 14. The electrical connections may comprise up/down or left/right series connections that determine a flow of power through the solar cells 14, and may include one or more bypass diodes 44.

The description of the examples set forth above has been presented for purposes of illustration and description, and is not intended to be exhaustive or limited to the examples described. Many alternatives, modifications and variations may be used in place of the specific elements described above.

What is claimed is:

1. A structure, comprising:

a substrate for solar cells, wherein the substrate is configured such that:

the substrate is a multi-layer substrate comprised of a plurality of insulating layers separating and overlaying one or more patterned metal layers, and the one or more patterned metal layers form electrical conductors buried within the multi-layer substrate that are conductive paths electrically connected to at least one of the solar cells, forming electrical connections, and electrically isolated from others of the solar cells;

the solar cells are attached to the multi-layer substrate;

the solar cells have a cropped corner that defines a corner region;

an area of the multi-layer substrate remains exposed in the corner region;

the multi-layer substrate includes prefabricated electrical conductors that are corner conductors integrated with the multi-layer substrate, wherein the corner conductors are electrically connected to the electrical conductors buried within the multi-layer substrate, forming the electrical connections;

one or more contacts of the solar cells are electrically connected to the corner conductors, forming the electrical connections, using interconnects in the area of the multi-layer substrate that remains exposed in the corner region; and one or more bypass diodes in the area of the multi-layer substrate that remains exposed for use in one or more of the electrical connections, the one or more bypass diodes electrically connecting back contacts of two of the solar cells within the a solar cell array, the one or more bypass diodes being attached to the multi-layer substrate in the corner regions independent of the solar cells, the one or more bypass diodes connected to a jumper in the area of the multi-layer substrate that remains exposed, the jumper connecting a back contacts of a first solar cell to a front contact of a second solar cell and connecting through one of the one or more bypass diodes to a back contact of the second solar cell, the jumper enabling circuit termination or channeling current between the solar cells; wherein the jumper has a shape comprised of two flange elements with parallel planes connected by a web element for enabling multiple connection points.

2. The structure of claim 1, wherein the one or more contacts includes front contacts on a front side of the solar cells.

3. The structure of claim 2, wherein the front contacts extend into the corner region.

4. The structure of claim 1, wherein the one or more contacts includes back contacts on back side of the solar cells.

5. The structure of claim 4, wherein the back contacts extend into the corner region.

6. The structure of claim 1, wherein the prefabricated electrical conductors are patterned on the multi-layer substrate.

7. The structure of claim 1, wherein the prefabricated electrical conductors are covered with an insulating layer.

8. The structure of claim 1, wherein the electrical conductors buried within the multi-layer substrate pass under the solar cells.

9. The structure of claim 1, wherein the electrical conductors buried within the multi-layer substrate are outside a perimeter of the solar cells.

10. The structure of claim 1, wherein the electrical conductors buried within the multi-layer substrate pass from one cropped corner to another cropped corner of the solar cells.

11. The structure of claim 1, wherein the solar cells comprises a plurality of solar cells being attached to the multi-layer substrate in a two-dimensional (2-D) grid of the solar cell array.

12. The structure of claim 11, wherein the electrical connections are series connections that determine a flow of current through the plurality of solar cells.

13. The structure of claim 11, wherein the electrical connections terminate a string of the plurality of solar cells.

14. The structure of claim 11, wherein the electrical conductors buried within the multi-layer substrate pass from a cropped corner of one of the solar cells to a cropped corner of another one of the solar cells.

15. The structure of claim 1, wherein the electrical conductors buried within the multi-layer substrate enable the electrical connections to move current out termination wiring from the multi-layer substrate.

16. A structure, comprising:

a substrate for solar cells, wherein the substrate is configured such that:

the substrate is a multi-layer substrate comprised of a plurality of insulating layers separating-and overlaying one or more patterned metal layers, and the one or more patterned metal layers form electrical conductors buried within the multi-layer substrate that are conductive paths electrically connected to at least one of the solar cells, forming electrical connections, and electrically isolated from others of the solar cells;

the solar cells are attached to the multi-layer substrate;

the solar cells have a cropped corner that defines a corner region;

an area of the multi-layer substrate remains exposed in the corner region;

the multi-layer substrate includes prefabricated electrical conductors that are corner conductors integrated with the multi-layer substrate, wherein the corner conductors are electrically connected to the electrical conductors buried within the multi-layer substrate, forming the electrical connections;

one or more contacts of the solar cells are electrically connected to the corner conductors, forming the electrical connections, using interconnects in the area of the multi-layer substrate that remains exposed in the corner region;

one or more electrically conductive elements are added to or removed in the area of the multi-layer substrate that remains exposed, to select current pathways for the solar cells by adding the conductive elements to bridge between the conductive paths or by removing the conductive elements to isolate between the conductive paths; and one or more bypass diodes in the area of the multi-layer substrate that remains exposed for use in one or more of the electrical connections, the one or more bypass diodes electrically connecting back contacts of two of the solar cells within a solar cell array, the one or more bypass diodes being attached to the multi-layer substrate in the corner regions independent of the solar cells, the one or more bypass diodes connected to a jumper in the area of the multi-layer substrate that remains exposed, the jumper connecting a back contact of a first solar cell to a front contact of a second solar cell and connecting through one of the one or more bypass diodes to a back contact of the second solar cell, the jumper enabling circuit termination or channeling current between the solar cells; wherein the jumper has a shape comprised of two flange elements with parallel planes connected by a web element for enabling multiple connection points.

17. A structure, comprising:

a substrate for solar cells, wherein the substrate is configured such that:

the substrate is a multi-layer substrate comprised of a plurality of insulating layers separating and overlaying one or more patterned metal layers, and the one or more patterned metal layers form electrical conductors buried within the multi-layer substrate that are conductive paths electrically connected to at least one of the solar cells, forming electrical connections, and electrically isolated from others of the solar cells;

the solar cells are attached to the multi-layer substrate;

the solar cells have a cropped corner that defines a corner region;

an area of the multi-layer substrate remains exposed in the corner region; the area of the multi-layer substrate that remains exposed in the corner region includes prefabricated electrical conductors that are corner conductors integrated with the multi-layer substrate, wherein the corner conductors are electrically connected to the electrical conductors buried within the multi-layer substrate, forming the electrical connections;

one or more contacts of the solar cells are electrically connected to the corner conductors, forming the electrical connections, using interconnects in the area of the multi-layer substrate that remains exposed in the corner region; and one or more bypass diodes in the area of the multi-layer substrate that remains exposed for use in one or more of the electrical connections, the one or more bypass diodes electrically connecting back contacts of two of the solar cells within a solar cell array, the one or more bypass diodes being attached to the multi-layer substrate in the corner regions independent of the solar cells, the one or more bypass diodes connected to a jumper in the area of the multi-layer substrate that remains exposed, the jumper connecting a back contact of a first solar cell to a front contact of a second solar cell and connecting through one of the one or more bypass diodes to a back contact of the second solar cell, the jumper enabling circuit termination or channeling current between the solar cells; wherein the jumper has a shape comprised of two flange elements with parallel planes connected by a web element for enabling multiple connection points.

18. A structure, comprising:

a substrate for solar cells, wherein the substrate is configured such that:

the substrate is a multi-layer substrate comprised of a plurality of insulating layers separating-and overlaying one or more patterned metal layers, and the one or more patterned metal layers form electrical conductors buried within the multi-layer substrate that are conductive paths electrically connected to at least one of the solar cells, forming electrical connections, and electrically isolated from others of the solar cells;

the solar cells are attached to the multi-layer substrate;

the solar cells have a cropped corner that defines a corner region;

an area of the multi-layer substrate remains exposed in the corner region;

the multi-layer substrate includes printed electrical conductors that are corner conductors integrated with the multi-layer substrate, wherein the corner conductors are electrically connected to the electrical conductors buried within the multi-layer substrate, forming the electrical connections;

one or more contacts of the solar cells are electrically connected to the corner conductors, forming the electrical connections, using interconnects in the area of the multi-layer substrate that remains exposed in the corner region; and one or more bypass diodes in the area of the multi-layer substrate that remains exposed for use in one or more of the electrical connections, the one or more bypass diodes electrically connecting back contacts of two of the solar cells within a solar cell array, the one or more bypass diodes being attached to the multi-layer substrate in the corner regions independent of the solar cells, the one or more bypass diodes connected to a jumper in the area of the multi-layer substrate that remains exposed, the jumper connecting a back contacts of a first solar cell to a front contact of a second solar cell and connecting through one of the one or more bypass diodes to a back contact of the second solar cell, the jumper enabling circuit termination or channeling current between the solar cells; wherein the jumper has a shape comprised of two flange elements with parallel planes connected by a web element for enabling multiple connection points.

19. The structure of claim 16, wherein the prefabricated electrical conductors are patterned on the multi-layer substrate.

20. The structure of claim 1, wherein the solar cells are placed on top of the prefabricated conductors.

\* \* \* \* \*